United States Patent [19]

Hilber et al.

[11] Patent Number: 5,128,855

[45] Date of Patent: Jul. 7, 1992

[54] BUILDING AUTOMATION SYSTEM OPERATING INSTALLATION CONTROL AND REGULATION ARRANGEMENT

[75] Inventors: Josef Hilber, Allenwinden; Fritz Jost, Mettemenstetten; Otto Leuthold, Zug, all of Switzerland

[73] Assignee: LGZ Landis & Gyr Zug AG, Zug, Switzerland

[21] Appl. No.: 359,838

[22] Filed: May 31, 1989

[30] Foreign Application Priority Data

Jun. 8, 1988 [CH] Switzerland ............ 2178/88

[51] Int. Cl.⁵ .................................... G06F 15/16
[52] U.S. Cl. ................... 364/132; 364/229.2; 364/DIG. 1
[58] Field of Search ........... 364/132, 229.2, 240.1; 439/61, 62, 64, 65

[56] References Cited

U.S. PATENT DOCUMENTS

| | | | |
|---|---|---|---|
| 3,881,172 | 4/1975 | Bartlett et al. | 364/200 |
| 4,002,381 | 1/1977 | Wagner et al. | 439/61 |
| 4,511,963 | 4/1985 | Kantner | 364/200 |
| 4,567,561 | 1/1986 | Wyatt et al. | 364/200 |
| 4,573,753 | 3/1986 | Vogl | 439/61 |
| 4,598,379 | 7/1986 | Awane et al. | 364/132 |
| 4,683,550 | 7/1987 | Jindrick et al. | |
| 4,738,632 | 4/1988 | Schmidt et al. | |
| 4,745,744 | 5/1988 | Cherry et al. | 364/132 |
| 4,787,024 | 11/1988 | Allsop et al. | 364/132 |

FOREIGN PATENT DOCUMENTS 2014367 8/1979 United Kingdom.

OTHER PUBLICATIONS

Introduction to the Visogyr/Visonik System Family, Aug. 1987.

*Primary Examiner*—Jerry Smith
*Assistant Examiner*—Patrick D. Muir
*Attorney, Agent, or Firm*—Marmorek, Guttman & Rubenstein

[57] ABSTRACT

An arrangement for the control of an operating installation of a building automation system is disclosed. The arrangement comprises a control module serving as a master transmitter-receiver and at least one function module serving as a slave transmitter receiver. A bus connection including a bus rail connects the control module and the at least one function module for the transmission of addresses and data and for the transmission of operating voltages. The bus rail is installed electrically at the periphery of the installation so that the at least one function module is connected to a plurality of conductors forming the bus rail and directly to the installation so that the function module serves as an input/output terminal of said installation for the transmission of process parameters.

24 Claims, 19 Drawing Sheets

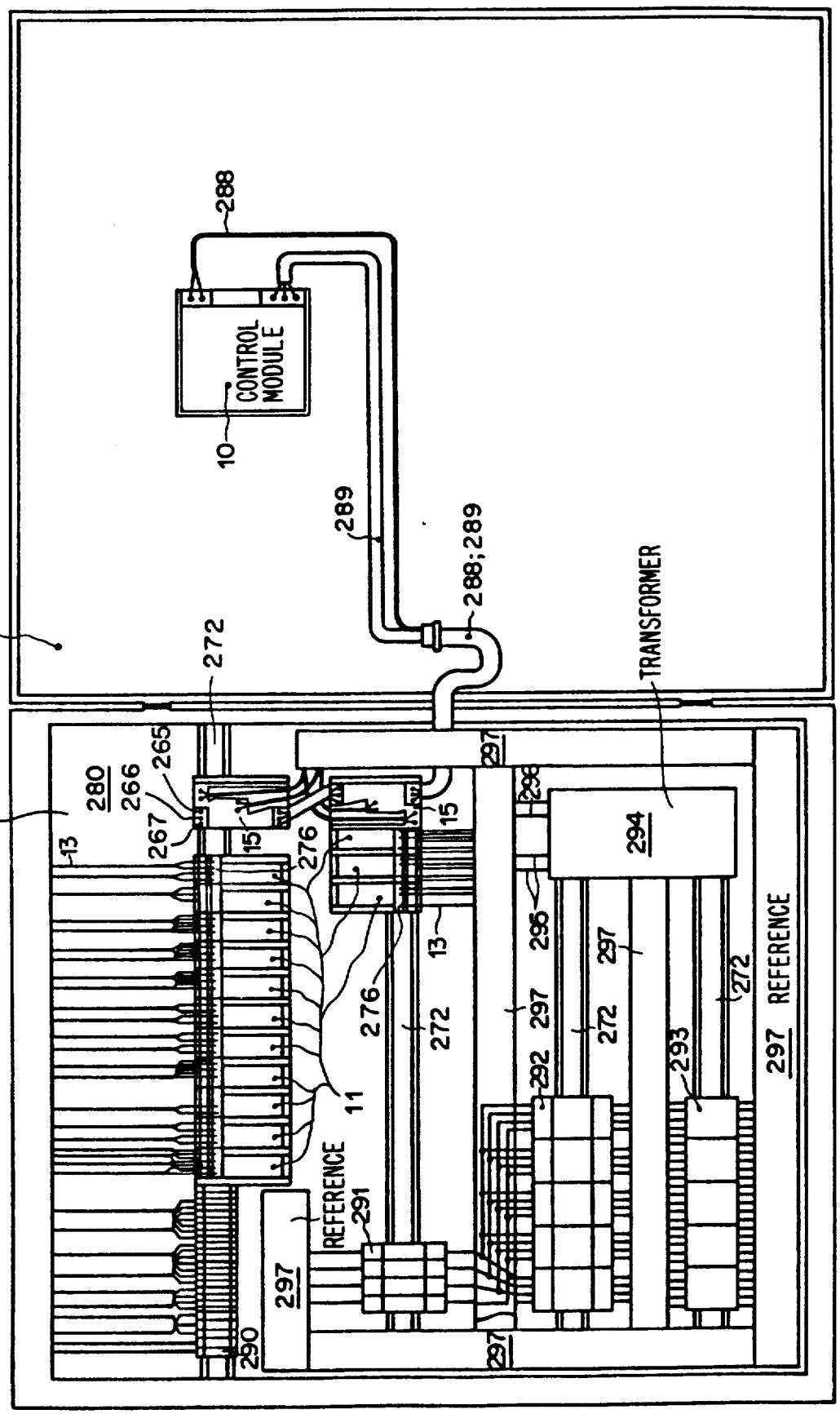

BUILDING AUTOMATION SYSTEM OPERATING INSTALLATION CONTROL AND REGULATION ARRANGEMENT

FIELD OF THE INVENTION

The instant invention relates to an installation for the supervision, control and regulation of a technical operating plant of a building automation system.

BACKGROUND OF THE INVENTION

The concept of building automation comprises the following non-exhaustive list of installations:
- Heating, cooling, aeration and air-conditioning plants,
- Installations for the supply of electrical energy, gas, water, steam, etc.
- Waste disposal installations (sewerage, garbage, waste gas, etc.)
- Safety installations (burglary, fire, glass, etc.),
- Conveying installations (elevators, escalators, etc.),
- Lighting installations and
- Installations for the opening of entrances/exits of buildings or of individual rooms, etc.

The concept of a technical operating plant comprises all the power current, hydraulic and pneumatic installations of an automation system of a building, including their control and answerback communication elements, but not including the actual control and answerback signals. The control and answerback communication elements are here sensors, e.g. temperature and/or pressure sensors, servo components for e.g. mixing valves and/or motors of pumps, compressors, blower-burners and aerators, or control elements comprising, for example, safety coils and answerback communication contacts.

The installation mentioned initially realizes mainly four functions.

1. Supervision: It comprises central messages (display, logging, alarms, etc.) signaling extraordinary installation states as well as maintenance messages to the operating personnel.
2. Control: It comprises switching the installation or parts of the installation on and off as well as the resetting of desired values by means of programs or through manual intervention at an operator station.
3. Optimizing the overall operation through optimal energy coordination of the individual parts of installations. The computing programs contained in the system make it possible to coordinate the various plants installed in a building by means of arithmetic or logical linking of state values of a building (temperature, humidity, rpm's, hours of operation etc.) and thus to optimize the operating costs.
4. Support of the building management, e.g. through the monitoring of hours of operations, malfunction statistics, supervision of watchmen's rounds, admission control etc.

In the periodical "Landys & Gyr Mitteilungen", 26th year (1979) 1-79, pages 2 to 12, "Visonik-ZLT-System", P. Schneider and J. B. Lumpert, as well as in the brochure "Building Management Systems, Introduction to the Visogyr/Visonik System Family", Aug. 1987, order no. ZXGU 0100D, Landis & Gyr, CH 6301 Zug, Switzerland, a ZLT Building Automation System based on central management technology for the realization of these requirements is described, making it possible to connect a central station via a multi-wire ring circuit by means of transmission technology to several sub-systems designated as sub-stations. All control and message devices of a sub-system are in this case located in one control cabinet or control panel.

In this known ZLT building automation system a bus rail is used. The structure of this bus rail is described in the patent GB-PS 2,014,367. This bus rail constitutes within the ZLT building automation system an electric bus connection between a control module and several function modules of one and the same sub-system and contains a plurality of parallel electric conductors insulated from each other, i.e. 33 conductors, for the parallel multibit transmission of addresses and digital values, each via a separate bus, as well as for the analog transmission of analog values and supply voltages. A conversion of the analog values into digital values takes place relatively slowly only in a first central computer within and/or outside the control module, so that the computer is occupied for a relatively long period of time with conversion tasks for this purpose. The positions in which the individual function modules are installed are provided with encoded addresses so that the individual function modules can be located only in very precise positions without hardware and/or software changes The bus rail itself is of modular structure and consists of a plurality of connection plates which can be electrically plugged into each other laterally with their narrow-edged long sides abutting each other so as to form a long, flat bus rail. For this purpose each of the narrow-edge long sides facing each other of each connection plate is provided with a female and/or male connector, each of which has as many connection contacts as there are parallel electric conductors in the bus rail. When the connection plates are plugged together, the plugged connectors connect parallel electrical conductors which are contained in every connection plate electrically to corresponding conductors of the adjoining connection plate. One large-surface side of each connection plate is provided with female connectors in which at least one control module or function module, all of which are provided with male connectors, can be plugged in. The flat bus rail is in turn mounted on or snapped on to a support. Furthermore, it can be provided continuously with at least one connecting cable and (divided into parallel bus rails) can be installed on several planes within the control closet or control panel. The function modules aer thus plugged into connectors which are connected to other connector elements which in turn are connected via wire connection to control terminals which are installed at one border, for example at the lower border, inside the control cabinet so that the connection between the function modules and the technical operating installations must always be via these control terminals (see also FIG. 32), requiring much expensive terminal and wiring assembly It is the object of the instant invention to change the known ZLT building automation system while improving its advantages as much as possible in such manner that an even more universal ZLT building automation system may be created, in which wiring, terminals, connection and assembly costs within the control cabinet or control panel are reduced to a minimum and in which no expensive jumper wiring is necessary since the connections of the technical operating plant are not connected to isolated terminals but directly to base terminals of the function modules in order to realize great economies in money and in time.

SUMMARY OF THE INVENTION

The present invention is an arrangement for the control of an operating installation of a building automation system. The arrangement comprises a control module serving as a master transmitter-receiver and at least one function module serving as a slave transmitter-receiver. A bus connection including a bus rail connects the control module and the at least one function module for the transmission of addresses and data and for the transmission of operating voltages. The bus rail is installed electrically at the periphery of the installation so that the at least one function module is connected to a plurality of conductors forming the bus rail and directly to the installation so that the function module serves as an input/output terminal of said installation for the transmission of process parameters.

Additional advantages of at least some embodiments of the invention are:

great flexibility of the installation with respect to making changes and expanding the system, thanks to complete interchangeability of function modules which can be plugged in anywhere on a bus rail without consideration of its own function module type and without consideration of any function module type which may have been plugged in at the same location in the past, decreased likelihood for malfunctions in the installation thanks to the implementation of a transmission connection between control module and function module that is less subject to malfunctions, minimization of the number of conductors in the bus rail and therefore the possibility of using an optimally thin cable-bus connection between the bus rail and the control module, the latter being installed on the door of its control panel or control cabinet instead of directly on the bus rail, so that its operations and display elements are accessible directly from the outside without having to open that door, a reduction of the number of failure sources due to the fact that the start-up and testing of the installation in order to find any wiring errors is simplified, a reduction of planning costs in the preparation of wiring diagrams, wire transmission lists, etc., a high degree of installation and service friendliness, small space requirements and a high degree of utilization, conversion from analog values into digital values in a matter of seconds, lightening the load on the central computer within and/or without the control module, especially relief from all time-consuming conversion tasks and decreased number of wire harnesses put together in the field.

Figure 17:
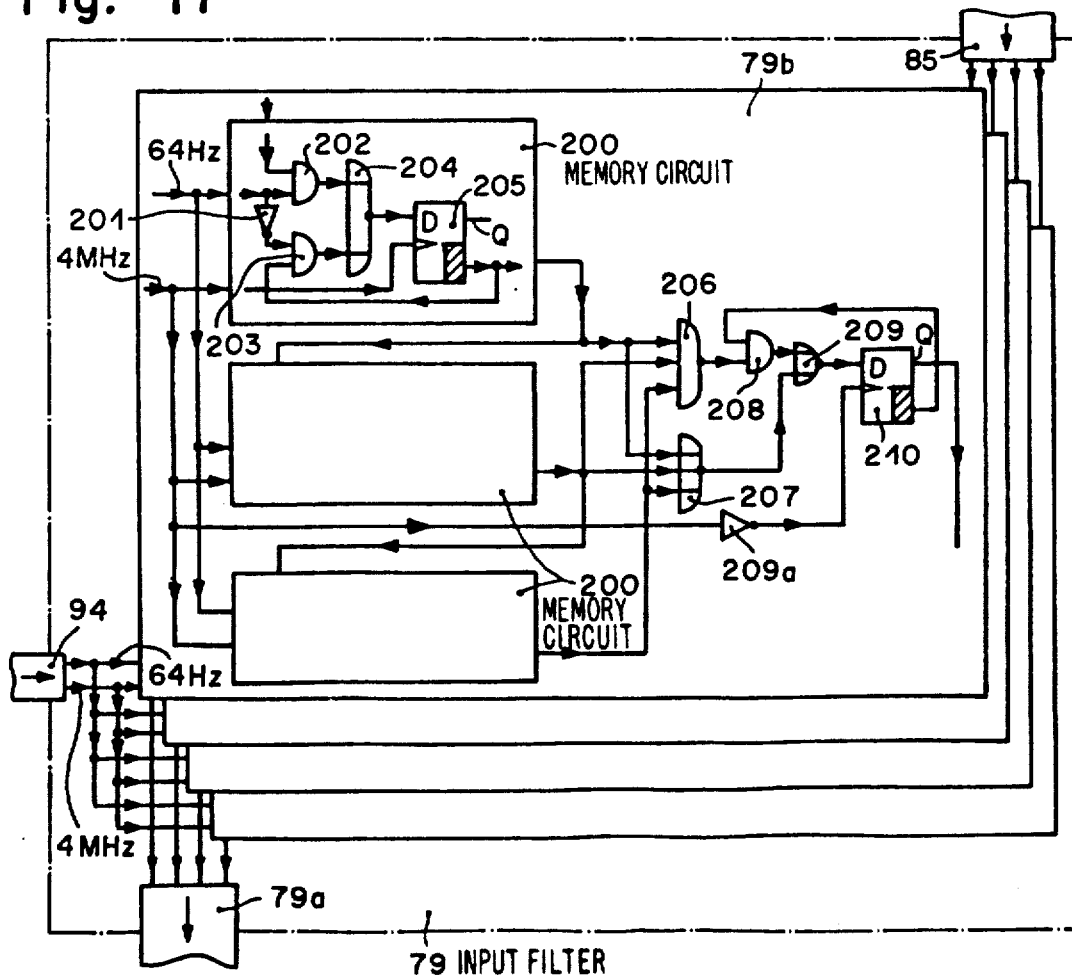
Figure 18:
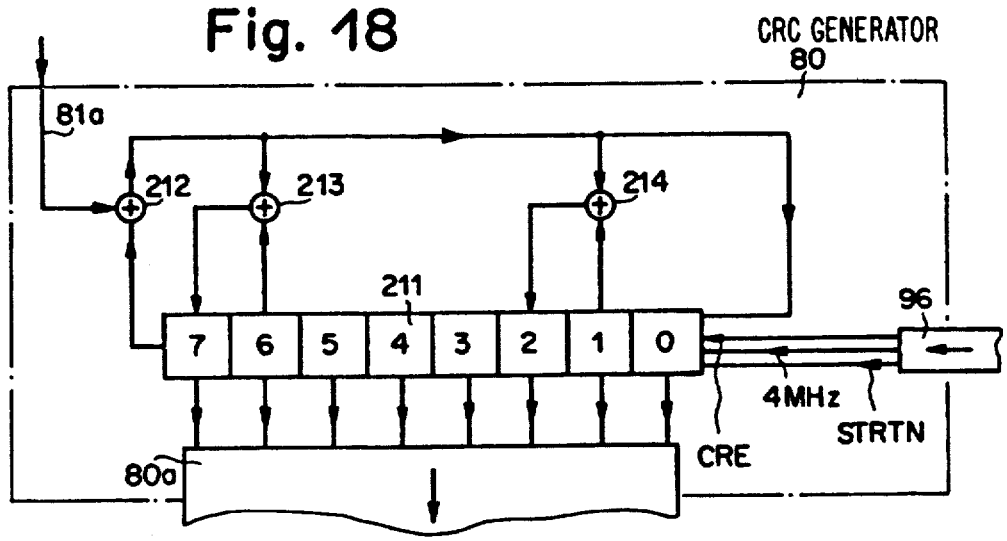

FIG. shows a diagram of a random code generator,

FIG. 17 shows a diagram of an input filter,

FIG. 18 shows a diagram of a CRC generator

Figure 19:
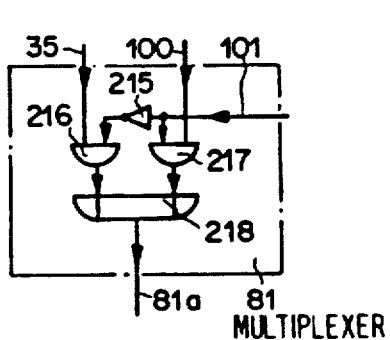

FIG. 19 shows a diagram of a multiplexer

Figure 20:
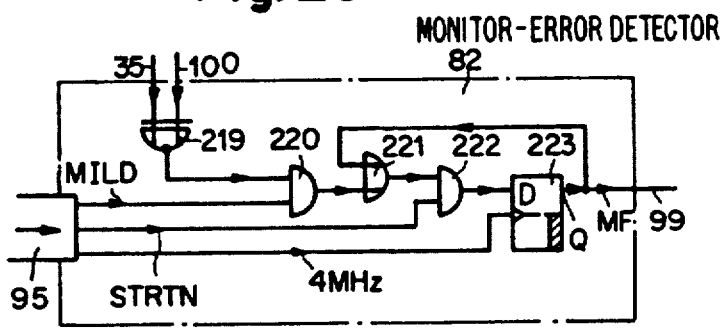
Figure 21:
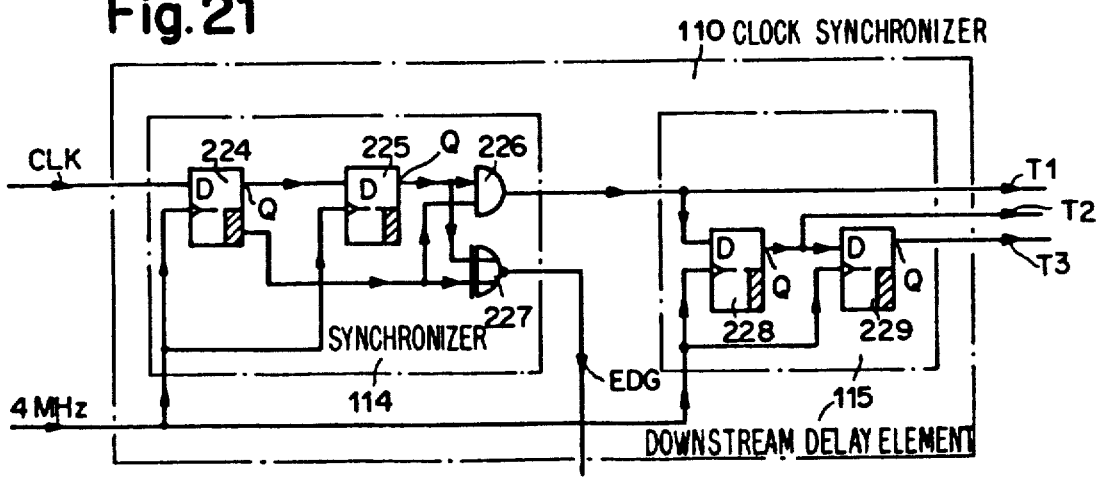

FIG. 20 shows a diagram of a monitoring error detector,

FIG. 21 shows a diagram of a pulse synchronizer.

Figure 22:
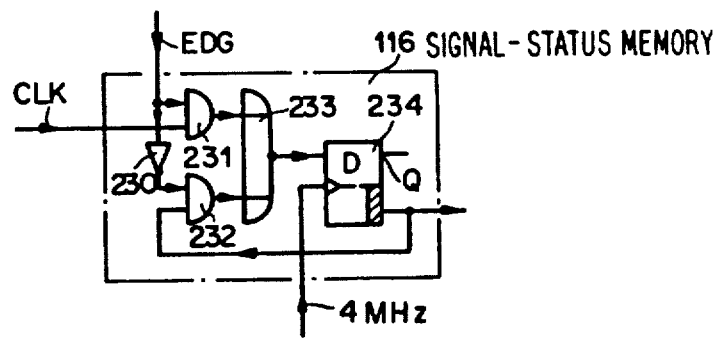
Figure 23:
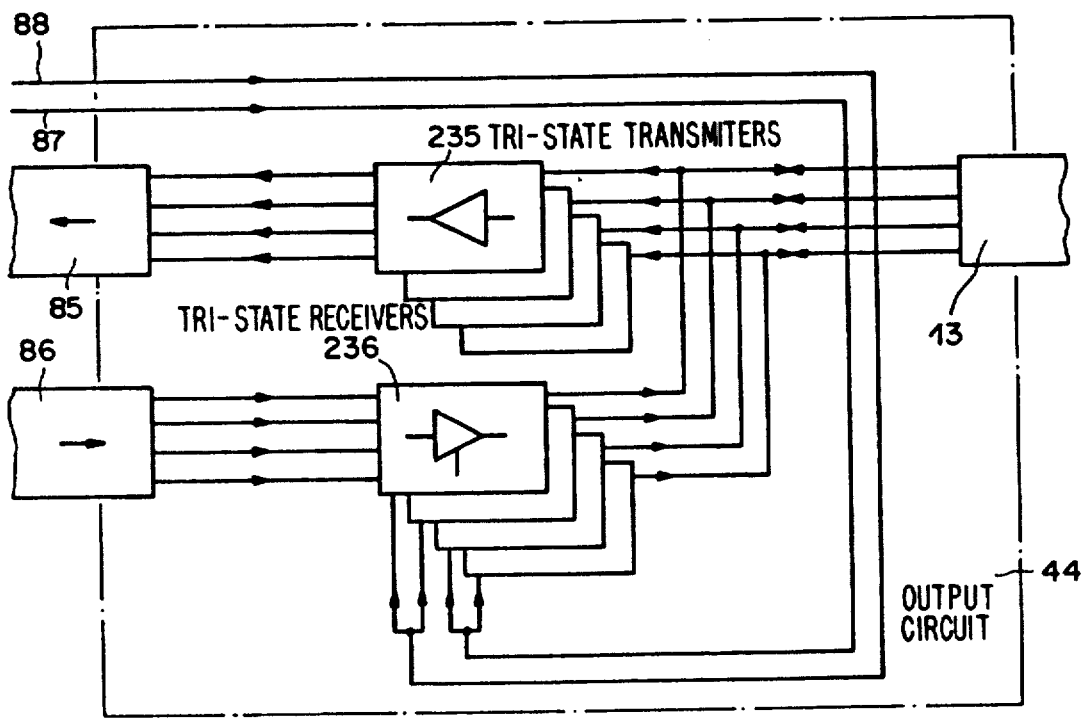
Figure 24:
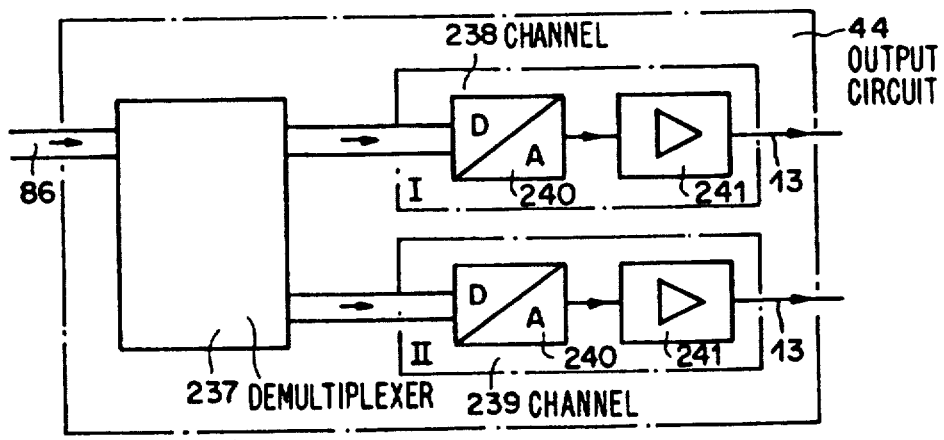
Figure 25:
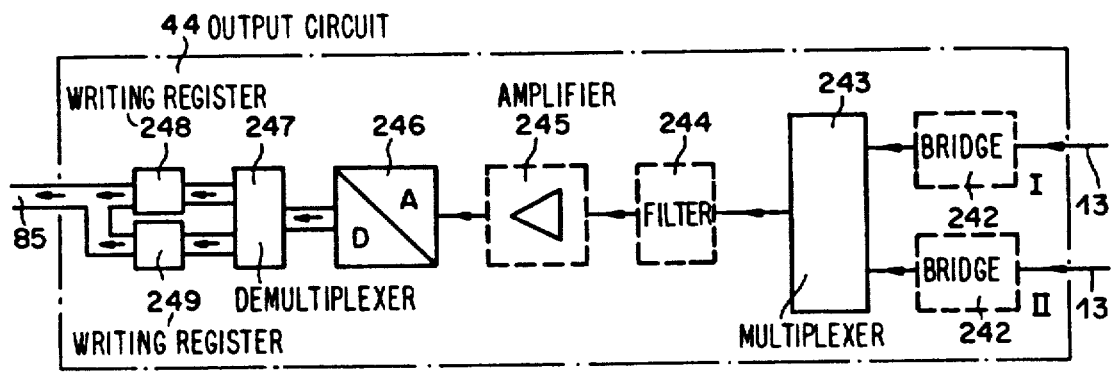
Figure 26:
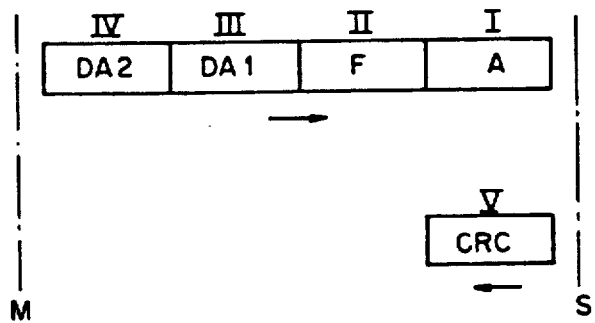
Figure 27:
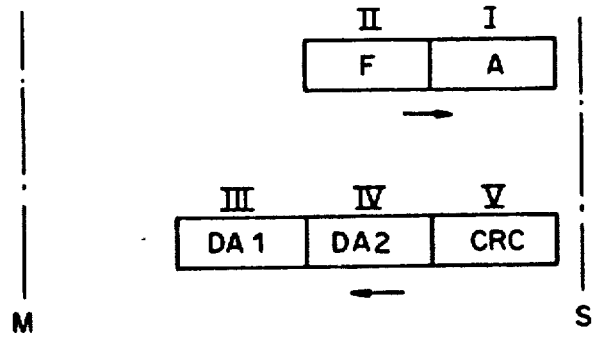
Figure 28:
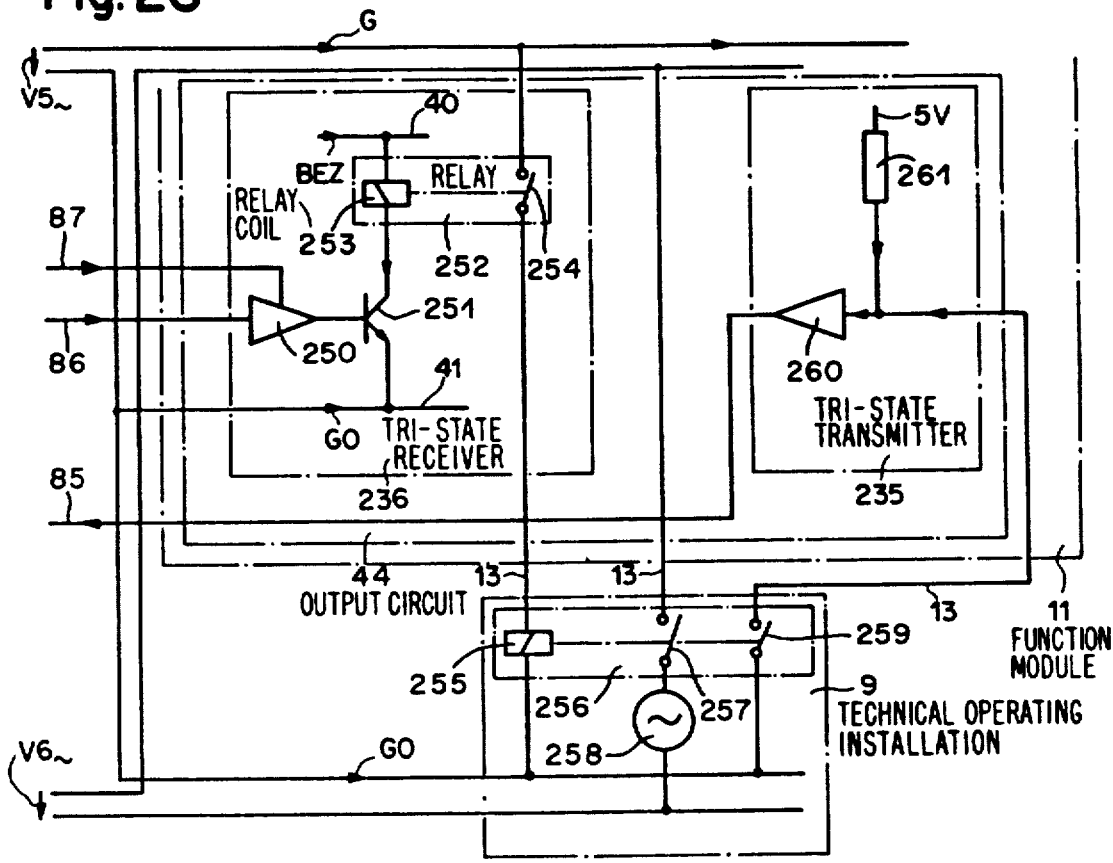
Figure 29:
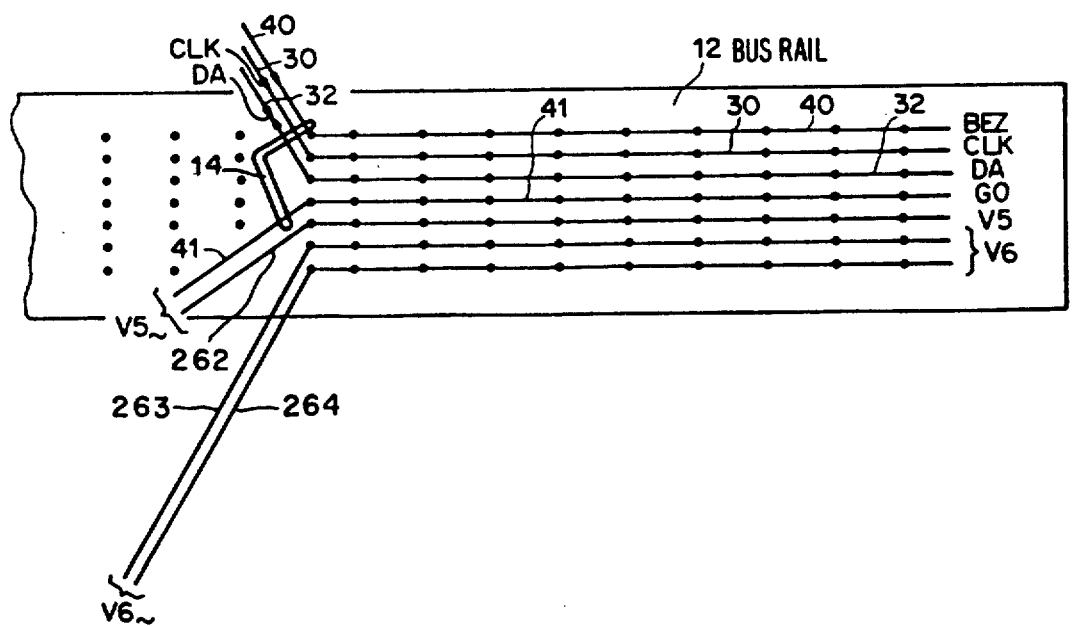
Figure 30:
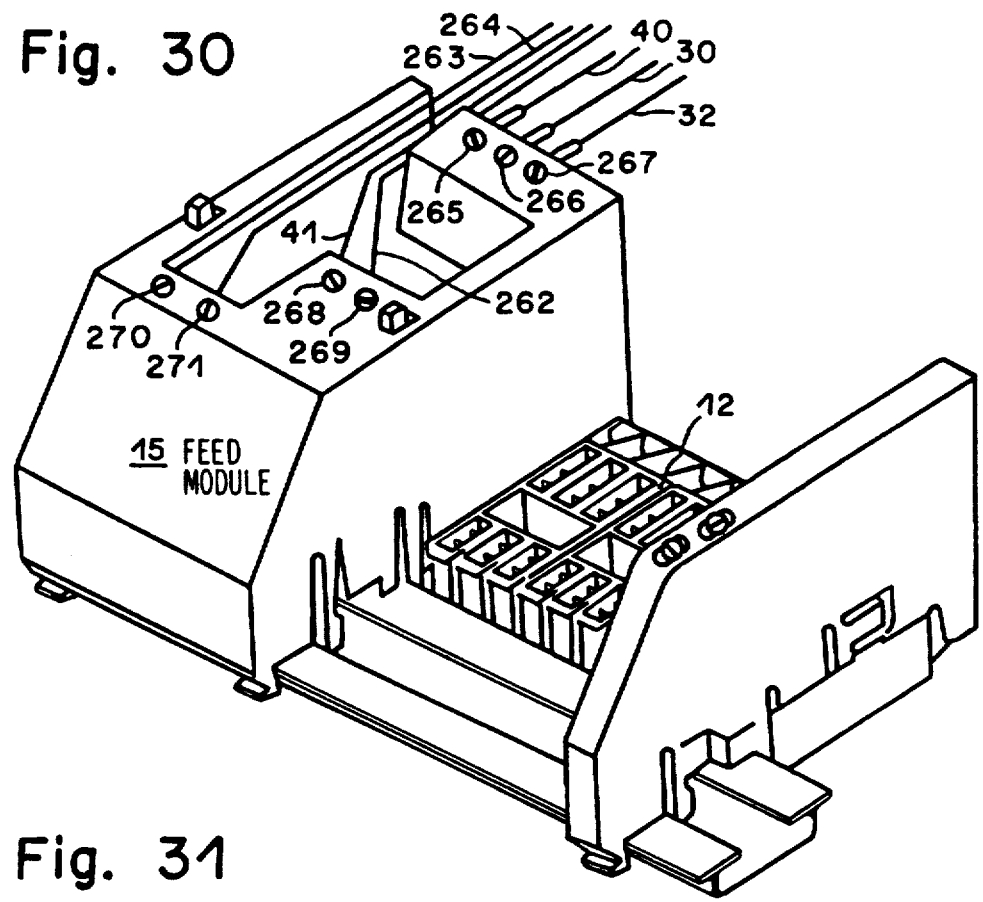
Figure 31:
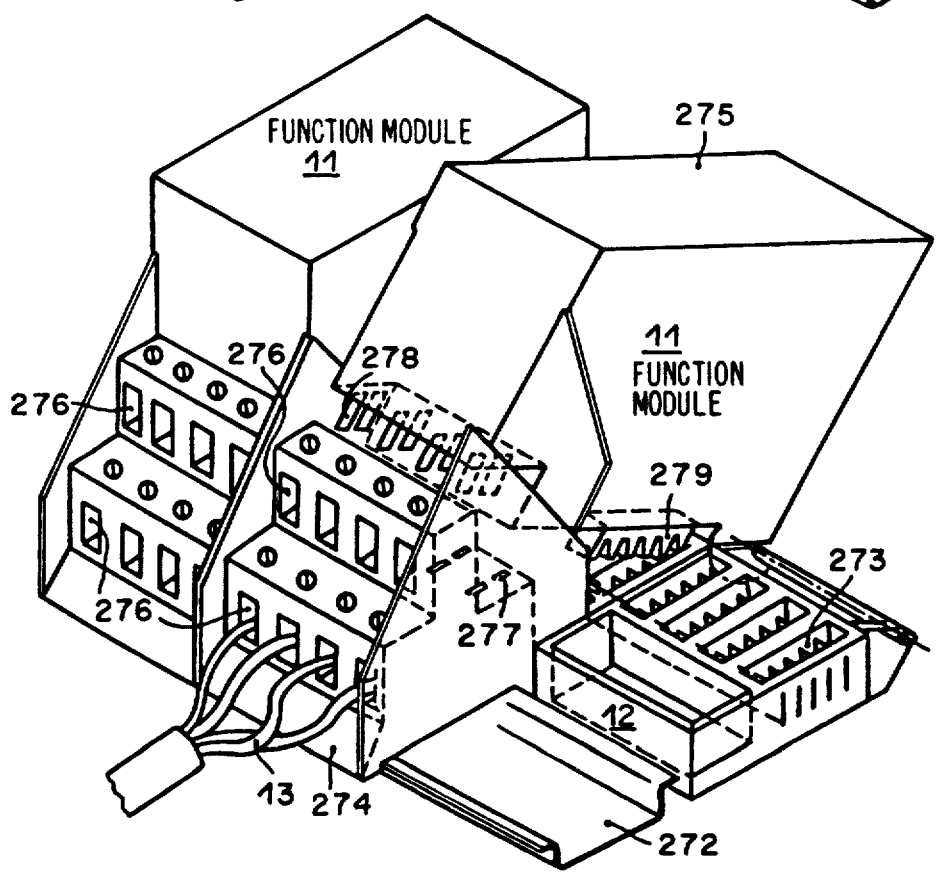
Figure 32:
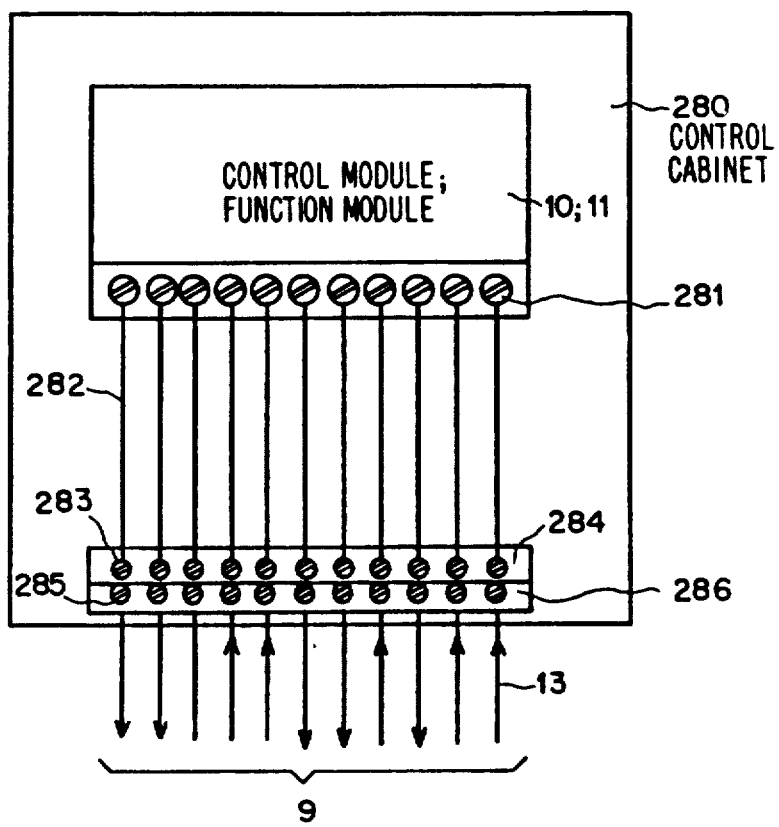
Figure 33:
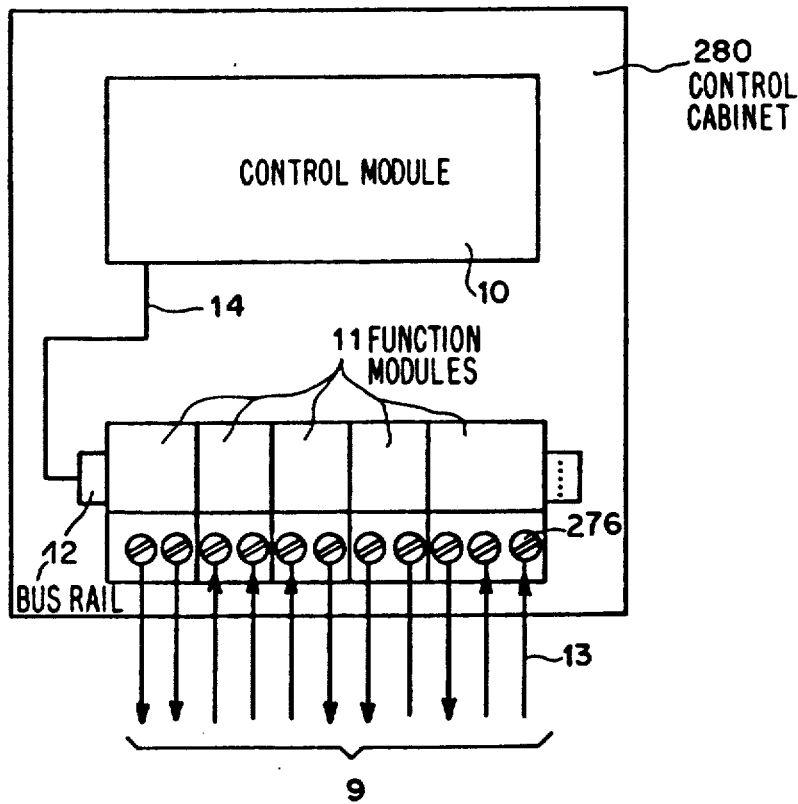

FIG. 22 shows a diagram of a pulse signal status memory,

FIG. 23 shows a block diagram of an output circuit of a first variant of the function module, FIG. 24 shows a block diagram of an output circuit of a second variant of the function module, FIG. 25 shows a block diagram of an output circuit of a third variant of the function module, of a data telegram, FIG. 26 shows a symbolic representation of a writing cycle FIG. 27 shows a symbolic representation of a reading cycle of a data telegram, FIG. 28 shows a diagram of an example of the drive of a technical operating installation through an output circuit, FIG. 29 shows a symbolic representation of a widened bus rail, FIG. 30 shows a three-dimensional representation of a feed module, FIG. 31 shows a three-dimensional representation of function modules, FIG. 32 shows a schematic representation of a three-dimensional layout of a conventional installation, FIG. 33 shows a schematic representation of a three-dimensional layout of an installation according to the invention and FIG. 34 shows a schematic representation of a three-dimensional layout of a control cabinet according to the invention.

DETAILED DESCRIPTION OF THE INVENTION

Figure 1:
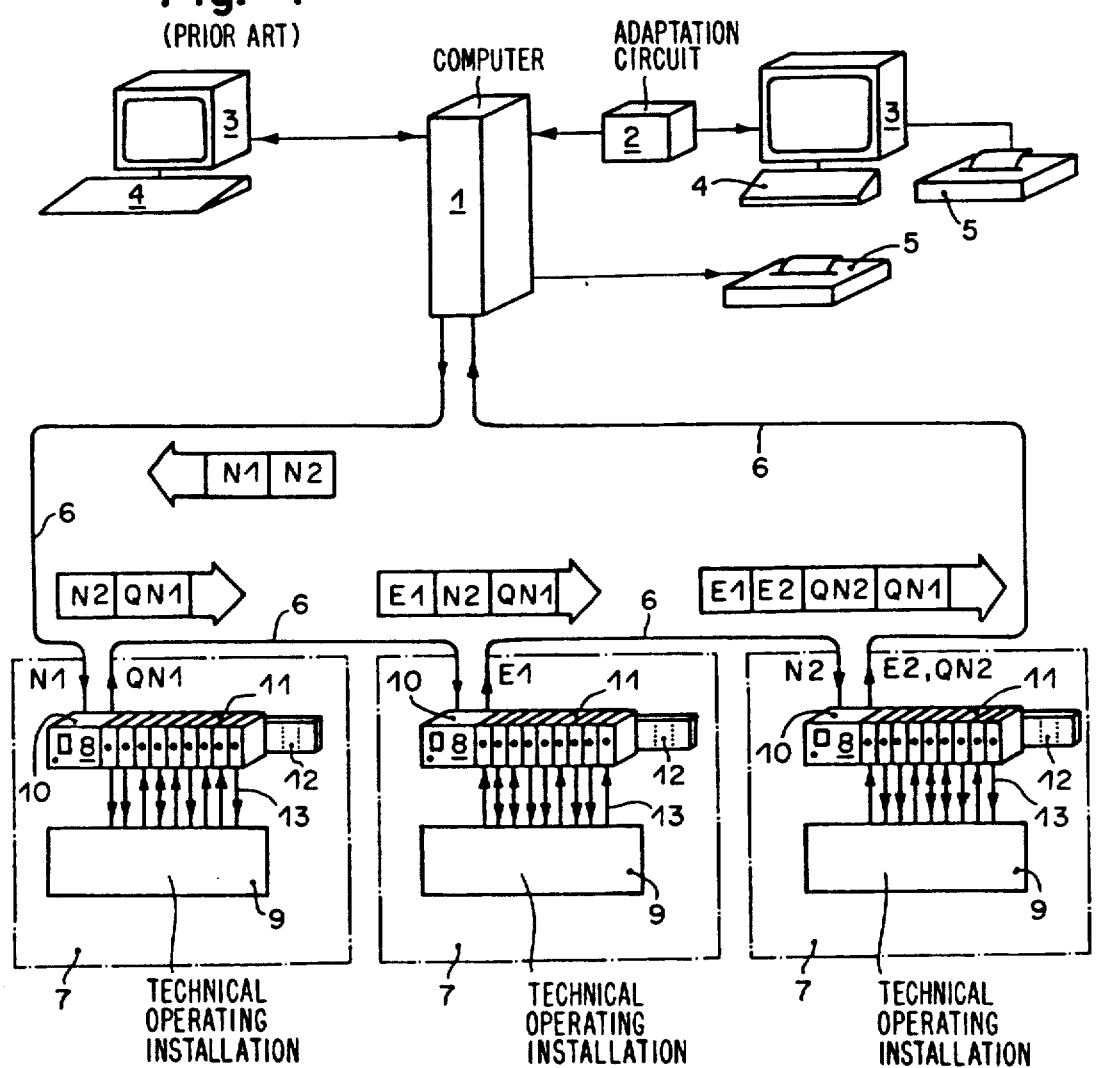
FIG. 1 shows a known installation for the supervision and the control of a technical operating installation of a building automation system.

In order to promote a better understanding of the difference between the invention and the above-mentioned state of the art, the known ZLT building automation system is shown once more in FIG. 1.

The central station accordingly contains a central computer 1 which is connected directly and/or via an adaptation circuit 2 to one or several work stations 3; 4, each of which comprises a viewing device (CRT) 3 and of a keyboard 4. Furthermore, computer 1 and/or one of the work stations 3; 4 is connected to a printer 5. A ring circuit 6 connects computer 1 to one or several sub-systems 7. Each sub-system 7 is preferably located in its own control panel or panels. In FIG. 1 the presence of three sub-systems 7 was assumed. Each sub-system 7 contains a so-called electronic strip terminal 8 and a technical operating installation 9. The electronic strip terminal 8 comprises at least one control module 10, one function module 11, and one bus rail 12. The bus rail 12 is provided with a plurality of parallel electrical conductors insulated from each other which are not shown in FIG. 1. The computer 1 and the control 10 of all sub-systems 7 constitute, together with the closed circuit 6, an electric ring, i.e. all the control modules 10 are connected electrically in series, whereby an output of the computer is connected to an input of the first control module 10 of the series connection and the output of the last control module 10 of the series connection is connected to an input of the computer 1.

Binary data are preferably frequency-modulated, e.g. transmitted by means of frequency shift keying (FSK) in one direction from the output of the computer 1 via the ring circuit 6 and the control modules 10 to the input of the computer 1. The data flow is represented symbolically in FIG. 1 by wide arrows. Commands are for example transmitted in form of messages N1 and N2 from the computer 1 to the first or third sub-system 7, and the corresponding message receipts QN1 or QN2 are then transmitted from the first or from the third sub-system 7 to the computer 1. Furthermore, the events E1 and E2 representing the state changes in the technical operating installations 9 of the corresponding sub-systems 7 are transmitted from the second or third sub-system 7 to the computer 1. The transmitted data telegrams are secured with a cyclic redundancy code (CRC). If transmission errors occur, the existence of an error is acknowledged and the transmitted data telegram in question is repeated.

All control modules 10 are structured identically and, in the known ZLT building automation system, each contains among other things a frequency demodulator, a frequency modulator, a micro-computer, an analog/digital converter as well as an input device for the electronic strip terminal 8. Each control module 10 contains furthermore a "watchdog" circuit for self-monitoring When the self-monitoring system comes into action, this is displayed on the corresponding control module 10 and is printed out on a printer 5. Indicators for the self-monitoring system as well as jacks for the connection of a local operating device (not shown) are located on the face plates of the control modules 10. The control module 10 of each sub-system 7 controls and monitors in a fully independent manner all the data exchange within its electronic strip terminal 8 for its zone, but also to its local operating device and to the computer 1.

Next to the control module 10, function modules 11 of one and the same sub-system 7 are installed in a row next to each other on the bus rail 12 so as to be capable of being plugged in electrically. The connector contacts of the bus rail 12 are represented only symbolically by dots in FIG. 1, as far as they are visible. The function modules 11 can be for example message modules, measured-value modules, counted-value modules, switching command modules and setting command modules, i.e. input/output modules which can be structured in different manners. Each function module 11 is connected via at least one separate cable connection 13 which is established in accordance with local installation regulations to the control and answerback communication elements of the technical operating installation 9 of a corresponding sub-system 7. The function modules 11 thus establish an electric connection between the technical operating installation 9 and the corresponding control module 10. Information data such as for example message, analog measured values, digital counted values, switching commands or setting commands are transmitted via the cable connections 13 in one or the other direction between the technical operating installation 9 and the corresponding function modules 11 of the same sub-system 7.

The process magnitudes of the technical operating installation 9 are scanned periodically, for instance, in a rapid cycle and any occurring status changes are transmitted to the computer 1, whereby the analog measured values of each sub-system 7 are digitalized centrally in the corresponding control module 10 of the sub-system 7. The main task of the electronic strip terminal 8 is therefore:

A periodic acquisition of the status changes of the connected technical operating installation 9 and an output of messages (commands) to the technical operating installation 9.

The function modules 11 prepare at the same time the signals of the technical operating installation 9 and, with the help of the bus rail 12, establish the connections between the control module 10 and the process magnitudes of the technical operating installation 9.

Figure 2:
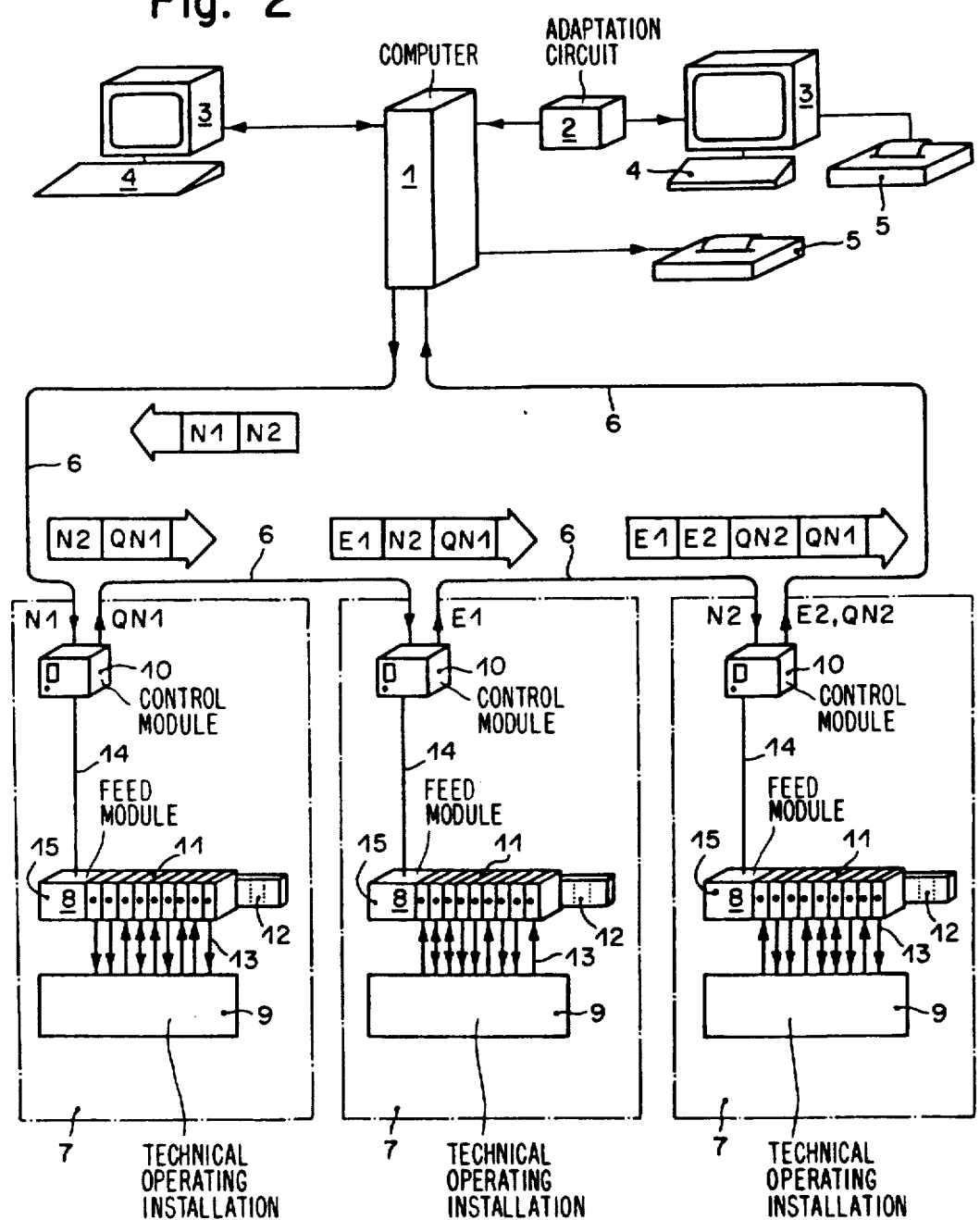
FIG. 2 shows a modification according to the instant invention of the installation shown in FIG. 1.

The installation according to the invention shown in FIG. 2 differentiates itself from the known installation shown in FIG. 1 in that the control module 10 is no longer plugged in on a bus rail 12 directly next to the corresponding function modules 11, but that it is separated in space from and located at a distance from each bus rail 12 and the function modules 11, and is thus no longer plugged in on one of the bus rails 12. The control module 10 is here plugged in on another, parallel bus rail, for example. is mounted on a swiveling frame or, preferably, is installed on the door of a control panel or control cabinet. The latter solution has the advantage that all service and message transmission elements which are located on the face plate of a control module 10 can be reached from the outside without having to open the door. Each of the control modules 10 in the installation according to FIG. 2 is connected via at least one cable-bus connection 14 to at least one feed module 15, each of which is plugged in electrically next to or between the corresponding function modules 11 on the latter's bus rail 12 in order to establish the electric connection of at least one cable-bus connection 14 to the bus rail 12. The electronic strip terminal 8 is this time constituted by the feed module 15, the corresponding function module 11 and the corresponding bus rail 12. In a first variant, each cable-bus connection 14 has exactly as many electric conductors as the bus rail 12. The control module 10 of each sub-system 7 is connected electrically via the latter's cable-bus connection 14, the corresponding feed module 15 and the corresponding bus rail 12 to the function modules 11 of that sub-system 7.

In the building automation system according to the invention the central station 1; 2; 3; 4; 5 and the ring circuit 6 need not necessarily be structured as shown in FIGS. 1 and 2 but can be realized also in some other manner.

Figure 3:
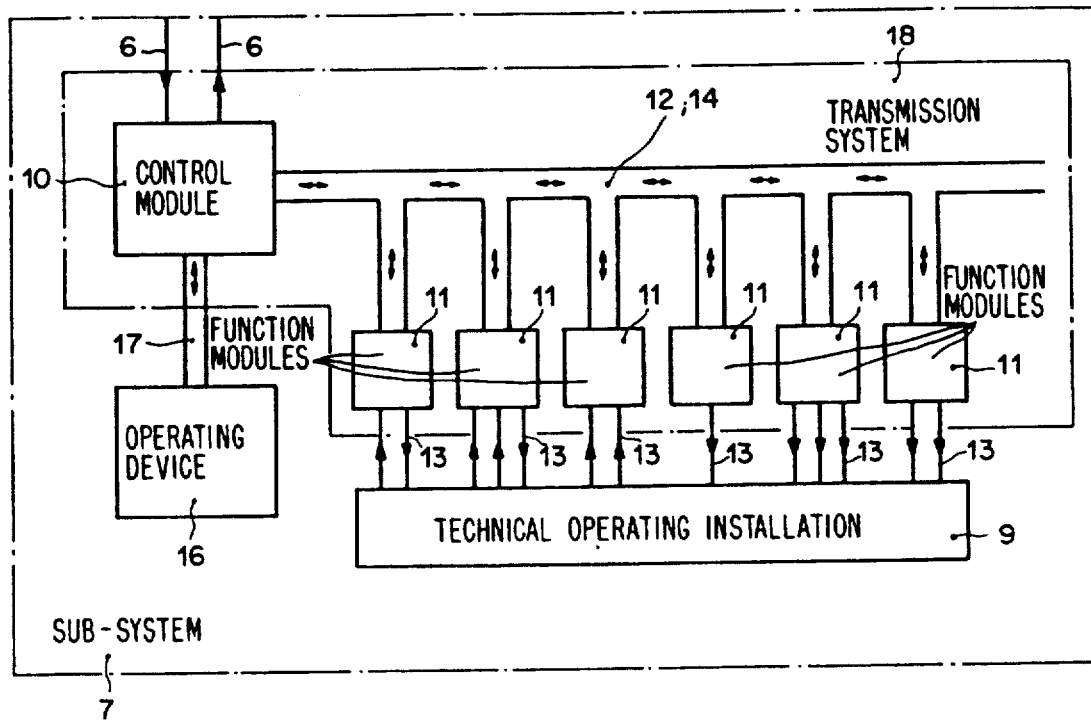
FIG. 3 shows an electric block diagram of a sub-system shown in FIG. 2.

With the feed module 15 and the electric connectors of the bus rail 12 being omitted, FIG. 3 shows a block diagram of one of the sub-systems 7 according to the invention of the installation shown in FIG. 2. The control module 10 and the function modules 11 are here connected via at least one bi-directional bus connection 12; 14, whereby the bus connections of the control and function modules 10 and 11 are connected electrically to each other for the transmission of addresses, data and supply voltages. Each bus connection 12; 14 contains at least one bus rail 12 and a cable-bus connection 14. It thus comprises at least in part of a bus rail 12 on which at least one of the function modules 11 is mounted so that it can be connected electrically and which is connected electrically on one hand to conductors of this bus rail 12 and on the other hand, for the purpose of transmission of process magnitudes, to control and/or message transmitting devices of the technical operating installation 9. An operating device 16 is connected via its own bus connection 17 to the control module 10. Each of the control and function modules 10 and 11 contains a transmitter/receiver and, together with the bus connection 12; 14 serving as a transmission channel, constitutes a transmission system 18 in which the control module 10 on the sending side always functions as a master transmitter/receiver and in which the function module 11 always functions as a slave transmitter/-receiver and whereby the transmission system 18 is used to transmit addresses, data and supply voltages.

Figure 4:
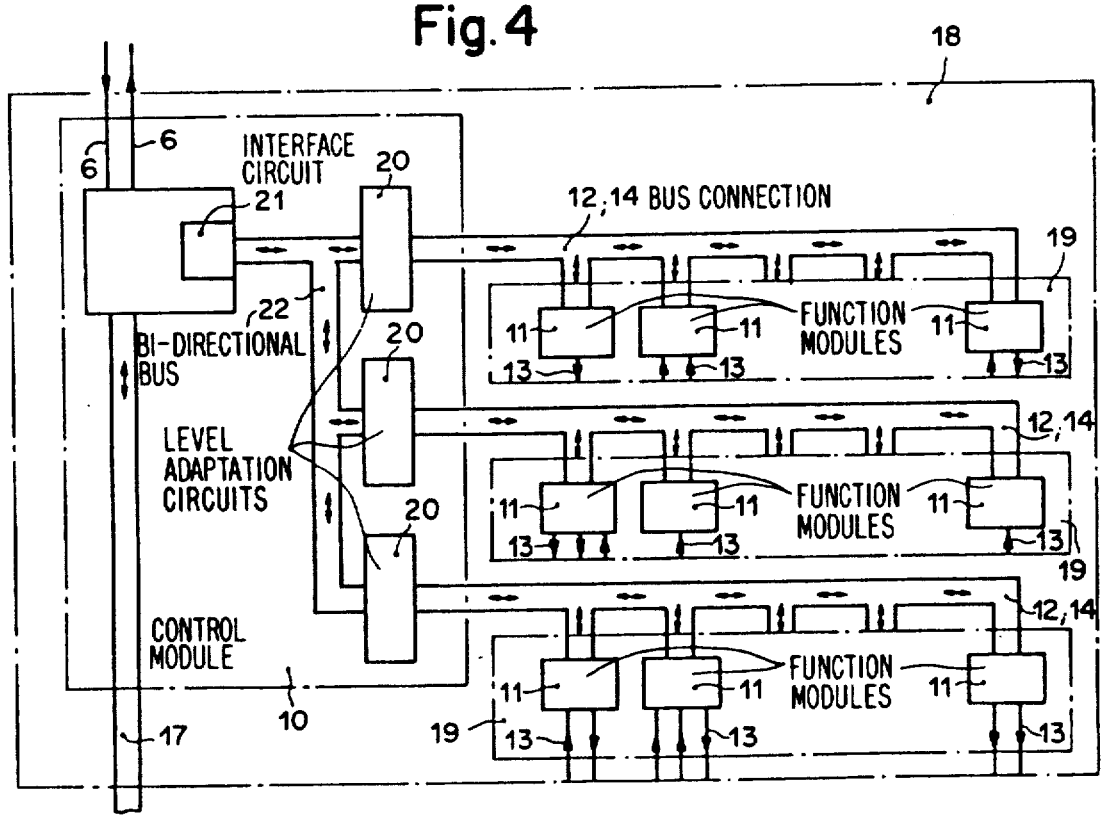
FIG. 4 shows a block diagram of a transmission system equipped with many function modules.

When many function modules 11 are present, e.g. more than 32, they are preferably broken down into several groups for reason of the electrical power consumption In FIG. 4 the presence of three such function module groups 19 was assumed, with a total of a maximum of 96 function modules 11. Each function module group 19 is preferably driven by its own level-adaptation circuit 20 via its own bus connection 12; 14. In the drawing of FIG. 4, three level adaptation circuits 20 and three bus connections 12; 14 are thus present. The common control module 10 contains in that case, and among other devices, an output circuit comprising at least one level adaptation circuit 20 per control module 10 and of one common interface circuit 21 upstream of same, whereby inputs/outputs of the interface circuit 21 are connected via its own bi-directional bus 22 to parallel-connected inputs/outputs of the level adaptation circuit 20. The level adaptation circuits 20 are all identical in structure.

Hereinafter it shall always be assumed, for reasons of drawing simplification, that only one single function module group 19 is present, so that the control module 10 has only one single level adaptation circuit 20 in that case.

Each function module 11 is assigned an address independent of position which can be adjusted at will mechanically and/or electrically. Within the bus connection 12; 14 one single bus is present for the transmission of data signals DA which contain the data to be transmitted as well as these addresses of the function modules 11. The data signals DA are binary data telegrams, with the addresses and data being transmitted sequentially The single bus which serves to transmit the data signals DA comprises preferably of one single conductor (see conductor 32 in FIG. 5).

Figure 5:
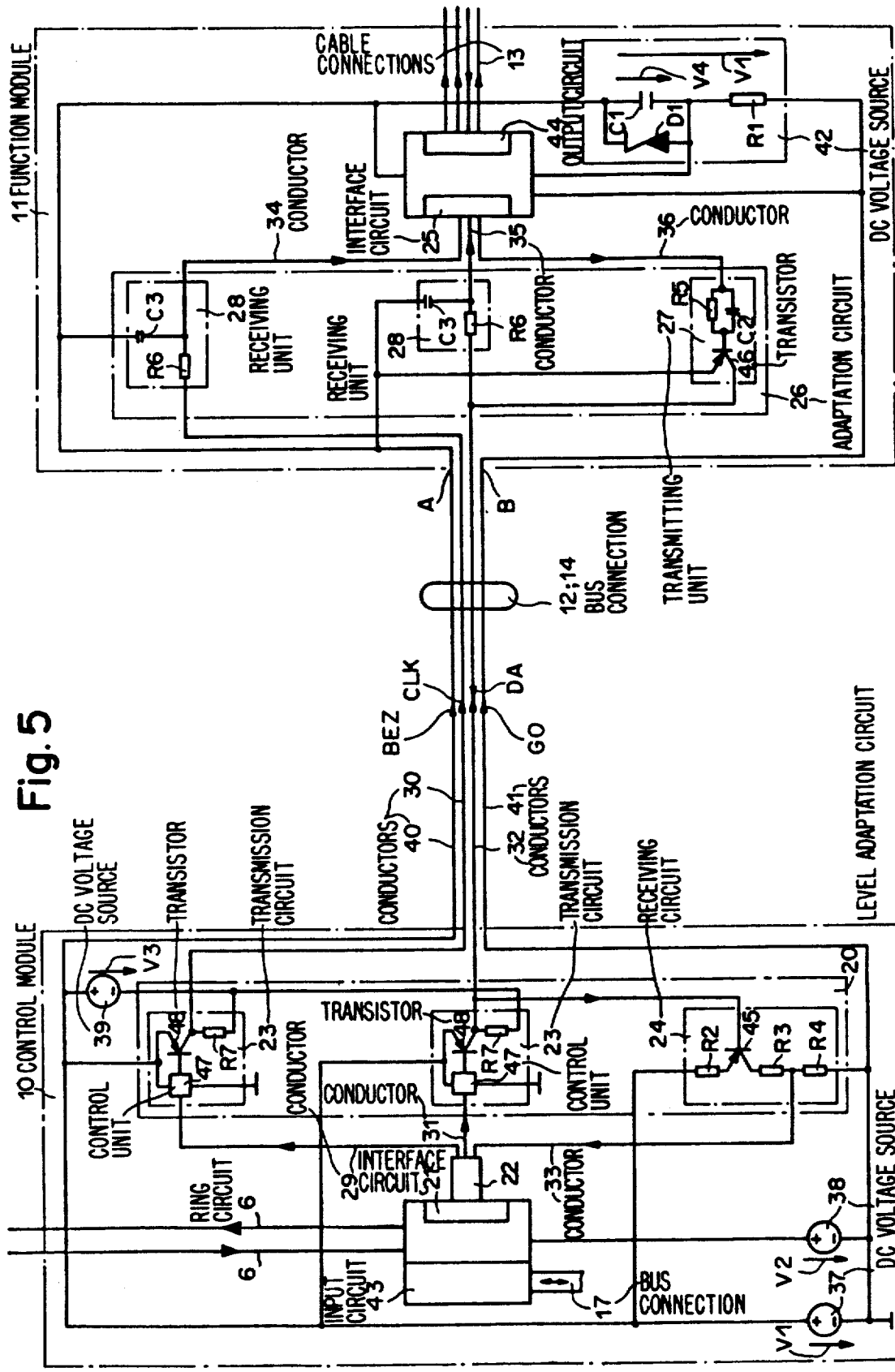
FIG. 5 shows a diagram of a transmission system equipped with one single function module.

Since all function modules 11 on the side of the bus rail are identical in structure and since they are connected in parallel to their bus connections, it suffices to describe an installation equipped with only one single function module 11 in order to explain the operation of the transmission system. Such a transmission system as shown in FIG. 5 contains at least one control module 10 which is connected via a bus connection 12; 14 to one single function module 11. The interface circuit 21 of the control module 10 is connected within the control module 10 by means of three conductors which, together, constitute a bus 22, for connection to the level adaptation circuit 20 of the control module 10. Each level adaptation circuit 20 comprises two transmission circuits 23, one for the pulse signal CLK and one for data signals DA and of one receiving circuit 24 for the data signals DA. Each function module 11 has among other devices an adaptation circuit 26 at its input and downstream from same an interface circuit 25, both of which are identical in structure for all function modules 11. Each adaptation circuit 26 of the function modules 11 comprises a transmitting unit 27 for the data signals DA and two receiving units 28, one for the pulse signal CLK and one for the data signals DA. A conductor 29 first A conductor 29 of the bus 22 connects within the control module 10 a first output of the interface circuit 21 to an input of a first one of the two transmission circuits 23 of the level adaptation circuit 20. An output of this first transmission circuit 23 is connected via a conductor 30 of the bus connection 12; 14 to the input of a first one of the two receiving units 28 of the adaptation circuit 26 of the function module 11. The conductor 30 is a synchronization conductor and is used for the transmission of the pulse signal CLK (clock) from control module 10 to all function modules 11. A second conductor 31 of the bus 22 connect within the control module 10 a second output of the interface circuit 21 to an input of the second transmission circuit 23 of the level adaptation circuit 20. An output of this second transmission circuit 23 is connected via a conductor 32 of the bus connection 12; 14 to an input of the second receiving unit 28 as well as to an output of the transmission unit 27 of each of the adaptation circuits 26 of the function modules 11, and is furthermore connected directly to an input of the receiving circuit 24 of the level adaptation circuit 20. The third conductor 33 of the bus 22 connects within the control module 00 an output of the receiving circuit 24 of the level adaptation circuit 20 to an input of the interface circuit 21. The conductor 32 of the bus connection 12; 14 is a data conductor and serves as the sole conductor of the time-serial transmission in both direction of the data signals DA between the control and the function modules 10 and 11. An output of the first receiving unit 28 is connected within the function module 11 via a conductor 34, an output of the second receiving unit 28 via a conductor 35 and an input of the transmitting unit 27 via a conductor 36, each to a connection of the interface circuit 25.

The control module 10 furthermore contains a first DC voltage source 37, a second DC voltage source 38 and for each function module group 19, i.e. also for each level adaptation circuit 20, a third DC voltage source 39. The DC voltage source 37 has for example a DC output voltage V1 of approximately 21 Volts while the DC voltage sources 38 and 39 have respectively output voltages V2 and V3 of approximately 5 volts. All DC voltage sources 37 to 39 comprises for example of one mains supply circuit which is supplied by an alternate current power supply of 220 Volts or 110 Volts. The low output DC voltages V2 and V3 of the DC voltage sources 38 and 39 can however be derived also from the higher output DC voltage of the DC voltage source 37. In that case the DC voltage sources 38 and 39 are supplied with the output DC voltage of the DC voltage source 37. The DC voltage sources 38 and 39 then each comprise of a resistor and a downstream parallel connection of a Zener diode and of a capacitor (see FIG. 5 which shows the identical structure of a DC voltage source 42 of the function module 11). The common pole of the resistor, of the capacitor and of the Zener diode constitute in this case the output of the DC voltage sources 38 and 39 The voltages of the overall system, of the control module 10 and of the instruments of the technical operating installation 9 are referenced by a common potential GO which serves as the common reference potential (zero value) The negative poles of the two DC voltage sources 37 and 38 are connected to each other and are fed by the same potential GO. The positive poles of all DC voltage sources 37 and 39 are also connected to each other. They are at an electrical voltage BEZ and together constitute the positive pole of a DC supply voltage V1 of the function module 11. This DC supply voltage V1 is equal to the output DC voltage of the DC voltage source 37, so that the negative pole of the DC supply voltage V1 is at the potential GO. The positive poles of the DC voltage sources 37 and 39 are connected to the second conductor 40 of the conductor pair 40; 41 of the bus connection 12; 14 and via the latter to a positive supply pole A of the function module 11 for the purpose of supplying the function module 11 with its DC supply voltage V1. The negative poles of the DC voltage sources 37 and 38 which are connected to each other are connected for the same purpose via a conductor 41 of the bus connection 12; 14 to a negative supply pole B of the function module 11 which constitutes its ground connection. The DC voltage source 38 supplies the electronics of the control module 10 with the exception of the level adaptation circuit 20, the DC voltage source 39 on the other hand supplies via it second pole the supply pole of all the transmission circuits 23 of its own level adaptation circuit 20 while the DC voltage source 37 in turn, in addition to all the function modules 11, also supplies the reception circuit 24 of all the level adaptation circuits 20.

Each function module 11 contains its own DC voltage source 42 which is preferably a DC/DC converter which is supplied via the two conductors 40 and 41 of the bus connection 12; 14 and via the two supply poles A and B of the function module 11 with DC supply voltage V1 of the DC voltage source 37. Each DC voltage source 42 comprises preferably of a series connection of a resistor R1 and of a parallel circuit of a Zener diode D1 and of a capacitor C1. The output DC voltage V4 of the DC voltage source 42 related to the positive supply pole A is tapped at the common pole of the resistor R1, of the capacitor C1 and of the Zener diode D1 and supplies the electronics of the corresponding function module 11. The output DC voltage V4 of the DC voltage source 42 has preferably a value of approximately 5 volt. When an analog/digital converter or a digital/analog converter is present in a function module 11, the existence of an additional DC voltage source (not shown) is also necessary to supply it in this function module 11, and said DC voltage source can be structured identically to the first one, but must have an output DC voltage of approximately 10 volts.

The control module 10 is connected via ring circuit 6 to the computer 1 (see FIG. 2) which is no longer shown in FIG. 5. In addition to the level adaptation circuit 20 and the interface circuit 21, the control module 10 is furthermore equipped with an input circuit 43 which goes via the bus connection 17 to the operating device 16 (see FIG. 3) which is also no longer shown in FIG. 5.

In addition to the adaptation circuit 26 and to the interface circuit 25, each function module 11 is furthermore equipped with an output circuit 44 which is connected via cable connection 13 to the technical operating installation 9 (see FIG. 5) which is no longer shown in FIG. 5. In the output circuit 44 there are relay output circuits (not shown) which can be supplied directly from the DC supply voltage V1 of the function module 11, for example.

Each of the reception circuits 24 of the level adaptation circuit 20 of the control module 10 comprises a transistor 45 which can be a bi-polar PNP transistor for instance, and of three resistors R2, R3 and R4. The input of the reception circuit 24 constitutes the base of the transistor 45, its emitter is connected via resistor R2 to the positive pole of the DC voltage source 37 while its collector is connected via resistor R3 to the output of the reception circuit 24 which is in turn connected to the negative pole of the DC voltage sources 37 and 38 by way of the resistor R4.

The transmission unit 27 of the adaptation circuit 26 of each function module 11 comprises a transistor 46, e.g. a bipolar PNP transistor, and a parallel connection R5; C2 of a resistor R5 and of a capacitor C2. Within the transmission unit 27 its input is connected via parallel connection R5; C2 to the base of the transistor 46, the collector of which constitutes the output of the transmission unit 27 and the emitter of which is connected to the positive supply pole A of the corresponding function module 11.

The receiving units 28 of the adaptation circuit 26 of each function module 11 comprise the series connection of a resistor R6 and of a capacitor C3, whereby the common pole of these two components R6 and C3 constitute the output and the other pole of the resistor R6 constitute the input of each receiving unit. The other pole of the capacitor C3 is connected to the positive supply pole A of the corresponding function module 11.

The transmission circuit 23 of the level adaptation circuit 20 of the control module 10 comprises in each case of a control unit 47, a transistor 48 which can be a bi-polar PNP transistor for example, and of a resistor R7, whereby the control unit 47 is supplied by a DC supply voltage as is described in more detail below. The input of the control unit 47 constitutes the input of the transmission circuit 23 while the output of the control unit 47 goes to the base of the transistor 48. The emitter of the transistor 48 is in each instance connected to the positive pole of the DC voltage sources 37 and 39 while its collector goes via resistor R7 to a supply pole of the transmission circuit 23 which is in turn connected to the negative pole of the DC voltage source 39 serving as the second pole. The collector of the transistor 48 furthermore constitutes the output of the transmission circuit 23.

Figure 6:
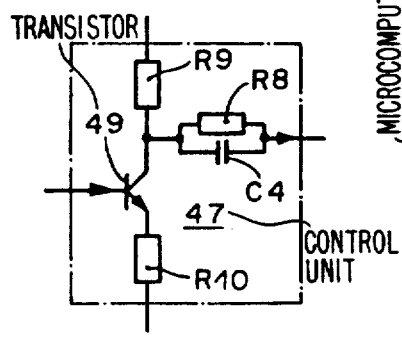
FIG. 6 shows a diagram of a control unit for a level-adaptation circuit.

The structure of the control unit 47 can be seen in FIG. 6 and consists of a transistor 49, which can be a bipolar NPN transistor for example, of a parallel connection C4; R8 of a capacitor C4 and of a resistor R8, a resistor R9 and a resistance R10. The base of the transistor 49 constitutes the input of the control unit 47, its collector is connected on the one hand via resistor R9 to the positive pole of the DC voltage sources 37 and 39 and on the other hand via parallel connection C4; R8 to the output of the control unit 47. The emitter of the transistor 49 goes via resistor R10 to the negative pole of the DC voltage sources 37 and 38. The capacitor C4 and the capacitor C2 of the transmission unit 27 (see FIG. 5) serve to improve the steepness of the edges of the transmitted impulses. Each of the transistors 49 and the transistors 45, 46 and 48 (see FIG. 5) function as switches.

The bus connection 12;14 therefore and in accordance with FIG. 5 contains at least four electric connectors 30, 32, 40 and 41, of which one pair of conductors 40; 41 comprising one first conductor 41 and one second conductor 42 serves for the bi-polar transmission of the DC supply voltage V1 from the control module 10 to the function modules 11, with the first conductor 41 going to the potential GO. The bus connection 12; 14 furthermore contains a third electric conductor 30 for the transmission of a periodic pulse signal CLK, also from the control module 10 to the function modules 11. In addition to all the supply voltage conductors 40 and 41 and to the pulse conductor 30, the bus connection 12;14 contains only one more, fourth electric connector 32 serving for the serial transmission of binary data of the data signal DA between the control and the function modules 10 and 11. The pulse signal CLK is preferably periodically rectangular and serves for the synchronization of non-modulated transmitted binary data telegrams constituting the data signal DA.

The conductor 41 which serves as a grounding conductor for the overall system can be laid outside the bus rail 12 singly and separated from the three other conductors 30, 32 and 40, while the three latter conductors together constitute preferably a tripolar flat strip or round cable outside the bus rail 12.

The potential BEZ supplying the second conductor 40 of the conductor pair 40; 41 is that of the positive pole of the DC supply voltage V1 and is at the same time the common potential (zero value) to which the potentials of the transmitted signals DA and CLK in their transmission via bus connection 12; 14 as well as the voltages of the electronics of the function module 11 correspond, instead of being referred to the potential GO of the first conductor 41 of the conductor 40; 41. By using the potential BEZ of the conductor 40 as reference potential for the transmission instead of the potential GO of the conductor 41, the interval between errors in transmission is significantly improved because the potential GO of the overall system grounding and thereby of conductor 41 is far from being ideally constant. This is because as a rule strong switching and a.c. currents flow over the overall system ground, and these can produce great ohmic and/or inductive voltage drops in conductor 41. Both signals DA and CLK have binary values, whereby the logic value "0" is equal to a value of nearly zero volts and the logic value "1" is equal to a value of nearly −5 volt, i.e. both signals DA and CLK are transmitted using "negative logic". Zero volt in this case, as mentioned before, is referred to the BEZ voltage going to the reference conductor 40.

The transmission circuits 23 of the level adaptation circuit 20 serve mainly to convert the internal digital 5-volt signal voltages of the control module 10, which are all referred to the overall system ground and therefore to the potential GO of the conductor 41, into digital 5-volt signal voltages which no longer referred to the potential GO but to the potential BEZ of the conductor 40. Additionally, the transmission circuits 23 serve to provide the control module 10 with an output which can be easily connected in parallel to all the connections of the function module 11 which are connected to the bus connection 12; 14. If a logic value "1" which is referred to the system ground for example lies at the input of the transmission circuit 23 and thereby at the input of the control unit 47, the transistor 49 in the control unit 47 (see FIG. 6) connects through so that the full voltage V1 is present in the base emitter path of the transistor 48 (see FIG. 5) while the latter also connects through, causing the potential BEZ which is equal to a logic value "0" to appear at the output of the transmission switch 23 and thereby on the conductor 30 or 32 of the bus connection 12; 14. The transmission circuit 23 thus also functions as an inverter.

The receiving circuit 24 of the level adaptation circuit 20 on the other hand, converts the digital 5-volt signal voltages which go through the conductor 32 of the bus connection 12; 14 with the correct polarity into equally strong 5-volt signal voltages of the control module 10 which are in turn referred to the potential GO. If for example a logic value "1", i.e. −5 volt in relation to the potential BEZ goes to the input of the receiving circuit 24 and thereby to the base of the transistor 45 (see FIG. 5), then the transistor 45 is conductive and the full DC voltage V1 goes to the series connection of the resistors R3 and R4 which function as a voltage divider and which reduce the DC voltage V1 to 5 volts, whereby this 5-volt voltage and the DC distribution voltage V1 are referred to the potential GO.

The receiving units 28 of the adaptation circuit 26 function as low pass filters for the elimination of high-frequency interferences which may be present on the bus connection 12; 14 while the transmission unit 27 of the adaptation circuit 26 only serves to realize an "open collector" output for the function module 11 so that the transmission units 27 of all function modules 11 can be connected in parallel at the outputs without getting into each others' way.

The control module 10 contains a digital function block controlled by a microcomputer 50 to manage the transmission connection of function modules 11 to the bus connection 12; 14 if several such function modules 11 are present. The digital function block in turn is associated with an interface circuit 21 and at least one level adaptation circuit 20 downstream of the interface circuit 21.

Figure 7:
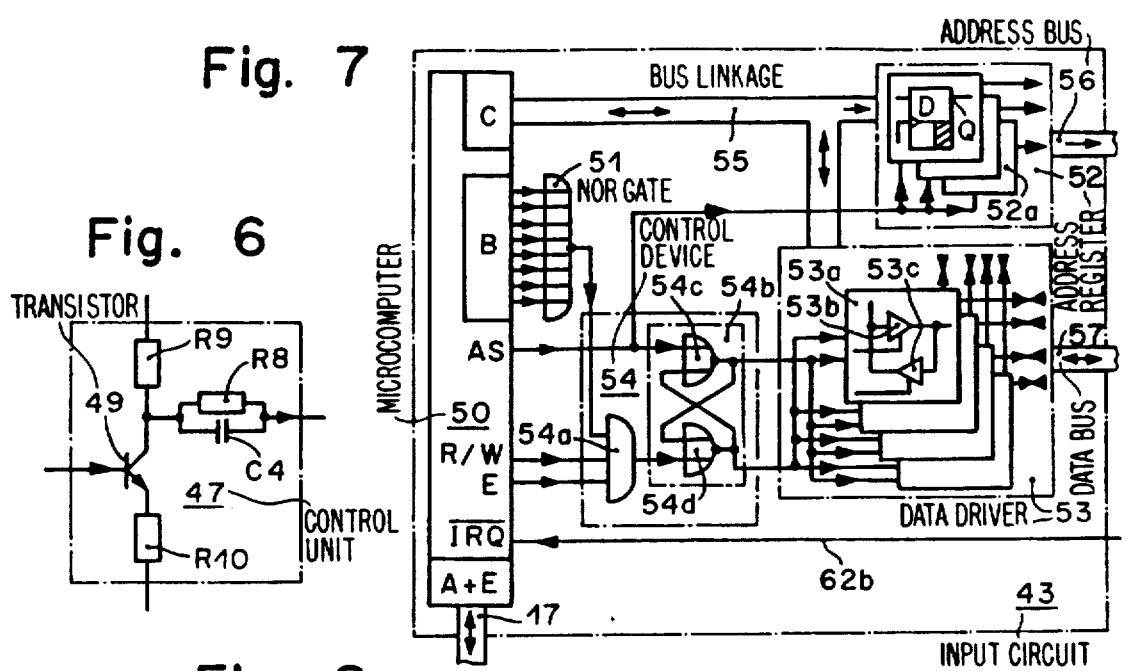
FIG. 7 shows a block diagram of an input circuit of a control module.

The input circuit 43 of the control module 10 is shown in FIG. 7 and comprises the microcomputer 50, of a NOR gate 51, an address register 52, a bi-directional data driver 53 and a directional control device 54. The microcomputer 50 can be a microcomputer of the type MC68HC11 of the Motorola company and is described in detail in their data book. It is then provided with a "port A" and a "port E", the connections of which go to the bus connection 17, a "port C", the connections of which are connected via a bus linkage 55 to a first bus connection of the data driver 53 and to a bus input of the address register 52, as well as a "port B" each output of which goes to an input of the NOR gate 51 which can have eight inputs, for example. When the control module 10 is in operation, the eight most significant bits of a 16-bit address of the microcomputer 50 are assigned to the eight inputs of the NOR gate 51 and are without significance for the control module 10 and therefore have a logic value "0". Only when all these most significant bits have a logic value "0" does a logic value "1" appear at the output of the NOR gate 51 and releases an AND gate 54a contained in the directional control device 54.

The address register 52 has as many flipflops 52a as there are bus conductors made available by the bus linkage 55 for the address register 52. Hereinafter it is assumed that three bus conductors, for example, are connected to the bus linkage 55 which has a total of 8 bus conductors, at the bus input of the address register 52 and that the latter thus consists of three flipflops 52a. The D-inputs of these flipflops 52a constitute the bus input and their Q-outputs the bus output of the address register 52. The bus output of the address register 52 is connected within the control module 10 via an address bus 56 with the downstream interface circuit 21. The clock inputs of the flipflops 52a are all interconnected and constitute a clock input of the address register 52.

The data driver 53 has as many tri-state drivers 53a as the bus linkage 55 has bus conductors, i.e. preferably 8. FIG. 7 shows only four tri-state drivers 53a for the sake of simplification of the drawing. Each tri-state driver 53a comprises a driver 53c or 53b per transmitting direction, with the output of one being always connected to the input of the other. The control inputs of the drivers 53b are all interconnected and constitute a first control input of the data driver 53 which frees the transmission in direction going from the microcomputer 50 to the interface circuit 21. The control inputs of the drivers 53c are also interconnected and constitute a second control input of the data driver 53 which frees the transmission in the direction going from the interface circuit 21 to the microcomputer 50. The inputs of the drivers 53b and thereby also the outputs of the drivers 53c constitute the first bus connection of the data driver 53 connected to the bus linkage 55. The inputs of the drivers 53c and thereby also the outputs of the drivers 53b constitute a second bus connection of the data driver 53 which is connected in the control module 10 via a bidirectional data bus 57 to the interface connection 21.

The directional control device 54 serves to fix the direction of transmission of the data driver 53 and comprises the AND gate 54a and of an RS flipflop 54b which itself is constituted by two NOR gates 54c and 54d. Within the RS flipflop 54b each output of a NOR gate 54c or 54d is connected to a first input of the other NOR gate 54d or 54c while the second input of each NOR gate 54d or 54c constitutes an R or an S input of the RS flipflop 54b. The outputs of the two NOR gates 54c and 54d constitute the Q and the inverted Q output of the RS flipflop 54b and of the directional control device 54.

The microcomputer 50 has an output at which an "address strobe" signal AS appears and which is connected by one pole to the clock input of the address register 52 and to the second input of the NOR gate 54c. The output of the NOR gate 54c and thereby a first output of the directional control device 54 goes in turn to that control input of the data driver 53 which is connected to the control inputs of the drivers 53c. Two outputs of the microcomputer 50, at which a read/write signal R/W or an enable signal E appears, as well as the output of the NOR gate 51 are each connected by one pole to an input of the AND gate 54a, the output of which is in turn connected to the second input of the NOR gate 54d. The output of the NOR gate 54d and thereby a second output of the directional control device 54 is connected to that control input of the data driver 53 which is connected to the control inputs of the drivers 53b.

The control module 10 is interrupt-active and operates entirely autonomously under the control of the microcomputer 50 in order to exchange a binary telegram with the function modules 11. The manner of operation of the microcomputer 50 and its auxiliary circuits are described in detail in the documentation of the Motorola company. In the time-multiplex process, the bus linkage 55 contains either address or data which are demultiplexed under the direction of the microcomputer 50 in the following manner. The addresses are loaded with each leading edge of the AS signal into the flipflop 52a of the address register 52 where they are stored. Simultaneously, when the R/W or the E signal is low so that the AND gate 54a is locked, the RS flipflop 54b is reset to zero by the AS signal, i.e. a logic value "0" appears at the output of the NOR gate 54c, causing the drivers 53c to be locked and the drivers 53b to be freed. The data driver 53 is thus switched into the direction of transmission. When the microcomputer wants to initiate a writing cycle it gives a logic value "0" to the R/W signal and this confirms the momentary status of the RS flip flop 54b since the AND gate remains locked. The data driver 53 thus continues to be switched into the direction of transmission as desired. If on the other hand a reading cycle is initiated by the microcomputer, it assigns the R/W signal a logic value "1", causing the RS flipflop to be changed over with the next leading edge of the E signal since the output signal of the AND gate 54a then assumes a logic value "1". The switching over of the RS flipflop 54b causes a logic value "1" to appear at the output of the NOR gate 54, causing drivers 53c to be released and the drivers 53b to be locked so that the data driver 53 is switched into direction of reception, as desired. The R/W signal of the microcomputer 50 thus determines by means of the E signal and of the directional control device 54 whether the data appearing at the "C-Port" of the microcomputer 50 are carried from the C-port via bus linkage 55, drivers 53b of the data driver 53 and data bus 57 to the interface circuit 21 or vice-versa, whether the data supplied by the interface circuit 21 are transmitted via data bus 57, the drivers 53c of the data driver 53 and the bus linkage 55 to the C-port of the microcomputer 50.

Figure 8:
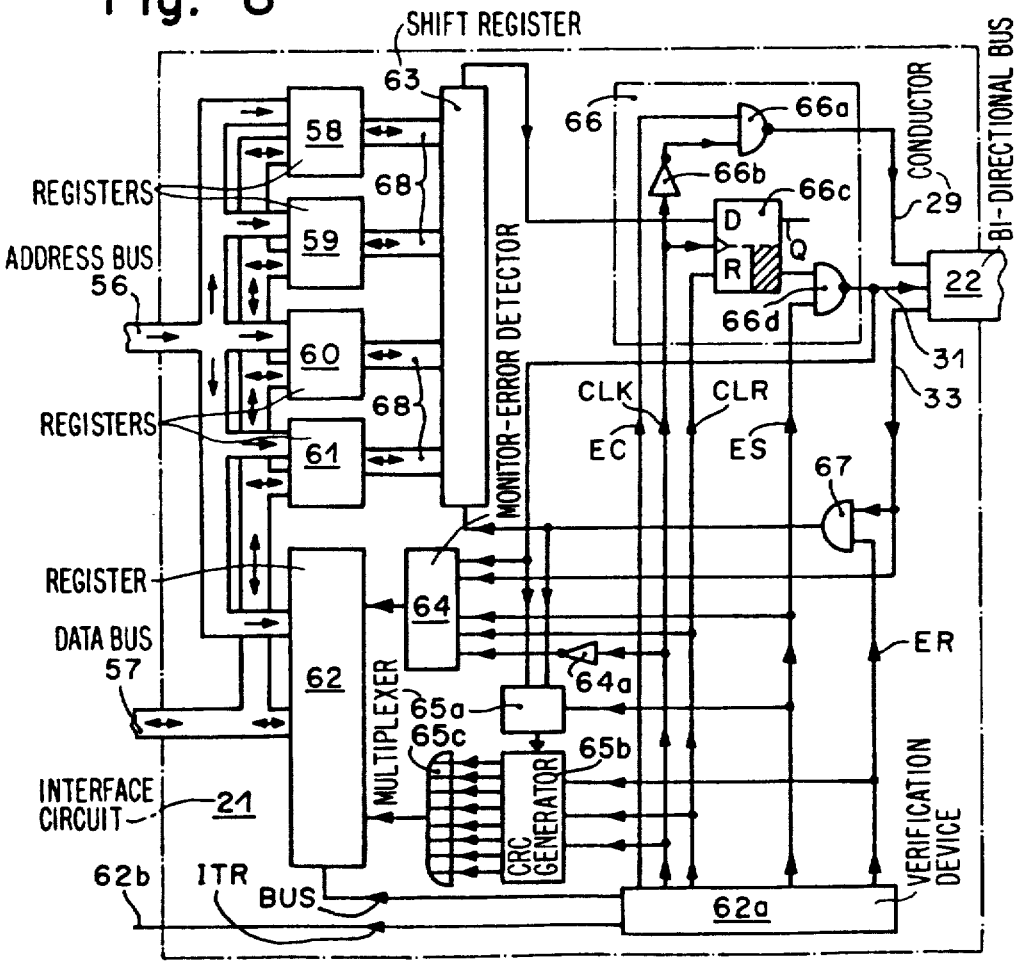
FIG. 8 shows a block diagram of an interface circuit of the control module.

The interface circuit 21 of the control module 10 shown in FIG. 8 comprises an address register 58, a function register 59 in case that a function byte is to be transmitted, of at least one data register 60 or 61, of a status register 62, a verification device 62a serving as a control device, a shift register 63, a monitor-error detector 64, an invertor 64a, a multiplexer 65a, a CRC generator 65b, an OR gate 65c, a transmission unit 66 and an AND gate 67 which serves as a receiving unit. The multiplexer 65a, the CRC generator 65b and the OR gate 65c are only present if a CRC byte is to be transmitted and evaluated. Preferably two data registers 60 and 61 are used as is assumed hereinafter, since preferably also two data bytes are transmitted in the data telegram. The bus 56 is connected to one bus input of each of the five registers 58 to 62. Similarly, bus 57 is connected to a first bus connection of each of the five registers 58 to 62. One bus link 68 with preferably 8 bus conductors connects a second bus connection of each of the four registers 58 to 61 to a parallel input-output with 32 bits of the shift register 63 the serial output of which is connected by a single pole to an input of the transmission unit 66. The shift register 63 is a 32-bit shift register and all four bus connections 68 together constitute a 32-bit bus. The output of the AND gate 67 is connected to a first input of the multiplexer 65a and to a serial input of the shift register 63. The output of the multiplexer 65a is connected to a signal input of the CRC generator 65b and its parallel outputs are connected to the inputs of the OR gate 65c. One output of the monitor-error detector 64 and one output of the OR gate 65c is connected to one input of the status register 62. The transmission unit 66 has a NAND gate 66a, an invertor 66b, a flipflop 66c and a NAND gate 66d. The D input of the flipflop 66c constitutes the input of the transmission unit 66, the clock input of which, which is furthermore connected to the input of the invertor 66b, is constituted by the clock input of the flipflop 66c. The output of the invertor 66b is connected to a first input of the NAND gate 66a, the second input of which constitutes a first control input and the output of which constitutes a first output of the transmission unit 66. The inverted Q output of the flipflop 66c is connected to a first input of the NAND gate 66d, the second input of which constitutes a second control input and the output of which constitutes a second output of the transmission unit 66. Each of the two outputs of the transmission unit 66 is connected to the conductor 29 or 31 of the bus 22 while its conductors 33 are each connected to a first input of the AND gate 67 and of the monitor-error detector 64. The output of the NAND gate 66d is furthermore connected to a second input of the monitor-error detector 64 and to one input of the multiplexer 65a. A first control output of the verification device 62a at which an EC (enable clock) signal appears is connected to a first control input and a second control output of the verification device 62a at which an ES (enable send) signal appears is connected to the second control input of the transmission unit 66. The second control output of the verification device 62a is furthermore also connected to a control input of the monitor-error detector 64 and to a control input of the multiplexer 65a. A third control output of the verification device 62a at which an ER (enable reception) signal appears is connected to a second input of the AND gate 67 and to a control input of the CRC generator 65b. A reset output of the verification device 62a at which a reset CLR (clear) signal appears is connected to a reset input of the transmission unit 66, to a reset input of the monitor-error detector 64 and to a reset input of the CRC generator 65b, with the reset input of the transmission unit 66 being constituted by the reset input of the flipflop 66c. A clock output of the control device 62a, at which a CLK (clock) signal appears, is connected to a clock input of the transmission unit 66, to one input of the CRC generator 65b and (via invertor 64a) to one input of the monitor-error detector 64. A fourth control output of the control device 62a, at which a BUS (busy) signal appears is connected to an additional input of the status register 62 while a fifth control output of the verification device 62a at which an ITR (interrupt) signal appears is connected via a conductor 62b and via a second output of the interface circuit 21 to an "IRQ inverted" interrupt input of the microcomputer 50 (see FIG. 7).

A 3-bit address stored in the address register 52 (see FIG. 7) reaches the registers 58 to 62 via the address bus 56 (see FIG. 8) and selects one of the four first registers 58 to 61 for the storage of the following 8-bit data which come from port C and also reaches via the bus connection 55, the drivers 53b and the data bus 57 (see FIG. 7) the registers 58 to 62 where they are stored in the register 58, 59, 60 or 61 selected by the address. These 8-bit data can be function module addresses and are in that case stored in form of a address byte in the address register 58. However they can also be a function indication destined for the function module 11, and in that case they are stored in form of a function byte in the function register 59. The actual data comprise preferably of two data bytes, i.e. one first data byte of greater magnitude and a second data byte of a lower magnitude. During a so-called writing cycle these two data bytes are transmitted from the control module 10 to the function modules 11 and are first stored for that purpose in the data register 60 or 61. The sequence in which these four bytes are loaded into the different registers 58 to 61 is optional, with the exception of the address byte which must always be loaded last. Immediately following the loading of the address byte into the register 58, the contents of all four registers 58 to 61 are loaded in parallel via the bus linkage 68 in form of a 32-bitword into the shift register 63. The loading of the address byte into the address register 58 thus starts a telegram transmission on condition that at least 25 microseconds have passed since the end of the last transmitted telegram. This is indicated by a logic value "1" of the BUS signal which is produced within the verification device 62a and appears at the latter's fourth control output. If this is not the case, the interface circuit 21 waits with the start of the telegram until the BUS signal assumes a logic value of "1". If all the starting conditions are met the bytes stored in the shift register 63 are then pushed out of said shift register 63 sequentially via the serial output and are carried via transmission unit 66 and bus 22 to the level adaptation circuit 20. The shift register thus operates here as a parallel/series converter. During a so-called writing cycle the address byte, the function byte, the data byte of greater magnitude and the data byte of lower magnitude are pushed in the sequence indicated out of the shift register 63 and are transmitted in form of four first bytes of a binary data telegram which has a total of 5 bytes to the function module 11. The fifth byte of this telegram on the other hand is transmitted in opposite direction in form of a so-called CRC byte following the reception of the fourth byte by the addressed function module 11 from the latter to the control module 10. During a so-called reading cycle only the address byte and the function byte are pushed out of the shift register 63 in the sequence indicated and are transmitted in form of two first bytes of a telegram which again has 5 bytes to the function modules 11. The data byte of greater magnitude, the data byte of lower magnitude and the CRC byte are then transmitted in the sequence indicated, following receipt of the second byte, in form of the last three bytes of the telegram in opposite direction from the addressed function module 11 to the control module 10.

The byte of the telegram received by the control module 10, i.e. the CRC byte during a writing cycle and the two data bytes as well as the CRC byte during a reading cycle sequentially reach an input of the monitor-error detector 64 via the level adaptation circuit 20, the bus 22 and the conductor 33 as well as an input of the multiplexer 65a and the serial input of the shift register 63 via the AND gate 67. The two data bytes received in the course of a reading cycle are pushed in sequentially into the shift register 63 from which they are then loaded in parallel into the corresponding registers 60 and 61 via the bus linkages 68. The shift register 63 thus functions here as a series/parallel converter. Since the function modules 11 do not transmit any address and function bytes, no received bytes are stored in the registers 58, 59. In FIG. 8 it was assumed for reasons of drawing simplification that the parallel outputs and the parallel inputs of the shift register 63 are identical.

The status of the control module 10 is stored in the status register 62. During the telegram transmission monitoring and CRC error checking tasks are carried out continuously. An error in telegram transmission detected during these two error detections produces a logic value "1" at the output of the monitor-error detector 64 or of the OR gate 65c at the latest at the end of the telegram. The status of these two outputs is stored in readable form in two of the bits of the status register 62 which could be four in number for example, since the output of the monitor-error detector 64 and of the OR gate 65c are each connected to an input of the status register. The control module 10 is as a rule equipped with a "watch-dog" circuit which is not shown in the drawing of the control module 10. The fact that the watch-dog circuit had to intervene is indicated in an electrically readable manner by a logic value "1" in a third bit of the four bits of the status register 62. The process control within the interface circuit 21 is carried out by the verification device 62a. The status of the verification device 62a can be read off in form of a logic value "1" of the BUS signal in the fourth of the four bits of the status register. The verification device 62a furthermore reports to the microcomputer 50 at the end of each telegram by means of an interrupt ITR signal.

The clock signal CLK produced in the verification device 62a is inverted by means of the invertor 66b and the inverted clock signal is released by means of the NAND gate 66a and the EC signal which is also produced in the verification device 62a so that the clock signal CLK can be carried over the conductor 29 of the bus 22.

The time/serial output signal of the shift register 63 is synchronized by means of the clock signal CLK and the flipflop 66c and is then inverted and carried to the NAND gate 66d which is released if a writing cycle applies during the first four bytes of the telegram and if a reading cycle applies during the first two bytes of the telegram by means of the ES signal which is also produced in the verification device 62a. The monitor-error detector 64 only evaluates the bytes emitted from the control module 10. Each of these bytes emitted by the transmission unit 66 goes to an input of the monitor-error detector 64 over two different paths, i.e. on the one hand within the interface circuit 21 coming directly from the output of the transmission unit 66d and on the other hand (see FIG. 5) via the conductor 31 of bus 22, one of the two transmission circuits 23 of the level adaptation circuit 20, the reception circuit 24 and the conductor 33. The control module 10 thus monitors its own transmission and compares the transmitted data which reach the monitor-error detector 64 over different paths by means of the latter in order to give an alarm in case of non-agreement for the purpose of interrupting the telegram immediately and to cause its transmission to be repeated. The structure of the monitor-error detector 64 is shown in FIG. 20 and its manner of operation shall be explained later in the description of FIG. 20.

The AND gate 67 is released by means of the ER signal which is also produced in the verification device 62a, during the reception of the last byte if a writing cycle applies and during the reception of the last three bytes of the telegram if a reading cycle applies.

The last byte transmitted in a writing as well as in a reading cycle is always a CRC byte which is emitted in both cycles from the addressed function module 11 to be received by the control module 10. No register is assigned to this CRC byte but is only evaluated in teh CRC generator 65b whic it reaches via the multiplexer 65a. The structures of the multiplexer 65a and of the CRC generator 65b are shown respectively in FIGS. 19 and 18. The significance of the CRC byte as well as the manner of operation of the multiplexer 65a and of the CRC generator 65b shall be explained in greater detail in the descriptions of FIGS. 18 and 19. It should only be noted here that since the AND gate 67 is released by the ER signal only when the control module 10 receives the bytes emitted from a function module 11, these bytes reach an input of the multiplexer 65a via the released AND gate 67 while the bytes emitted by the control module 10 itself are on the other hand transmitted directly from the output of the transmission unit 66 to another input of the multiplexer 65a. The multiplexer 65a immediately sends the two byte types on to the CRC generator 65b.

Figure 9:
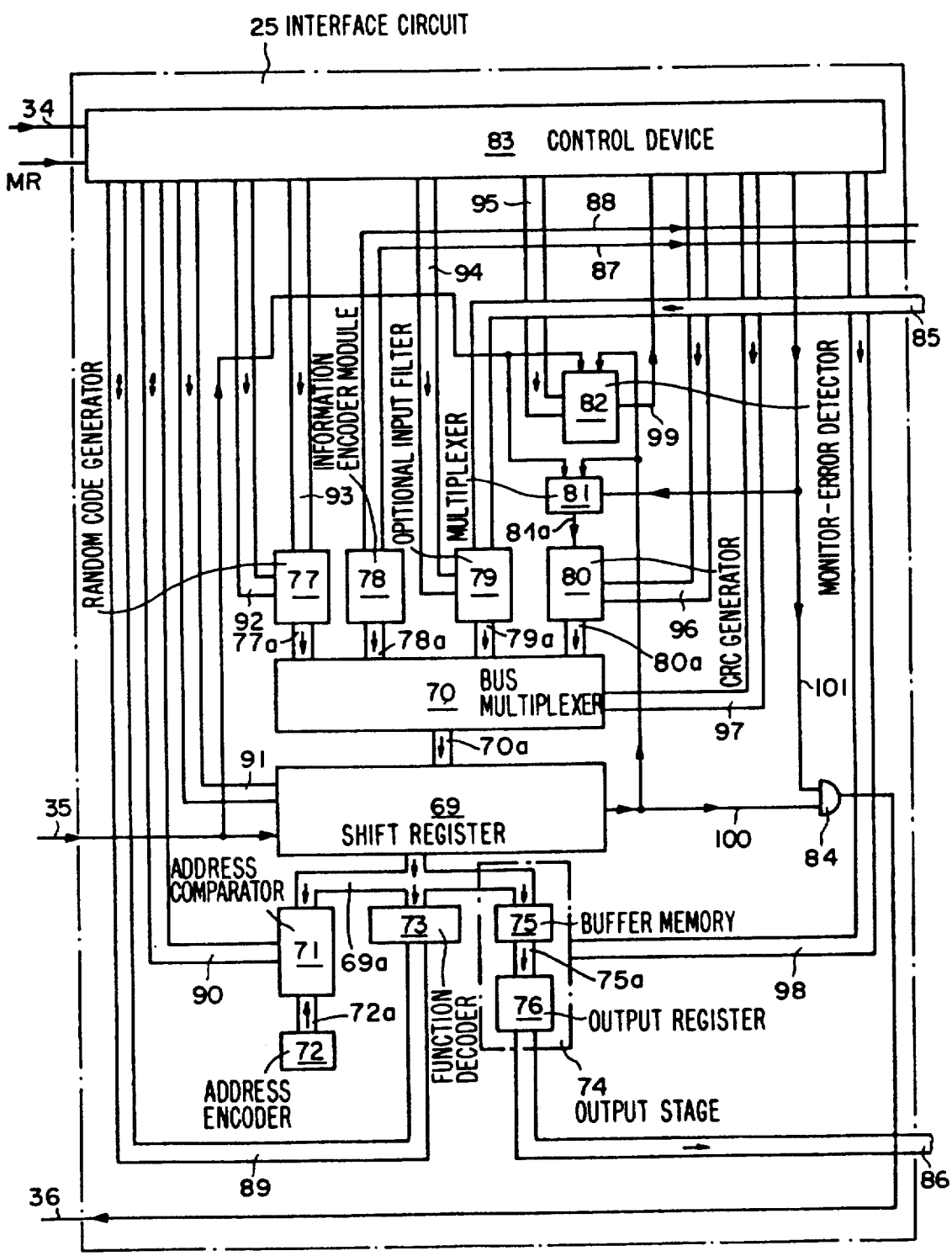
FIG. 9 shows a block diagram of an interface circuit of a function module.

The interface circuit 25 of the function module 11 shown in FIG. 9 comprises a shift register 69, a bus multiplexer 70, an address comparator 71, an address encoder 72, a function decoder 73 in case that a received function byte is to be evaluated, an output stage 74 which comprises a buffer memory 75 and an output register 76 connected downstream by means of a bus 75a, a random code generator 77, an information encoder module 78, an optional input filter 79, a CRC generator 80 in case that a CRC byte is to be transmitted, a multiplexer 81, a monitor-error detector 82, a control device 83 and an output release gate 84. The interface circuit 25 is connected to the output circuit 44 of its function module 11 via an input bus 85 and an output bus 86. Within the interface circuit 25 the input bus 85 is connected in the indicated sequence either directly or via the input filter 79, a bus 79a, the bus multiplexer 70 and a bus 70a to a parallel input of the shift register 69. Two outputs of the module information encoder 78 are each connected over one pole via a control connection 87 or 88 to a control input of the output circuit 44. The output of the random code generator 77 is connected via a bus 77a, the output of the module information encoder 78 via a bus 78a, that of the input filter 79, if present, via bus 79a and that of the CRC generator 80 via a bus 80a, each to a bus input of the bus multiplexer 70 the output of which is connected in turn via bus 70a to a first parallel input of the shift register 69. A bus 69a connects a parallel output of the shift register 69 to a bus input of the address comparator 71, a bus input of the function decoder 73 and to a bus input of the output stage 74. Within the output stage 74, bus 69a is connected to a data bus input of the buffer memory 75 whose data output is connected via bus 75a to a data bus input of the output register 76 whose data output in turn constitutes the data bus output of the output stage 74 which is again connected to the output bus 86. The address encoder 72 is connected via a bus 72a to a second bus input of the address comparator 71. The control device 83 is connected via a first control bus 89 to a control bus connection of the function decoder 73, via a second control bus 90 to a control bus connection of the address comparator 71, via a third control bus 91 to a control bus connection of the shift register 69, via a fourth control bus 92 to a first control bus connection of the random code generator 77, via a fifth control bus 93 to a second control bus connection of the random code generator 77, via a sixth control bus 94 to a control bus connection of the input filter 79, via a seventh control bus 95 to a control bus connection of the monitor-error detector 82, via an eight control bus 96 to a control bus connection of the CRC generator 80, via a ninth control bus 97 to a control bus connection of the bus multiplexer 70 and via a tenth control bus 98 to a control bus connection of the output stage 74.

An output of the monitor-error detector 82 is connected via an input conductor 99 to a first single-pole input of the control device 83. The conductor 35 coming from the output of the adaptation circuit 26 is connected to a serial input of the shift register 69 and to the first inputs respectively of the multiplexer 81 and of the monitor-error detector 82, while a serial output of the shift register 69 is connected via a cable connection 100 to a first input of the output release gate 84 as well as to the second inputs respectively of the multiplexer 81 and of the monitor-error detector 82. An output of the multiplexer 81 is connected via a cable connection 81a to a serial input of the CRC generator 80 while a single-pole output of the control device 83 is connected via a cable connection 101 to a third input of the multiplexer 81 and to a second input of the output release gate 84 which is an AND gate and the output of which is connected to the conductor 36 going to the adaptation circuit 26. The conductor 34 coming from the adaptation circuit 26 is connected to another single-pole input of the control device 83 which furthermore has an additional single pole input to which the master reset MR signal is connected.

The bus multiplexer 70 contains four groups of bus drivers, one of each is assigned respectively to the buses 77a of the random code generators 77, 78a of the module information encoder 78, 79a of the input filter 79 and 80a of CRC generator 80. Each group contains as many bus drivers as there are bus conductors provided for the corresponding buses 77a, 78a, 79a and 80a. Each bus driver is a "tri-state" driver and has a control input by means of which it can be switched on and off. The inputs of the bus drivers of one group are respectively connected within the bus multiplexer 70 to the bus conductors of the corresponding buses 77a, 78a, 79a or 80a while each of their outputs is connected to a bus conductor of the output bus 70a which is in common to all groups.

The two encoders 72 and 78 preferably comprise short-circuit or diode connectors by means of which electrical connections are established within the corresponding encoder 72 or 78 according to the desired code between its individual outputs and the logic values "1" or "0". The structure of the other components of the interface circuit 25 is described hereinafter through the FIGS. 10 to 20.

The transmission system works on the semi-duplex principle, i.e. the transmission alternates in both directions of transmission. At the same time a rigid master/slave principle is observed with utilization of a synchronized byte-oriented bit-serial transmission, whereby the information of a binary telegram is transmitted byte by byte in time. The control module 10 always supervises the bus connection as the master while each function module 11, as slave, is in turn supervised by the bus connection. The number of the transmitted bytes is constant per function module access and is preferably equal to 5 bytes of 8 bits each. The clock signal CLK supplied by the control module 10 and appearing on the synchronization conductor 30 serves synchronization as well as the control of reception on the function module side. Each function module 11 has a modular address which can be set on its address decoder 72 on the hardware and which can have 8 bits for example, so that 256 different modules are available for selection.

Every information addressed by a module address and, if present, by a channel number is called a data point. The information transmitted on the data conductor 32 comprises, as mentioned before, of 5 bytes of a binary telegram appearing in the following sequence on the bus connection 12; 14 at every function module access: address byte as the first byte, function byte as the second byte, first data byte as the third byte, second data byte as the fourth byte and CRC byte as the fifth byte.

During a writing cycle, i.e. when the direction of transmission of the two data bytes is from the control module 10 to the function module 11, the first four bytes are transmitted into the direction indicated while the fifth byte on the other hand, i.e. the CRC byte, is transmitted in opposite direction as an answerback communication from the function module 11 to the control module 10. During a reading cycle, i.e. when the direction of transmission of the two data bytes is from the function module 11 to the control module 10, the first two bytes are again transmitted in the direction going from the control module 10 to the function module 11 in order to call up a function module 11, but the last three bytes are transmitted in the opposite direction from the function module 11 to the control module 10. The first two bytes, i.e. the address byte and the function byte, are thus always transmitted in all cycles from the control module 10 to the function module 11 and the fifth byte, i.e. the CRC byte is always transmitted from the function module 11 to the control module 10. The direction of transmission of the third and fourth bytes, i.e. of the two data bytes, depends however on the type of cycle. The two data bytes are thus produced either during a writing cycle in the control module 10 or during a reading cycle in a function module 11. Within each telegram, i.e. within each cycle, the direction of transmission of the two data bytes is however maintained and does not change. In each byte the MSB (most significant bit) is transmitted first as bit "7" and the LBS (least significant bit) is transmitted last as bit "0".

The clock signal CLK supplied by the control module 10 via the synchronization conductor 30 controls the applicable transmission cycle. All the function modules 11 constantly monitor on this conductor 30 and react immediately to any changes of the clock signal appearing therein. Each transmission cycle starts with a start condition on the synchronization conductor 30, contains a binary telegram and ends with a stop condition. A starting impulse carried by the control module 10 must appear for a minimum period of time ti on the synchronization conductor 30 so that the function module 11 can recognize the start as such. All the function modules 11 then actively switch themselves to the data conductor 32. The function modules 11 cannot become active by themselves on the bus connection 12; 14. A telegram can be interrupted by a new start at any time however.

The start impulse comprises a negative voltage rise which is produced and made available by the control module 10. If the period t1 of this negative voltage rise is greater or equal to the minimum period ti of, for example 25 μs, the data reception of the function module 11 is started with the next rising edge of the clock signal CLK.

Following the recognition of the start impulse the function modules 11 are ready to receive and evaluate the transmitted telegram and in particular its address byte. The data bites of the telegram are transmitted by the applicable transmitter over the data conductor 32 as the edge of the clock signal CLK drops and are scanned by the applicable receiver as the edge of the clock signal CLK rises.

If the synchronization conductor 30 remains for too long under a low voltage during a telegram, i.e. if the time period ti of an impulse gap of the clock signal CLK is greater than or equal to ti during a telegram, the function module 11 recognizes this as an error. The telegram is then interrupted and followed by a new start of the telegram with the next rising edge of the clock signal CLK. The function modules 11 react only at the end of a transmission cycle to any other errors.

The arrival of 5 bytes of 8 bits each, i.e. the arrival of the fortieth clock impulse after the recognition of the starting condition signals the end of the telegram to the function modules 11. Following this they still await a confirmation signal which must be sent by the control module 10 after the end of the telegram. If the control module finds, at the end of the telegram, that said telegram has been transmitted correctly it emits a confirmation signal "OK", comprising in that the duration t2 of an impulse of the clock signal is smaller than $t_o$ and that the duration t1 of the corresponding impulse gap is greater than or equal to ti, with $t_o$ having a value of 128 μs, for example. However, if the control module finds at the end of the telegram that said telegram was not transmitted correctly it emits a confirmation signal "Not OK" comprising in that the duration t2 of an impulse of the tact signal CLK is greater than or equal to $t_o$ or in that the duration t1 of an impulse gap of the clock signal CLK is smaller than ti.

If the synchronization conductor 30 remains at a high voltage for too long a period during a telegram, i.e. if the duration t2 of an impulse of the clock signal CLK during a telegram is greater than or equal to $t_o$, the function modules 11 cause a telegram interruption to occur, with subsequent expectation of a new start.

Each function module 11 which has received its own address must be provided with an error-free telegram within a period of time tw or a "watch dog" alarm is released in the corresponding function module 11. The period tw can be equal to 4 seconds, for example.

The frequency of the clock signal CLK is preferably 30 kHz to 80 kHz. Hereinafter it is assumed that this frequency has a value of 62.5 kHz. This is at the same time the bit frequency of the transmission telegram. A higher impulse number of the telegram is considered by the corresponding function module 11 to be a transmission error and the corresponding telegram is ignored.

The shift register 69 functions as a series/parallel or as a parallel/series converter. Upon reception of the starting impulse the address byte is pushed sequentially as the first one of the bytes received via conductor 35 into the shift register 69 of the interface circuit 25 of all the function modules 11 and, as soon as it is stored therein, is transmitted via bus 69a to the address comparator 71 in which the address received is compared with the modular address delivered by the address encoder 72 via bus 72a which is set by the hardware in the address encoder 72. If the two addresses do not agree, the function modules 11 concerned are locked to the reception of the following bytes of the telegram and they wait for a next start impulse while these bytes are pushed in time one after the other via conductor 35 sequentially into the shift register 69 of the non-locked function module 11, hereinafter the addressed function module 11 for short. The bits which are simultaneously pushed out at the serial output of the shift register 69 are prevented by the locked output release gate 84 from reaching the conductor 36.

The function byte which is then received by the addressed function module 11 as a second byte emitted by the control module 10 is pushed into the addressed function module 11's shift register 69 and is then loaded via bus 69a into the corresponding function decoder 73 for evaluation. The decoding of the function byte taking place in the function decoder 73 informs th addressed function module 11 in detail on the type of the information still to be transmitted in the third and/or fourth byte of the current telegram.

The LSB of the function byte determines for example the direction of transmission of the third and fourth byte. If this LSB has a logic value of "1", this means for example that the control module 10 wishes a reading cycle and expects information from the addressed function module 11 in the transmitted third and/or fourth byte of the telegram. If this LSB has a logic value of "0" however, this means that the control module 10 wants a writing cycle and will itself transmit information to the addressed function module 11 in the third and/or fourth byte of the telegram.

Theoretically an additional $2^7 = 127$ different function data are possible as contents of the 8 bits of the function byte per address for the direction of transmission. In order for the function module 11 not to switch over to another function in case of a bit error in the data conductor 32, a great Hamming distance is selected between two function byte values used as code words so that in addition to the direction of transmission of the data bytes, the function byte now only contains four function data, i.e. so that the addressed function module 11 must send either a so-called "address polling telegram", a module information telegram or an actual data telegram as the third and/or fourth byte during a reading cycle. In a writing cycle on the other hand, only one actual data telegram is transmitted as the third and fourth bytes. For function modules 11 with analog input/output, a function module 11 contains as a rule several data channels. In that case, be it during a reading or a writing cycle, a bit of the function byte indicates during the transmission of an actual data telegram which of the data channels of the addressed function module 11 is to be described or read.

The so-called "address polling" represents a control over multiple use of a particular module address. Each function module 11 which is put into action by the transmitted address sets one single and randomly selected bit in the third of fourth byte to a logic value of "1". In this way only one logic value "1" exists in teh total of 16 bits of the third and fourth byte during an address polling cycle and can appear at any location in one of the two bytes and is produced by the random code generator 77. Shortly before the transmission of the third and fourth byte by an addressed function module 11 their contents are loaded in parallel by the random code generator 77 starting via bus 77a, then bus multiplexer 70 and bus 70a into the shift register 69 and are thereupon carried sequentially via the serial output of said shift register 69 and via the output release gate 84 which is released during a reading cycle as the third and fourth byte to the conductor 36 and thereby also to the conductor 32. If several function modules 11 can erroneously be reached at one and the same module address, the control module 10 recognizes this because several logic values "1" are contained in the third and/or fourth byte of the received telegram instead of only one single logic value "1".

A module information telegram on the other hand contains information on the addressed function module 11 which are set at the hardware level in the module information encoder 78 and are loaded in parallel into the shift register 69 shortly before the transmission of the third and fourth byte via bus 78a, bus multiplexer 70 and bus 78a to be then transmitted sequentially to the conductors 36 and 32, similarly as the address polling telegram. In the third byte an information concerning the structure and/or the input and output configuration of the pin occupation of the addressed function module 11 for example is given, while an information on the type of an integrated LSI (large scale integrated) circuit printed in the addressed function module 11 is given in the fourth bit.

The bits of an actual data telegram which is to be transmitted as third and fourth byte during a read cycle from the function module 11 to the control module 10 reach the interface circuit 25 of the addressed function module 11 coming from the output circuit 44 and going via the input bus 85 and the input filter 79 where they are stored temporarily bit by bit to be loaded in parallel later, shortly before transmission, via bus 79a, bus multiplexer 70 and bus 70a into the shift register 69 from which they are transmitted sequentially to the conductors 36 and 32, similar to the address polling telegram and the module information telegram.

If the control module 10 informs the function module 11 by means of the function byte on the other hand that a writing cycle applies, this function module 11 awaits the third and fourth bytes of the telegram which are transmitted by the control module 10 and pushes them upon receipt via conductor 35 sequentially into the shift register 69 from which they are loaded in parallel and byte by byte first into the buffer memory 75 and then into the output register 76, to be then transmitted via the output bus 86 to the output circuit 44.

Figure 10:
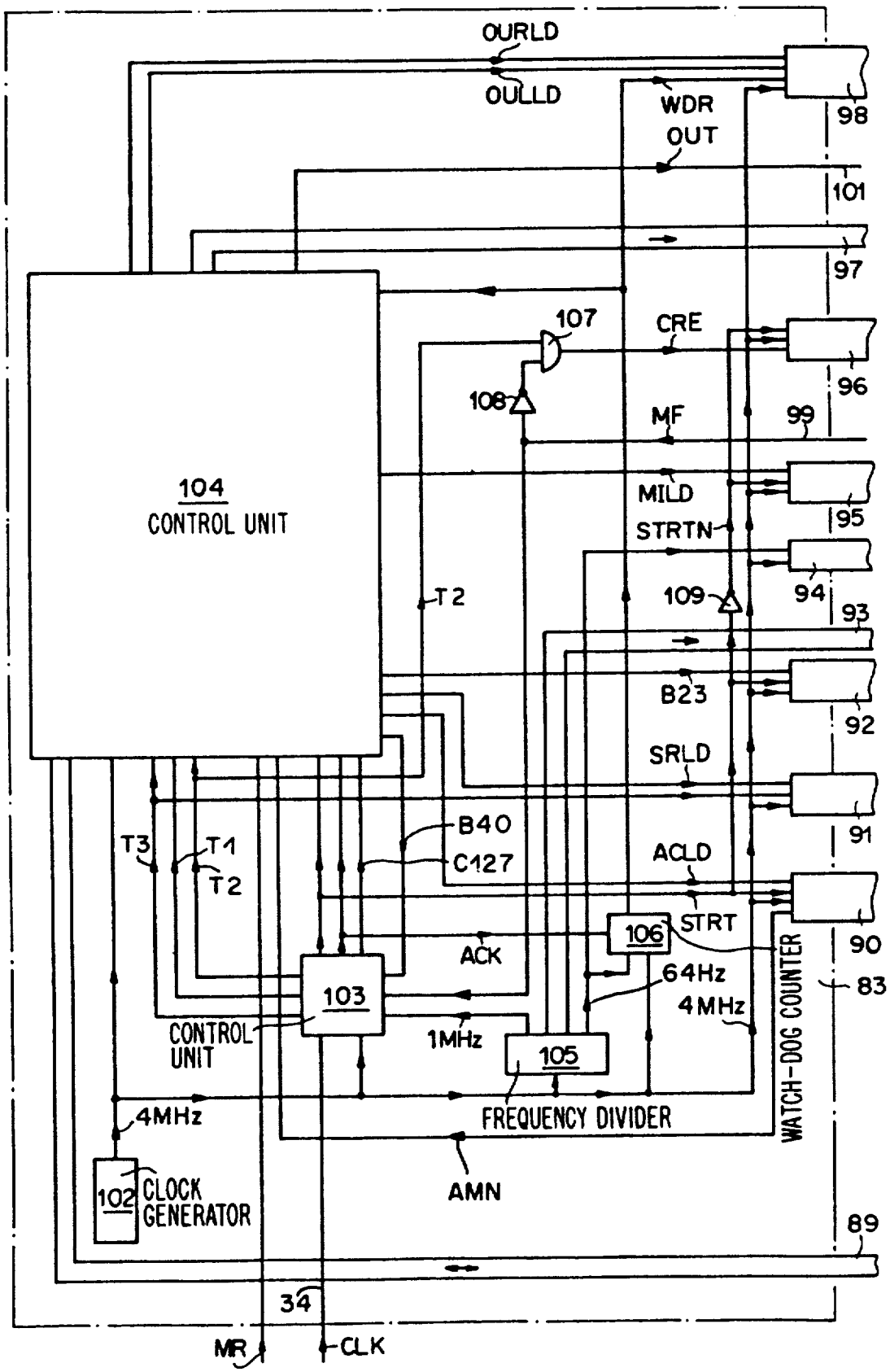
FIG. 10 shows a block diagram of a control device.

The control device 83 shown in FIG. 10 comprises a clock generator 102, a first control unit 103, a second control unit 104, a frequency divider 105, a watch-dog counter 106 an AND gate 107 and two invertors 108 and 109. The clock generator 102 produces a preferably rectangular clock signal with a frequency of 4 MHz, for instance, and which shall be called the 4-MHz clock signal hereinafter. This 4-MHz clock signal is transmitted via a cable connection to a clock input of each of the components 103, 104, 105 and 106 as well as to a first conductor of each of the control busses 90, 91, 92, 94, 95, 96 and 98. The clock signal CLK coming from the control module 10 reaches via conductor 34 a second clock input of the first control unit 103 which is provided with six outputs at each of which a signal T1, T2, T3, STRT (START), ACK (ACKNOWLEDGE) and C127 appears. Each of these six outputs of the control unit 103 is carried to a control input of the second control unit 104. The frequency divider 105 has the control bus 93 as an output bus as well as an additional two single-pole outputs at which a 1-MHz clock signal or a 64-Hz clock signal appears. The 1-MHz clock signal is carried via a conductor to a third clock input of the control unit 103 while the 64-Hz clock signal supplies a first input of the watch-dog counter 106 as well as a second conductor of the control bus 94. The ACK signal coming from the control unit 103 reaches a second input of the watch-dog counter 106 whose output, at which a WDR signal appears, is linked with an additional input of the control unit 104 and a second conductor of the control bus 98. The control bus 89 is also carried to a bus connection of the control unit 104 which has eight single-pole outputs at each of which a signal B40, ACLD, ARLD, B23, MILD, OUT, OULLD and OURLD appears. The output with the B40 signal is connected to an additional input of the control unit 103 while the outputs with the ACLD, SRLD, B23 and MILD signals are each connected to a second conductor of the control bus 90 or 91 or 92 or 95. The output with the OUT signal is carried to the cable connection 101 while the outputs with the OULLD and OURLD signals are connected to the third or fourth conductor of the control bus 98. The conductor on which the MR signal occurs is connected to an additional input of the control unit 104. The control bus 90 has four conductors. A signal AMN occurs at the third of these conductors and is carried to a last input of the control unit 104 while the STRT signal coming from the control unit 103 supplies the fourth conductor of the control bus. The control bus 91 has three conductors of which the third is supplied with the signal T3 coming from the control unit 103. The control bus 92 has three conductors of which the third is supplied by the STRT signal which is also carried to the input of the invertor 109 whose output supplies a third conductor of the control bus 95 or a second conductor of the control bus 96 with a STRTN signal. An MF signal occurs on the input conductor 99 of the control device 83 and is carried to a last input of the control unit 103 as well as to an input of the invertor 108. The output of the invertor 108 is connected to a first input of the AND gate 107 whose output, at which a CRE signal occurs, is carried to a third conductor of the control bus 96. The T2 signal comes from the control unit 103 and supplies a second input of the AND gate.

A periodic rectangular 4-MHz clock signal is produced in the clock generator 102 which is preferably a quartz-stabilized oscillator. The 4-MHz clock signal is divided binarily in the frequency divider 105 which comprises preferably of a 16-bit counter so that a rectangular periodic 1-MHz clock signal and a rectangular 64-Hz clock signal appear at the outputs of the frequency divider 105. The inverting Q-outputs of the four lowest bits of the frequency divider 105 constitute the control bus 93 through which a quasi 4-bit random number value is transmitted to the random code generator 77 (see FIG. 9).

The watchdog counter 106 can comprise for instance of a synchronous 9-bit counter which can be reset to zero and which counts the periodic rectangular impulses of the 64-Hz clock signal. When $2^9$ impulses of the 64-Hz clock signal reach the input of the watchdog counter 106, i.e. after a period of 4 seconds, without the watchdog counter 106 having first been reset to zero by the ACK signal, a logic value "1" appears at the Q output of the eighth bit of the watchdog counter 106 for a period of 250 ns, representing a WDR signal which simultaneously resets the watchdog counter 106 to zero via a feedback at the reset input of said watchdog counter 106. The logic value "1" of the WDR signal indicates that no valid telegram confirmed by an ACK signal has reached the corresponding function module 11. The watchdog counter 106 is set back to zero by every ACK signal and then again begins to count.

Figure 11:
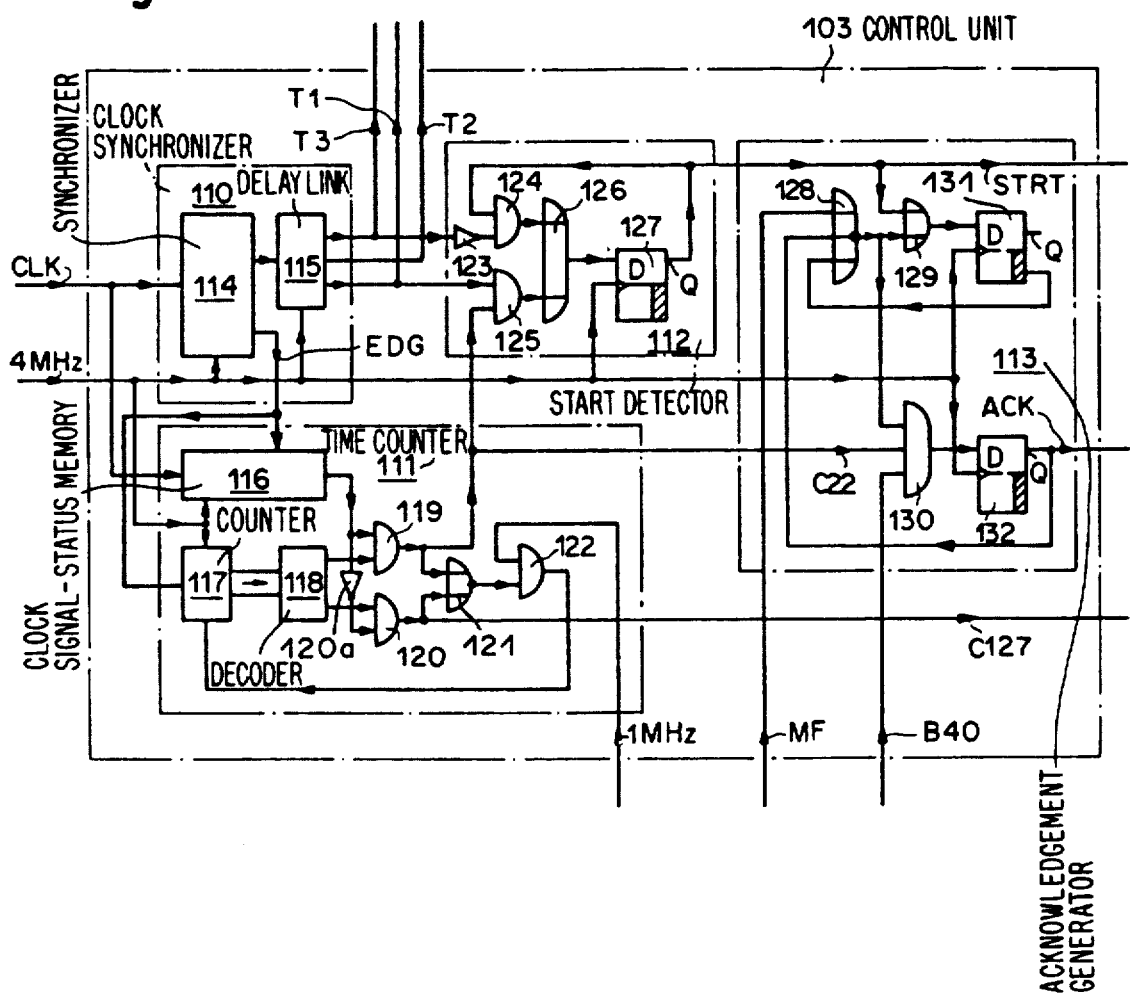
FIG. 11 shows a block diagram of a first control unit of the control device.

The control unit 103 shown in FIG. 11 comprises a clock synchronizer 110, a time counter 111, a start detector 112 and an acknowledgment generator 113. The clock synchronizer 110 in turn comprises a synchronizer 114 and a delay link 115. The time counter 111 contains a clock signal-status memory 116, a counter 117, a decoder 118, two AND gates 119 and 120, an invertor 120a, a NOR gate 121 and an AND gate 122. The start detector 112 comprises an invertor 123, two AND gates 124 and 125, one OR gate 126 and a flipflop 127. The acknowledgment generator 113 contains a NOR gate 128, an OR gate 129 and an AND gate 130 and two flipflops 131 and 132.

The input of the control unit 103 at which the 4 MHz clock signal appears is carried to the clock input of the synchronizer 114, of the delay link 115, of the clock signal-status memory 116 and of the counter 117 as well as of the flipflops 127, 131 and 132. The input of the control unit 103 at which the clock signal CLK occurs is connected to a second clock input of the synchronizer 114 and to one of the clock signal-status memory 116. A first output of the synchronizer 114 at which an EDG (edge) signal appears is carried to an additional input of the clock signal-status memory 116 and to one of the counter 117 while its second output is connected to an input of the delay link 115 which has three outputs constituting three outputs of the control unit 103 at each of which a signal T1, T2 or T3 appears. An output of the clock signal-status memory 116 is carried to a first input of the AND gate 119 as well as via invertor 120a to a first input of the AND gate 120. The parallel output of the counter 117 is connected via a bus to a bus input of the decoder 118, the first output of which is carried to a second input of the AND gate 120. The output of the AND gate 119 at which a signal C22 appears is connected to a first input of the NOR gate 121, to one of the AND gate 125 and to one of the AND gate 130 while the output of the AND gate 120 at which the signal C127 appears is carried to a second input of NOR gate 121 as well as to an output of the control unit 103. The output of the NOR gate 121 is connected to a first input of the AND gate 122, the second input of which is carried to the input of the control unit 103 at which the 1-MHz clock signal appears and the output of which is connected to a release input of the counter 117. The output of the delay link 115 at which the T3 signal appears is carried via invertor 123 to a first input of the AND gate 124, the output of which is connected to a first input of the OR gate 126. The output of the delay link 115 at which the T1 signal appears is carried to a second input of the AND gate 125, the output of which is connected to a second input of the OR gate 126, whereby its output is in turn carried to the D input of the flipflop 127. A STRT signal which is carried to a second input of the AND gate 124, to a first input of the OR gate 129 and to an output of the control unit 103 appears at the Q output of the flipflop 127. The two inputs of the control unit 103 at which the signals MF and B40 appear are connected to a first input of the NOR gate 128 or to a second input of the AND gate 130. The output of the NOR gate 128 supplies a second input of the OR gate 129 and a third input of the AND gate 130. The output of the OR gate 129 is carried to the D-input of the flipflop 131, the inverted Q-output of which is connected to a second input of the NOR gate 128. The output of the AND gate 130 is carried to the D-input of the flipflop 132, the Q-output of which is connected to a third input of the NOR gate 128 and constitutes at the same time the output of the control unit 103 at which the ACK signal appears.

The time counter 111 measures the duration of each impulse and of each impulse gap of the non-synchronized CLK clock signal CLK. For that purpose the CLK clock signal is stored in the clock signal-status memory 116 the output of which releases the AND gate 119 if an impulse is present and the AND gate 120 via invertor 120a if an impulse gap is present. The structure and operation of the clock signal-status memory 116 shall be explained in greater detail in the description of FIG. 22. To measure the duration of the impulse and of the impulse gap of the CLK clock signal the clock signal-status memory 116 and the counter 117 are set back to zero by the EDG signal coming from an output of the synchronizer 114 at the beginning of each impulse and of each impulse gap of the clock signal, i.e. at the time of each edge of the CLK clock signal. The counter 117 which can be 7-bit counter then begins to count the impulses of the 1-MHz clock signal which reach it via the normally released AND gate 122. The counted value of the counter 117 is decoded continuously by means of the decoder 118.

Each transmitted telegram starts with a start impulse in the CLK clock signal the duration of which, also called "idle time", is at least 22 μs. The starting impulse is an impulse gap in the control module and is an impulse in the function module 11 because of its inversion in the transmission circuit 23 of the control module 10 (see FIG. 5). If an impulse of the CLK clock signal has a duration of at least 22 μs at the input of the time counter 111, the counter 117 counts at least 22 periods of 1 μs each of the 1-MHz clock signal and reaches at least the counted value 22 which represents a start signal for the reception of a telegram to the function module 11. For that purpose the decoded counted value 22 of the counter 117 releases the AND gate 119 so that a logic value "1" on the one hand appears as a C22 signal at an output of the time counter 111 and thereby appears at one input each of the AND gates 125 and 130 and is locked on the other hand via the NOR gate 121 and the AND gate 122 so that no 1-MHz clock impulse can reach the counter 117 any longer and so that the latter stops at the counted value 22 until it is again reset by the EDG signal when the next edge of the CLK clock signal appears which, as an impulse-end edge, is a trailing edge. At that moment an impulse of the T1 signal also appears coming from an output of the delay link 115 at an input of the AND gate 125 of the start detector 112, so that the C22 signal reaches the flipflop 127 in which its logic value "1" is stored by the 4 MHz clock signal via the OR gate 126, whereby the flipflop 127 is kept via the AND gate 124 and via the OR gate 126 in that logic state until 500 ns later the T3 signal coming from the delay link 115 via the invertor 123 briefly locks the AND gate so that the 4 MHz clock signal loads a logic value "0" into the flipflop 127 and thereby resets the latter back to zero. At the output of the flipflop 127 and thereby of the start detector 112 a continuous impulse lasting 500 ns thus appears as a STRT signal starting the reception of the telegram in the function module 11 when a start impulse is present in the CLK clock impulse. Every telegram transmitted ends with stop impulse in the CLK clock signal the duration of which, also called "timeout" period, is 127 μs. The stop impulse is an impulse in the control module 10 and, because of its inversion in the transmission circuit 23 of the control module (see FIG. 5), an impulse gap in the function module 11. If an impulse gap of the clock signal CLK at the input of a time counter 111 has a duration of at least 127 μs, the counter 117 counts at least 127 periods of 1 μs each of the 1-MHz clock signals and reaches at least the counted value 127. The decoded counted value 127 of the counter 117 releases the AND gate so that a logic value "1" appears on the one hand in form of a C127 signal at an output of the time counter 111 and so that the AND gate 122 is locked via the NOR gate 121 on the other hand so that no 1-MHz clock impulses any longer reach the counter 117 and so that the latter stops at the counted value 127 until it is again reset by the EDG signal when the next edge of the CLK clock signal appears.

Following the start impulse and before the stop impulse the counter 117 does not normally reach the counted value 22 or 127, so that no logic value "1" appears at the outputs of the time counter 111 in that case. If the impulse of the CLK clock signal at the input of the time counter 111 lasts too long for any reason, a start impulse is simulated. The telegram is interrupted immediately and a new start of the telegram is initiated.

When the STRT signal assumes the logic value "1" at the fulfillment of the start conditions, the flipflop 131 of the acknowledgment generator 113 is set via the OR gate 129 and thereby the AND gate 130 is released via the NOR gate 128. This means that the corresponding function module 11 expects to receive an acknowledgment signal. When a monitoring error has been detected by the monitor-error detector 82 of the interface circuit 25 (see FIG. 9), a logic value "1" appears as an MF signal coming from the monitor-error detector 82 and going via the cable connection 99 at an input of the control device 83 and of the control unit 103. If a monitoring error exists the MF signal resets the flipflop 131 via the NOR gate 128 and the OR gate 129 and no acknowledgment signal of a correct telegram transmission is issued until a new telegram start takes place. If no monitoring error exists, the flipflop 132 is set at the end of the telegram by means of the B40 signal via the AND gate 130 if the C22 signal has a logic value "1", i.e. if the impulse gap at the end of the telegram has at least the length of a start impulse. AT the Q output of the flipflop 132 a logic value "1" then appears as an ACK acknowledgement signal of a correct telegram transmission. The ACK acknowledgment signal also supplies an input of the AND gate 140 of the control unit 104 (see FIG. 12).

Figure 12:
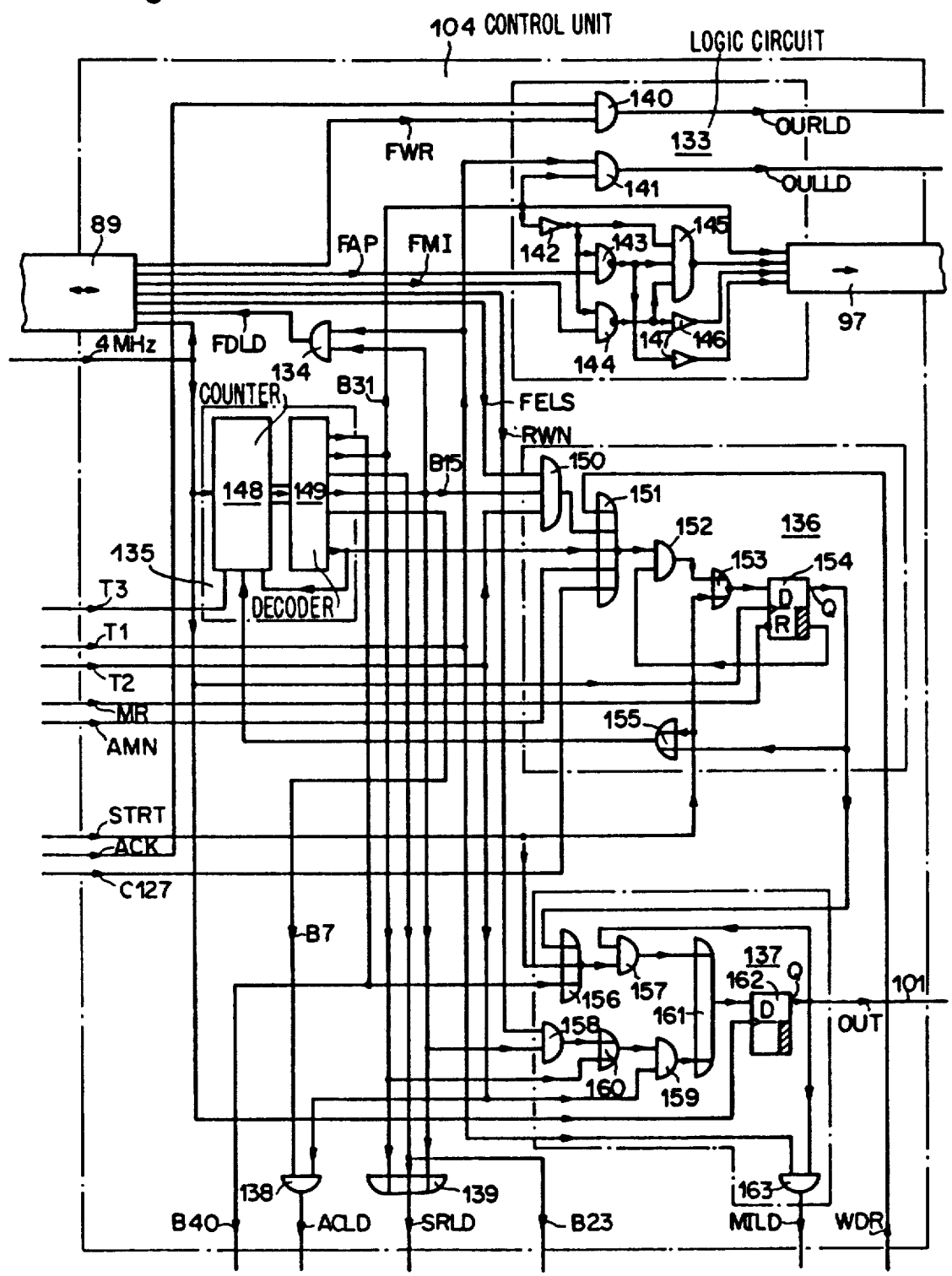
FIG. 12 shows a block diagram of a second control unit of the control device.
Figure 13:
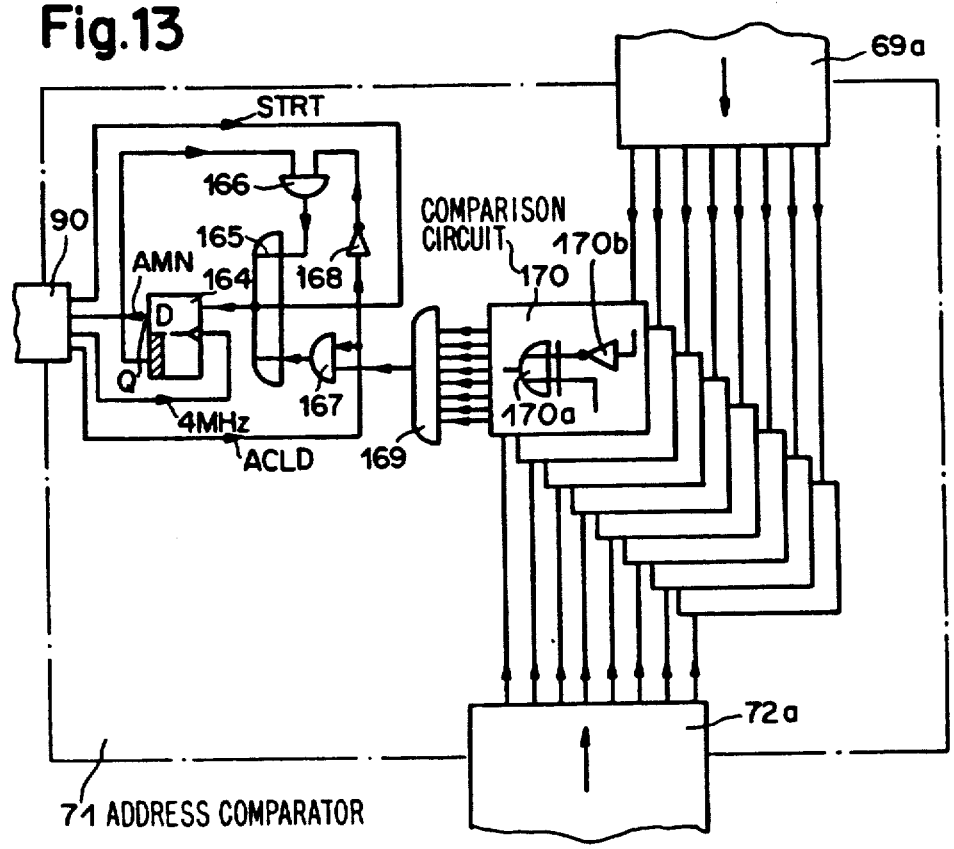
FIG. 13 shows a diagram of an address comparator.

The control unit 104 shown in FIG. 12 comprises a logic circuit 133, an AND gate 134, a bit counter 135, a NOP reset circuit 136 (NOP = not operational), a transmission release circuit 137, an AND gate 138 and an OR gate 139. The logic circuit 133 contains two AND gates 140 and 141, an invertor 142, two NAND gates 143 and 144, a NAND gate 145 and two invertors 146 and 147. The bit counter 135 contains a counter 148 and a decoder 149. The NOP reset circuit 136 contains an AND gate 150, a NOR gate 151, an AND gate 152, a NOR gate 153, a flipflop 154 and an OR gate 155. The transmission release circuit 137 comprises a NOR gate 156, three AND gates 157, 158 and 159, two OR gates 160 and 161, a flipflop 162 and an AND gate 163.

The control unit 104 is supplied via the control bus 89 with five signals, FWR, FAP, FMI, RWN and FELS. Furthermore there are ten input signals, i.e. the 4 MHz clock signal and the signals T1, T2, T3, MR, AMN, STRT, ACK, C127 and WDR as well as, in addition to the output signals present in the control busses 89 and 97, another eight output signals, i.e. OURLD, OULLD, OUT, MILD, B23, SRLD, ACLD and B40, each of which appears at a single-pole output of the control unit 104. The 4 MHz clock signal supplies a sixth conductor of the control bus 89, a clock input of the counter 148 as well as the clock inputs of the flipflops 154 and 162. The ACK signal supplies a first input and the FWR signal a second input each of the AND gate 140 whose output constitutes the output of the control unit 104 at which the OURLD signal appears. The T1 signal supplies a first input of each of the AND gates 141, 134 and 163. The T2 signal supplies a first input of each of the AND gates 150, 159 and 138. The T3 signal supplies a first control input of the counter 148 whose parallel output is carried to a bus input of the decoder 149 which in turn has five outputs at each of which a signal B7, B15, B23, B31 and B40 appears, as well as a sixth output which is carried to a second control input of the counter 148 and to a first input of the NOR gate 151. The B31 signal supplies a second input of the AND gate 141, a first conductor of the control bus 97, a first input of each of the OR gates 160 and 139 as well as via invertor 142 a first input of each of the NAND gates 145, 143 and 144. The output of the AND gate 141 constitutes the output of the control unit 104 at which the OULLD signal appears. The FAP and FMI signals each supply a second input of the NAND gate 143 or 144. The output of the NAND gate 143 is carried to a second input of the NAND gate 145 and via invertor 147 to a second conductor of the control bus 97. The output of the NAND gate 144 is connected to a third input of the NAND gate 145 and, via invertor 146, to a third conductor of the control bus 97. The output of the NAND gate 145 in turn supplies a fourth conductor of the control bus 97. The B15 signal supplies on the one hand a second input of each of the AND gates 134 and 150 as well as of the OR gate 139 and on the other hand a first input of the AND gate 139. The output of the AND gate 134 at which an FDLD signal appears, is carried to a seventh conductor of the control bus 89. The FELS signal supplies a third input of the AND gate 150 the output of which is carried to a second input of the NOR gate 151. Each of the signals AMN, C127 and WDR supplies an additional input of the NOR gate 151, the output of which is connected to a first input of the AND gate 152. The output of the AND gate 152 is carried to a first input of the NOR gate 153, the output of which is connected to the D input of the flipflop 154. The STRT signal supplies a second input of the NOR gate 153 and a first input each of the NOR gates 156 and of the OR gate 155, while the MR signal supplies an inverting reset input of the flipflop 154. The inverting Q output of the flipflop 154 is carried to a second input of the AND gate 152 and its Q output to a second input each of the OR gate 155 and of the NOR gate 156. The B40 signal supplies a third input of the NOR gate 156 and an output of the control unit 104. The output of the NOR gate 156 is connected to a first input of the AND gate 157, the output of which is carried to a first input of the OR gate 161. The output of the OR gate 161 is connected to the D input of the flipflop 162 while its Q output, at which the OUT signal appears, is carried to a second input each of the AND gates 157 and 163 as well as to the cable connection 101 of the output of the control unit 104. At the output of the AND gate 163 the MILD signal appears and supplies an additional output of the control unit 104. The RWN signal supplies a second input of the AND gate 158, the output of which is connected to a second input of the OR gate 160. The output of the OR gate 160 is carried to a second input of the AND gate 159, the output of which is in turn connected to a second input of the OR gate 161. The B23 signal supplies a third input of the OR gate 139 and an additional output of the control unit 104 while the output of the OR gate 139, at which the SRLD signal appears, constitutes another output of the control unit 104. The B7 signal supplies a second input of the AND gate 138 the output of which, at which the ACLD signal appears, constitutes a last output of the control unit 104. The output of the OR gate 155 is connected to a third control input of the counter 148.

The counter 148 of the bit counter 135 can be a synchronous 6-bit counter the counted value of which is decoded continuously in the downstream decoder 149. Since the bit frequency of the telegram and the frequency of the CLK clock signal are of equal magnitude and have a value of nearly 62.5 kHz and since the frequency of the T3 signal, the impulses of which are counted by the counter 148, is equal to this bit frequency, the counter 148 counts the number of bits of the telegram. For that purpose the STRT output signal of the start detector 112 which goes to the counter 148 via the OR gate 155 resets the counter 148 to zero upon recognizing the starting conditions, and the latter then counts the impulses of the T3 signal and thereby the bit impulses. The decoder 149 decodes the counted values 7, 15, 23, 31, 40 and greater than 40. The output signals B7, B15, B23, B31 and B40 accordingly take on the logic value "1" after the 9th, 16th, 24th, 32nd and 41st telegram bit, i.e. at the end of each byte, and this indicates the presence of the corresponding byte end. At the same time the decoder 149 is also provided with an overflow output at which a logic value "1" appears if more than 41 impulses of the T3 signal are counted by the counter 148. This logic value "1" is carried to an input of the counter 148 and stops the counting process within same by denying access to the first step of the counter 148 by means of an AND gate. Simultaneously logic value "1" also reaches an input of the NOR gate 151 of the NOP reset circuit 136. The counting process of the counter 148 remains interrupted until a new impulse of the STRT signal again sets the counter 148 back to zero.

The NOP reset circuit 136 causes a general reset to zero of the corresponding function module 11 through a reset of the counter 148 via the OR gate 155 when a logic value "1" appears at its output. This takes place when one of the following events occurs:

1. The module address received and contained in the first byte does not agree with the preset address of the function module 11 involved. In that case the AMN signal which is produced in the address comparator 71 and reaches the control unit 104 and the control device 83 via the control bus 90 has a logic value "1".
2. The second byte decoded in the addressed function module 11 does not contain any valid function of the function module 11. In that case the FELS signal which comes from an output of the function decoder 73 and reaches the control device 83 and the control unit 104 via control bus 89 has a logic value "1" at the end of the second byte, i.e. when the signals B15 and T2 both have a logic value of "1". The output of the AND gate 150 of the NOP reset circuit 136 then also has a logic value "1".
3. The timeout period has run out, i.e. the C127 signal has a logic value "1".
4. More than 40 telegram bits have been transmitted, i.e. the overflow output signal of the decoder 149 has a logic value "1".
5. The time of the watchdog counter 106 has run out, i.e. its output signal WDR has a logic value "1".
6. When a general reset (master reset) is initiated. In that case the MR signal has a logic value "1".

Upon initiation of a general reset (master reset) the flipflop 154 is set at a logic value "1". When a starting condition has been met the STRT signal resets the flipflop 154 to zero via the NOR gate 153. When one of the first five above-mentioned events occurs, a logic value "0" appears at the output of the NOR gate 151 and locks the AND gate 152 so that a logic value "1" appears at the D input of the flipflop 154 and is then loaded into the latter by the 4 MHz clock signal. A logic value "1" appears at the output of the transmission release circuit 137 when the addressed function module 11 is to transmit. The flipflop 162 is always set at the end of a telegram because the last byte of a telegram, i.e. the CRC byte, is always provided by the function module. The flipflop 162 which has a latch in form of the AND gate 157 and the OR gate 161, is reset to zero by the STRT signal, by the B40 signal corresponding to a 41st T3 impulse or by the output signal of the NOP reset circuit 136 via the NOR gate 156. The flipflop 162 is set on the one hand after receipt of a second byte, i.e. when the B15 signal has a logic value "1" when the decoded function is a read function, i.e. when the RWN signal coming from the function decoder 73 reaches the control device 83 and the control unit 104 via control bus 89. In other words, when a logic value "1" appears at the output of the AND gate 158 the flipflop 162 is set by the 4 MHz clock signal. On the other hand the flipflop 162 is also set via the OR gate 160 each time the fifth byte of the telegram must be sent, i.e. when the B31 signal has a logic value "1". This occurs only when the T2 signal has a logic value "1" since it is only then that the AND gate 159 is released The OUT signal at the Q output of the flipflop 162 releases via cable connection 101 the output release gate 84 of the interface circuit 25 (see FIG. 9) and the AND gate 217 in the multiplexer 81 (see FIG. 19), causing among other things the serial output bits of the shift register 69 to reach the conductor 36 (see FIG. 9). At the same time the OUT signal reaches the monitor-error detector 82 (see FIG. 9) in form of a MILD signal via the AND gate 163 (see FIG. 12) and via the control bus 95 (see FIG. 10) when the T1 signal has a logic value "1".

After the second, third and fourth byte, i.e. when one of the signals B15, B23 or B31 has a logic value "1", a logic value "1" appears at the output of the OR gate 139 as a SRLD signal (shift register: load) which reaches the shift register 69 (see FIG. 9) via the control bus 91 (see FIG. 10) together with the T3 signal. The T3 signal causes the shift register 69 to be released while a logic value "0" of the SRLD signal signifies shifting and a logic value "1" loading of the shift register 69.

Each function module 11 is assigned an address with several bits. The address comparator 71 shown in FIG. 13 contains a flipflop 164, a NOR gate 165, two AND gates 166 and 167, one invertor 168, one AND gate 169 and per bit of the address a comparison circuit 170, each comprising an exclusive-OR gate 170a and of an invertor 170b, said invertor 170b being upstream of the first input of the exclusive-OR gate 170a. The address has preferably eight bits. In that case there are eight comparison circuits 170 and the two input busses 69a and 72a of the address comparator 71 have eight bus conductors each in that case. One bus conductor of the bus 69 a is connected via an invertor 170b to a first input of each of the eight exclusive-OR gates 170a while a second input of each of the eight exclusive-OR gates 170a is connected to a bus conductor of bus 72a. The output of each of the eight exclusive-OR gates 170a and thereby the comparison circuit 170 is carried to a an input of the AND gate 169 which has eight inputs. Three signals, i.e. the 4 MHz clock signal as well as the STRT and ACLD signals reach the address comparator 71 via three conductors in the control bus 90. The ACLD signal supplies a first input of the AND gate 167 as well as a first input of the AND gate 166 via the invertor 168. The STRT signal supplies a first input of the NOR gate 165 and the 4 MHz clock signal supplies the clock input of the flipflop 164. The output of the AND gate 166 is connected to a second input of the NOR gate 165 and the output of the AND gate 169 is connected to a second input of the AND gate 167. The output of the latter is carried to a third input of the NOR gate 165. The output of the NOR gate 165 is connected to the D input of the flipflop 164, the Q-output of which, at which the AMN signal appears, is carried to a fourth conductor of the control bus 90 while the inverted Q output of the flipflop 164 is connected to a second input of the AND gate 166.

When the signals B7 and T2 assume a logic value "1" at the end of a first byte a logic value "1" as the ACLD signal (address comparator: load) appears via the AND gate 138 (see FIG. 12) and the control bus 90 (see FIG. 10) at one input of the AND gate 167 of the address comparator 71 (see FIG. 13) and releases it. The address received as first byte appears via bus 69a at the first inputs of the comparison circuits 170 while the module address of the function module 11 which is set in hardware appears via bus 72a at the second inputs of the comparison circuit 170. If two identically numbered bits of the two addresses are different, the output of the AND gate 169 has a logic value "0". The latter is inverted in the NOR gate 165 and the inverted value is then stored in the flipflop 164 by means of the 4 MHz clock signal to appear as an AMN signal at an output bus conductor of the control bus 90. The AND gate 166 is used as a locking circuit of the flipflop 164 for the case that both addresses should be identical, so that a logic value "0" must be stored in the flipflop 164. The ACLD signal cancels this locking function by locking the AND gate 166 via invertor 168. At the same time the output signal of the AND gate 169 is read by means of the AND gate 167.

Figure 14:
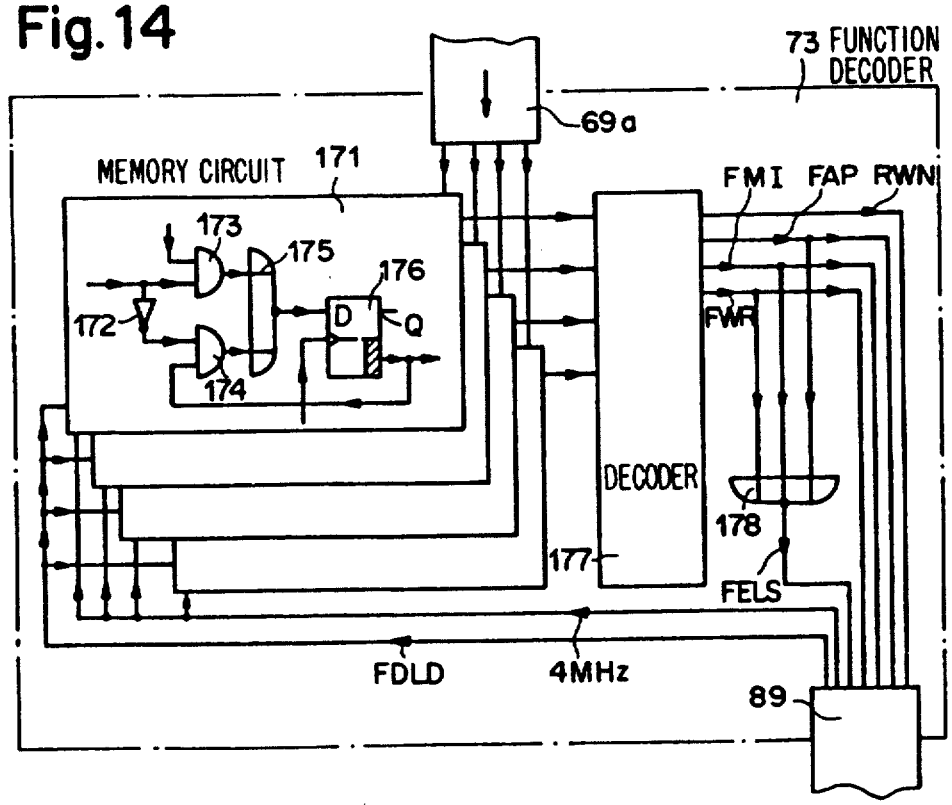
FIG. 14 shows a diagram of a function decoder.

The function decoder 73 shown in FIG. 14 contains among other elements a memory circuit 171 per bit of a function byte which can have four bits, for example. In that case at least four of the eight bus conductors of the bus 69a are carried in form of input conductors to the function decoder 73. Each memory circuit 171 contains an invertor 172, two AND gates 173 and 174, one NOR gate 175 and one flipflop 176. The function decoder 73 furthermore contains a decoder 177 and a NOR gate 178.

The function decoder 73 is supplied via two bus conductors of the control bus 89 with the FDLD signal and the 4 MHz clock signal. The latter supplies the clock inputs of all the flipflops 176 contained in the memory circuit 171. The FDLD signal supplies the inputs of all the memory circuits 171. Within the latter their input is carried to a first input of the AND gate 173 and via the invertor 172 to a first input of the AND gate 174. Each of the outputs of the AND gate 173 and 174 is connected to an input of the NOR gate 175 the output of which is carried to the D input of the flipflop 176. The inverted Q output of the flipflop 176 is connected on the one hand to a second input of the AND gate 174 and constitutes on the other hand the output of the memory circuit 171. Each bus conductor of bus 69a used for the function byte is connected to a second input of the AND gate 173 of its corresponding memory circuit 171. Each of the outputs of the memory circuits 171 is connected to an input of the decoder 177 which has four outputs at each of which one of the four signals FWR, FMI, FAP and RWN appears. Each of the three outputs of the decoder 177 at which the signals FWR, FMI and FAP appear is connected to an input of the NOR gate 178 at the output of which the FELS signal appears. Each the signals FWR, FMI, FAP, RWN and FELS is carried to a bus conductor of the control bus 89 which thus has seven bus conductors.

· If the signals B15 and T1 assume a logic value '1' at the end of the second byte in an addressed function module 11, a logic value "1" appears as a FDLD (function decoder: load) signal via the AND gate 134 (see FIG. 12) and the control bus 89 (see FIGS. 10 and 9) at an input of the memory circuit 171 of the function decoder 73 (see FIG. 14). The bits of the second telegram byte, which are thus given a meaning, are stored at that moment in the flipflop 176 of the memory storage 171 by means of the 4 MHz clock signal following the cancellation, by the FDLD signal and via invertor 172, of the locking of the flipflop 176 which has in the meantime been locked by the AND gate 174. The second telegram byte stored in the memory circuit 171 is decoded by means of the decoder 177 and a logic value "1" appears as a signal FAP, FMI, FWR or RWN at an output of the function decoder 73 when the second telegram byte indicates an "address polling" function, module information, write cycle or data direction. If the second byte does not contain any valid function indication, a logic value "1" appears at the output of the NOR gate 178 as a FELS signal, and thereby at an additional output of the function decoder 73. The signals FAP, FMI, FWR, RWN and FELS reach the control device 83 (see FIG. 9) and the control unit 104 (see FIG. 10) via the control bus 89.

In the control unit 104 (see FIG. 12) the FAP signal, whose logic value "1" demands an "address polling" telegram as the third and fourth byte, goes via the normally released NAND gate 143, via the invertor 147 and the control bus 97 to an input of the bus multiplexer 70 (see FIG. 9) which is connected within the latter to all the control inputs of those bus drivers which are assigned to the bus 77a of the random code generator 77.

Within the control unit 104 (see FIG. 12) the FMI signal, whose logic value "1" demands a module information telegram as the third and fourth byte, goes via the normally released NAND gate 144, via the invertor 146 and the control bus 97 to an additional input of the bus multiplexer 70 (see FIG. 9) which is connected within the latter to all the control inputs of those bus drivers which are assigned to the bus 78a of the module information coder 78.

The two signals FAP and FMI go in inverted form via the normally released NAND gates 143 and 144 to the nand gate 145 (see FIG. 12). If both the FAP and the FMI signal have a logic value "0" neither an address polling nor a module information telegram is demanded as the third and fourth byte, and the third and fourth bytes in this case are always actual data bytes whose bits go in a read cycle via the input bus 85 and the input filter 79 to the bus multiplexer 70 (see FIG. 9). In this case a logic value "1" appears at the output of the NAND gate 145 and goes via the control bus 97 to an additional input of the bus multiplexer 70 (see FIG. 9) which is connected within the latter to all the control inputs of those bus drivers which are assigned to the bus 79a of the input filter 79.

In all three cases the NAND gates 143, 144 and 145 are locked at the end of the third byte by the B31 signal via invertor 142 since a that moment at the latest the contents of the fourth byte must already be loaded into the shift register via bus multiplexer 70. At the same time the logic value "1" of the B31 signal goes via the control bus 97 and reaches an additional input of the bus multiplexer 70 (see FIG. 9) which is connected within the latter to all the control inputs of those bus drivers which are assigned to the bus 80a of the CRC generator 80, thus preparing the loading process of the bits of the fifth telegram byte into the shift register 69.

Figure 15:
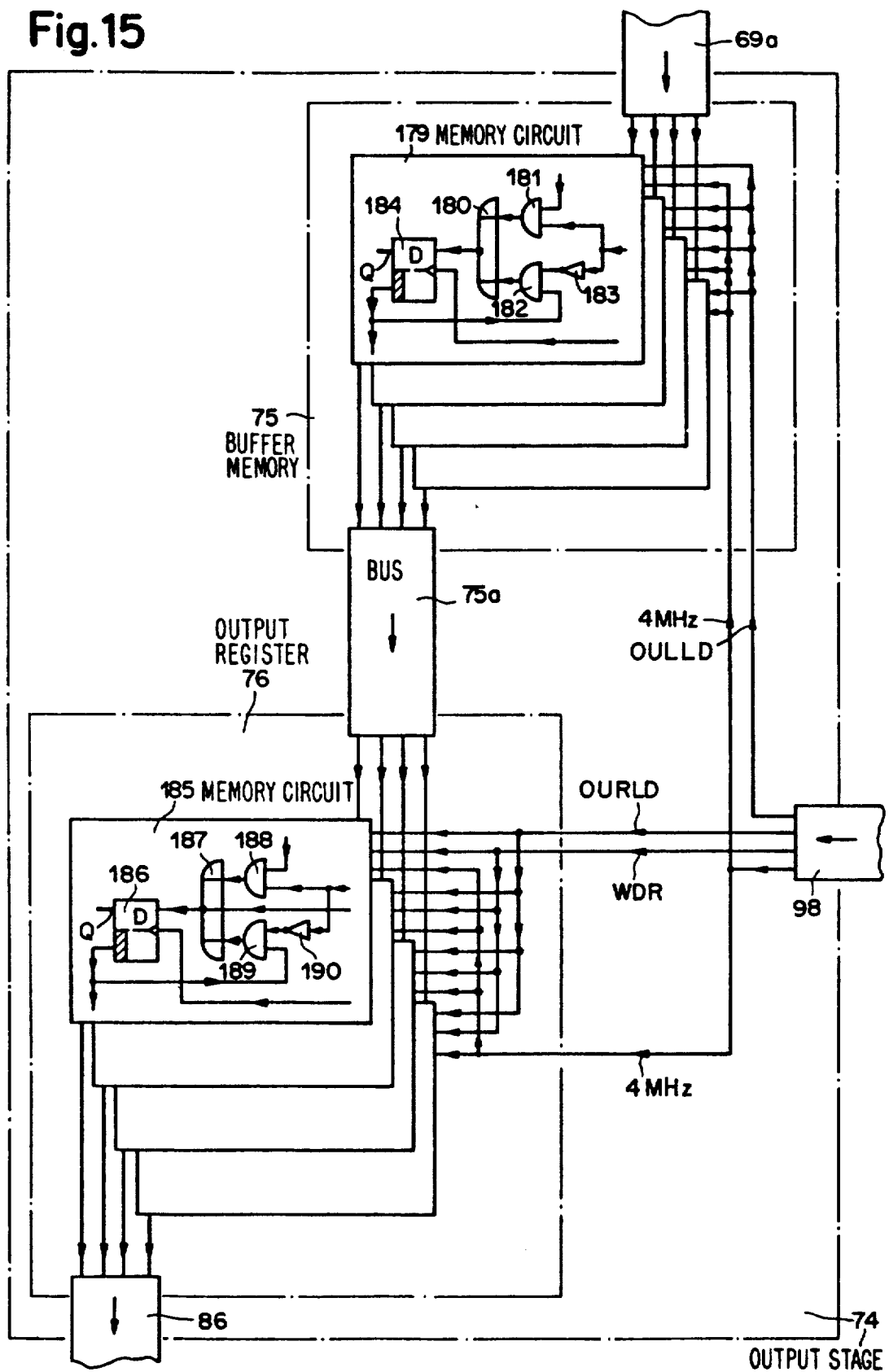
FIG. 15 shows a diagram of an output stage.

The output stage 74 shown in FIG. 15 comprises, as mentioned earlier, the buffer memory 75 and the downstream output register 76, both being connected to each other via a bus 75a. The buffer memory 75 is supplied with data via bus 69a which has eight bus conductors since all data bytes have preferably eight bits. The buffer memory 75 contains one memory circuit 179 per bit of the data byte, each of these memory circuits 179 consisting of a NOR gate 180 and two AND gates 181 and 182, of one invertor 183 and one flipflop 184.

The output register 76 contains one memory circuit 185 per bit of the data byte, each memory circuit 185 comprising a flipflop 186, a NOR gate 187 and two AND gates 188 and 189 as well as of an invertor 190. The memory circuits 171 (see FIG. 14) and 179 are of identical structure while the memory circuits 179 and 185 are of nearly identical structure, with the only difference that the NOR gate 180 has only two inputs while the NOR gate 187 has three inputs. Four signals, the 4 MHz clock signal as well as the signals OULLD OURLD and WDR reach the output stage 74 via the four bus conductors of the control bus 98. The 4 MHz clock signal supplies the clock inputs of all the flipflops 184 and 186 of the memory circuits 179 or 185. The OULLD signal supplies an input of all the memory circuits 179 while the OURLD and WDR signals supply all the first or all the second inputs of the memory circuit 185. The input of each memory circuit 179 is connected within the latter to a first input of the AND gate 181 and, via invertor 183, to a first input of the AND gate 182. One bus conductor of bus 69a is connected to a second input of the AND gate 181 of the corresponding memory circuit 179 while the inverting Q output of the flipflop 184 constitutes the output of the corresponding memory circuit 179. Each of the outputs of all the memory circuits 179 is connected to a bus conductor of the bus 75a and via same to a first input of the AND gate 188 of the corresponding memory circuit 185. The first input of each memory circuit 185 is connected within same to a second input of the AND gate 188 and, via invertor 190, to a first input of the AND gate 189. The second input of each memory circuit 185 is connected within same to the third input of the NOR gate 187. Each of the inverted Q outputs of the flipflop 186 of all the memory circuits 185 is connected a bus conductor of the output bus 86.

For the sake of simplification it is assumed below that actual data are transmitted only during the fourth byte from the control module 10 to the addressed function module 11 when a write cycle applies. If the signals T1 and B31 have a logic value "1" at the end of the fourth byte, a logic value "1" appears at the output of the AND gate 141 (see FIG. 12) as an OULLD (output latch: load) signal which reaches an input of the output stage 74 and of the buffer memory 75 via the control bus 98 (see FIGS. 10 and 9) and loads the bit values present in the shift register 69 (See FIG. 10) via bus 69a into the memory circuits 179 where they are stored in the flipflops 184. The latter are provided with a locking mechanism so that locking is achieved by means of the invertor 183 and the AND gate 182. These stored bit values appear via bus 75a at the bus input of the output register 76.

If the ACK signal has a logic value "1" at the end of the fifth telegram byte, i.e. if a correct telegram has been transmitted and the function byte has declared a write cycle, i.e. if the FWR signal has a logic value "1", a logic value "1" appears at the output of the AND gate 140 (see FIG. 12) as an OURLD (output register:load) signal, which signal reaches an input of the output stage 74 and of the output register 76 via control bus 98 (see FIGS. 10 and 9) and which loads the bit values buffer-stored in the buffer memory 75 via bus 75a into the memory circuit 185 of the output register 76 when the WDR signal of the watchdog counter has a logic value "0". These bit value are then stored in the flipflops 186 of the memory circuits 185. The latter have locking mechanisms which are realized by means of the invertor 190 and of the AND gate 189. The bit values stored in the output register 76 are directed via output bus 86 to the output circuit 44 of the function module 11 where they undergo further processing. If a logic value "1" appears as a WDR signal at one of the inputs of the output stage 74 and of the output register 76, said output register 76 is reset to zero via the NOR gate 187. The WDR signal reaches output stage 74 from the output of the watchdog counter 106 (see FIG. 10) and via the control bus 98.

Figure 16:
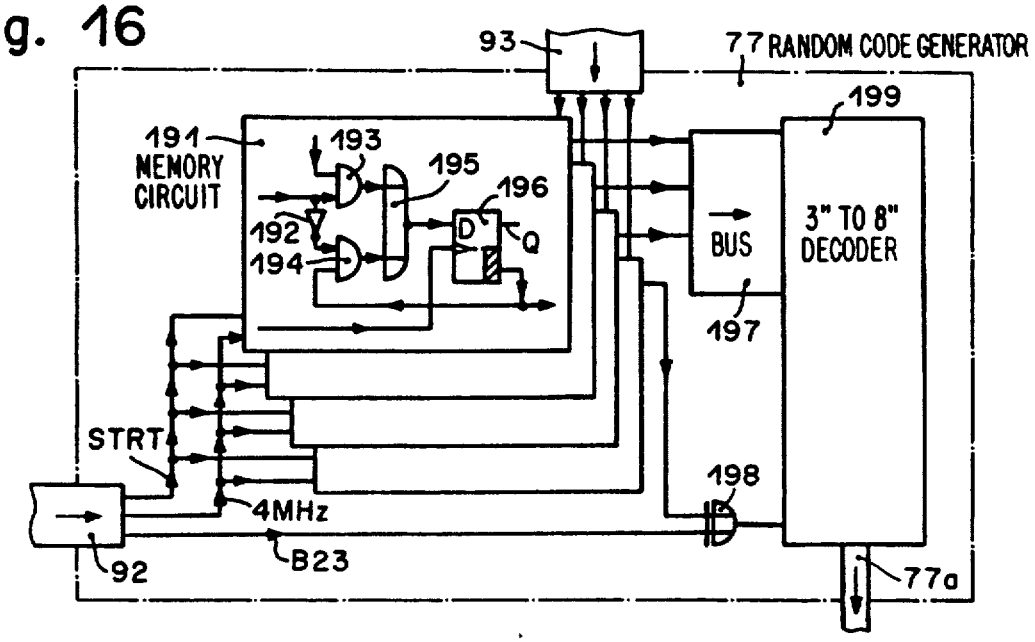

The random code generator 77 shown in FIG. 16 can be supplied via the bus conductors (e.g. four) of the control bus 93 with four random bits and via the three conductors of the control bus 92 with the 4-MHz clock signal and the signals STRT and B23. The random code generator 77 contains per bus conductor of the control bus 93 one memory circuit 191 comprising an invertor 192 and two AND gates 193 and 194, one NOR gate 195 and one flipflop 96. The memory circuit 191 is of identical structure as the memory circuits 171 and 179. The 4-MHz clock signal supplies the clock inputs of all the flipflops 196 while the STRT signal supplies one input of all the memory circuits 191. The input of each memory circuit 191 is carried within the latter to a first input of the AND gate 193 and via the invertor to a first input of the AND gate 194, while the inverted Q output of the flipflop 196 constitutes the output of the memory circuit 191. Each of the outputs of the memory circuits 191 of the three lowest bits is carried to a bus conductor of a bus 197. The random code generator 77 also contains an exclusive-OR gate 198 and a "3 to 8" decoder 199, the output of which constitutes the bus 77a which represents the output bus of the random code generator 77. The bus 197 constitutes the input bus of the "3 to 8" decoder while the output of the fourth memory circuit 191 in which the highest-value bit of the four random bits is stored is connected to a first input of the exclusive-OR gate 198 whose second input is supplied by the B23 signal and whose output is carried to an additional input of the "3 to 8" decoder 199.

Two bytes, i.e. the third and fourth byte of the telegram, are produced in the random decoder 77, whereby the 16 bits of the two bytes contain only one single bit with the logic value "1" which furthermore is in a random position within one of the two bytes. The four random bits which are produced in the frequency divider 105 of the control device 83 (see FIG. 10) appear at the control bus 93 at the input of the memory circuit 191 of the random code generator 77 and, upon recognition of the start condition given by the logic value "1" of the STRT signal, are loaded into same where they are stored in the flipflop 196. Each of the memory circuits 191 has a locking circuit which is realized by means of the invertor 192 and the AND gate 194. The first three bits of the 4-bit random value thus stored are decoded in the "3 to 8" decoder 199. The byte (third or fourth), in which the logic value "1" should be found is selected by means of the fourth bit of the 4-bit random value. This is done through the exclusive-OR gate 198 the output of which releases the "3 to 8" decoder 199 when its output has a logic value "0", i.e. when its two input signals are identical. Since one of these input signals, i.e. the B23 signal, has a logic value "1" only at the end of the third telegram byte, the "3 to 8" decoder 199 is released only at the beginning of the fourth byte and the logic value "1" is transmitted only during the fourth byte, when the fourth bit of the 4-bit random value has a logic value "1". If on the other hand the fourth bit of the 4-bit random value has a logic value "0", the "3 to 8" decoder 199 is released already at the beginning of the third byte so that the logic value "1" is transmitted already during the third byte. In that case the "3 to 8" decoding is locked at the beginning of the fourth byte so that it may not provide any logic value "1". The "3 to 8" decoder 199 generates a logic value "1" at only one of its outputs, this output being determined by the 3-bit input value of the "3 to 8" decoder 199.

The input bus 85 of the input filter 79 shown in FIG. 17 has for instance eight bus conductors, i.e. one bus conductor for each bit of a data byte. A bit filter 79b is provided for each bus conductor of the input bus 85. Each bit filter 79b contains three memory circuits 200, each of which comprises one invertor 201, two AND gates 202 and 203, one NOR gate 204 and one flipflop 205. The memory circuits 200 are identical in structure with the memory circuits 171, 179 and 191. Furthermore each bit filter 79b is also provided with a NAND gate 206, a NOR gate 207, an AND gate 208, a NOR gate 209, an invertor 209a and a flipflop 210.

Each bus conductor of the input bus 85 is carried to a first input of the AND gate 202 of a first memory circuit 200 of its corresponding bit filter 79b. In each bit filter 79b, the output of the first memory circuit 200 is carried to a first input of the AND gate 202 of a second memory circuit 200, of the NAND gate 206 and of the NOR gate 207, while an output of the second memory circuit 200 is carried to a first input of the AND gate 202 of the third memory circuit 200 and to a second input of the NAND gate 206 and of the NOR gate 207. In each bit filter the output of the third memory circuit 200 is connected to a third input of the NAND gate 206 and of the NOR gate 207. In each bit filter 79b, the output of the NAND gate 206 is carried to a first input of the AND gate 208 whose second input is connected to the inverted Q output of the flipflop 210. Each of the outputs of the AND gate 208 and of the NOR gate 207 is carried to an input of the NOR gate 209 whose output is connected to the D input of the flipflop 210. The Q output of the flipflop 210 constitutes the output of the corresponding bit filter 79b. The outputs of all the bit filters 79b are carried to a bus conductor of the bus 79a which constitutes the output bus of the input filter 79. The input filter 79 is supplied via the two bus conductors of the control bus 94 with the 4-MHz clock signal and with the 64-Hz clock signal. The 4-MHz clock signal supplies the clock inputs of all the flipflops 205 and, via invertor 209a, the clock inputs of the flipflops 210. The 64-Hz clock signal supplies in all the bit filters 79b the input of all the memory circuits 200. This input is connected within each memory circuit to a second input of the AND gate 202 and, via invertor 201, to a first input of the AND gate 203.

All the bits of an actual data byte which is to be transmitted from the addressed function module 11 to the control module 10 reach via the input bus 85 the input of a first memory circuit 200 into which they are loaded at the time of the impulse of the 64-Hz clock signal in order to be stored in the flipflop 205 of the corresponding memory cell 200. Each of these memory circuits 200 has a locking means which is realized through the invertor 201 and the AND gate 203. The contents of the first memory circuit 200 is then pushed into the second memory circuit 200 and then finally its contents are pushed into the third memory circuit 200. The input filter 79 serves to eliminate interference impulses which may appear at the input bus 85. This is achieved in that a bit value is considered valid only when an identical bit value is stored in the three memory circuits 200 belonging together. In that case this bit value is loaded via the NAND gate 206 if the bit value is a logic value "1" or via the NOR gate 207 if the bit value is a logic value "0" into flipflop 210 with the trailing edge of the 4-MHz clock signal and is thereby taken to the bus 79a at the output of the input filter 79. The flipflop 210 has a locking means which is realized through the AND gate 208

The CRC generator 80 shown in FIG. 18 comprises a shift register 211 and three adders 212, 213 and 214. Each adder 212, 213, 214 functions as "Modulo 2 adder" and comprises an exclusive-OR gate. The CRC generator 80 generates a CRC byte which has preferably eight bits. In that case the shift register 211 also comprises eight bit cells 0 to 7. The 8-bit parallel output of the shift register 211 constitutes the bus 80a which represents the output bus of the CRC generator. The cable connection 81a coming from the multiplexer 81 (see FIG. 19) is carried to a first input of the adder 212, the second input of which is connected to the output of the bit cell 7 of the shift register 211 and the output of which is connected to a first input each of the adder 213 and 214 as well as to a input of the bit cell 0 of the shift register 211. A parallel output of the bit cell 6 is carried to a second input of the adder 213, the output of which is connected to a parallel input of the bit cell 7. A parallel output of the bit cell 1 is carried to a second input of the adder 214, the output of which is connected to a parallel input of the bit cell 2. The 4-MHz clock signal as well as the signals STRTN and CRE are carried via three conductors of the control bus 96 to the CRC generator 80. The 4-MHz clock signal feeds the clock inputs of all the bit cells of the shift register 211. Each of the signals STRTN and CRE supplies an additional input of the shift register 211.

The multiplexer 81 shown in FIG. 19 comprises an invertor 215, two AND gates 216 and 217 and one OR gate 218. The conductor 35 and the cable connection 100 are each carried to a first input of the AND gate 216 or 217, the outputs of which are each connected to an input of the OR gate 218. The cable connection 101 is carried to a second input of the AND gate 217 and via invertor 215 to a second input of the AND gate 216. The output of the OR gate 218 constitutes the output of the multiplexer 81 and is connected to the conductor 81a.

During the time in which telegram bytes are to be received through the function module 11, a logic value "0" appears on the cable connection 101a so that the AND gate 217 is locked and the AND gate 216 is released. The time-sequential bits of the telegram received in the conductor 35 thus reach the input of the CRC generator 80 via the AND gate 216 and the conductor 81a. If on the other hand bytes are to be sent by the function module 11, a logic value "1" appears on the cable connection 101 and releases the output-release gate 84 (see FIG. 9) on the one hand and on the other hand the AND gate 217 while the AND gate 216 is locked at the same time. The time-sequential bits of the transmitted telegram then go from the serial output of the shift register 69 via the AND gate 217 and the conductor 81a to reach the input of the CRC generator 80 (see FIGS. 9 and 19).

Thus the received and transmitted bits of the telegram are all pushed into the input 1a of the CRC generator 80 and thereby into its feedback shift register 211 in a time-sequential manner (see FIG. 18). The CRC generator generates the CRC byte (cyclic redundant check byte) which is transmitted by the corresponding function module 11 as the fifth byte in every telegram in the addressed function module 11 by dividing the first four bytes of the telegram, i.e. the address byte, the function byte, the first and the second data byte, continuously binarily through a polynomial generator $g(z) = z^8 + z^7 + z^2 + 1$. The CRC generator 80 receives the STRTN and CRE signals from the control device 83 (see FIG. 10) via control bus 96. When the starting conditions have been met the STRTN signal resets the shift register 211 to zero, whereupon the bits of the first four bytes of the telegram are pushed time-sequentially in to the shift register 211 by means of the 4-MHz clock signal, while the four bytes are divided binarily by means of the feedback from 211 via the exclusive-OR gates of the adders 212, 213 and 214 by the polynomial generator g(z). If no monitoring error exists, i.e. if the MF signal has a logic value "0", and when the T2 signal has a logic value "1", a logic value "1" appears at the output of the AND gate 107 (see FIG. 10) as a CRE signal triggering the evaluation of that bit which is appearing at that moment at the input of the CRC generator. At the parallel output of the shift register 211 and thereby on the bus 80a the calculated CRC byte then appears upon completion of the fourth byte of the telegram.

As mentioned earlier, the multiplexer 65a and the CRC generator 65b of the interface circuit 21 of the control module 10 are similar in structure to the multiplexer 81 and the CRC generator 80 of the interface circuit 25 of the function module 11, whereby the ER signal assumes the role of the CRE signal, the CLK clock signal that of the 4-MHz clock signal and the CLR reset signal the role of the STRTN signal (see FIG. 8). Similarly as in the function module 11, the bytes which are this time transmitted and received by the control module 10 are pushed in sequentially one after the other into the shift register of the CRC generator 65b and are continuously divided binarily by means of feedback by the same polynomial generator g(z) which is also used in the function modules 11, with the difference that not four bytes, but all five bytes of the telegram, i.e. also the received CRC byte are binarily divided by the polynomial generator g(z) in the control module 10. In the absence of any transmission error the result of this binary division must be equal to zero at the end of the fifth byte, i.e. all the bits stored in the shift register of the CRC generator 65b must then be zero. Only in that case does a logic value "0" appear upon completion of the telegram at the output of the OR gate 65c (see FIG. 8) as an indication of error-free transmission. When a transmission error exists on the other hand, at least one bit in the shift register of the CRC generator 65b is other than zero, so that in that case a logic value "1" appears at the output of the OR gate 65c which functions as a decoder upon completion of the telegram, said logic value "1" being stored in the status register 62 to indicate an error in transmission and to trigger a repeat transmission.

The 4-MHz clock signal and the signals STRTN and MILD are transmitted via three conductors of the control bus 95 to the monitor-error detector 82 shown in FIG. 20. The monitor-error detector 82 comprises a non-exclusive OR gate 219, an AND gate 220, an OR gate 221, an AND gate 222 and a flipflop 223. The conductor 35 and the cable connection 100 are each connected to an input of the non-exclusive OR gate 219 the output of which is carried to a first input of the AND gate 220. The MILD and STRTN signals feed a second input of the AND gate 220 and a first input of the AND gate 222, respectively. The output of the AND gate 220 is connected to a first input of the OR gate 221, the second input of which is connected to the Q output of the flipflop 223 which constitutes at the same time the output of the monitor-error detector 82 at which the MF signal appears and which is connected to the cable connection 99. The output of the OR gate 221 is connected to a second input of the AND gate 222, the output of which is connected to the D input of the flipflop 223. The 4-MHz clock signal supplies the clock input of the flipflop 223.

When the function module 11 transmits one or several bytes, the bits of that byte, coming from the serial output of the shift register 69, reach sequentially one after the other a first input of the monitor-error detector 82 (see FIG. 9) directly on the one hand and, inverted via the output release gate 84, the conductor 36, the transmission unit 27, one of the two receiving units 28 and the conductor 35 (see FIG. 5) a second input of the monitor-error detector 82 on the other hand. The two input signals of the monitor-error detector 82 must therefore be different from each other. If this is not the case, a logic value "1" appears at the output of the non-exclusive OR gate 219 which is stored as an alarm in the flipflop 223 and appears as an MF signal at the output of the monitor-error detector 82 (see FIG. 20) when the MILD signal, which comes from the AND gate 163 (see FIG. 12) has a logic value "1". The MILD signal has a logic value "1" when the function module 11 is switched to transmission and the T1 signal has a logic value "1". The flipflop 223 has a locking means which is constituted by the OR gate 221. The STRTN signal resets the flipflop 223 at the beginning of each telegram to zero.

Just as each function module 11 monitors the bytes which itself transmits, the control module 10 also monitors those bytes which itself transmits and evaluates them by means of the monitor-error detector 64. The latter functions similarly to the monitor-error detector 82 of the function module 11, whereby the ES signal assumes the role of a MILD signal, the CLK clock signal the role of the 4-MHz clock signal and the CLR reset signal the role of the STRTN signal (see FIG. 8). If at least one monitored bit does not agree with the transmitted bits, a logic value "1" appears at the output of the monitor-error detector 64 and is readably stored in the status register 62 to interrupt the telegram and to initiate a repetition of the transmission. If a monitoring error occur during the transmission the telegram transmission is immediately interrupted in each instance and an ITR interrupt signal is triggered.

An error-free transmission recognized by the control module 10 during the CRC control as well as during the monitoring control is confirmed by the control module 10 after the end of the telegram in that it transmits a confirmation impulse "telegram O.K." on the conductors 29 and 30 of the CLK clock signal (see FIG. 5) after the fortieth clock impulse of the CLK clock signal by means of the EC signal and the AND gate 66a of the transmission unit 66 (see FIG. 8). This confirmation impulse comprises preferably that the start impulse is transmitted once more as a confirmation at the end of the telegram. In case of telegram with error(s) on the other hand, the control module transmits a confirmation impulse "telegram not O.K." on the conductors 29 and 30. Through this confirmation impulse the addressed function module 11 learns whether the telegram received was O.K. and only then definitely carries out the received commands which were stored in the meantime. The confirmation impulse "telegram not O.K." comprises preferably that the so-called "time-out" period is awaited at the end of the telegram before transmission of a new start impulse via conductors 29 and 30.

Simultaneously with the confirmation signal "telegram O.K.", the registers 58 to 61 (see FIG. 8) in the control module 10 whose writing was locked during the transmission of the telegram are again released for a writing process and the ITR Interrupt signal is triggered. Lastly, through a following reading of the status register 62, it is returned to null (i.e. zero).

The clock synchronizer 110 shown in FIG. 21 comprises, as mentioned earlier, a synchronizer 114 and the downstream delay element 115. The synchronizer 114 in turn comprises two flipflops 224 and 225, of an AND gate 226 and a non-exclusive OR gate 227, while the delay element 115 comprises two flipflops 228 and 229. The 4-MHz clock signal feeds the clock inputs of the flipflops 224, 225, 228 and 229 while the CLK clock signal supplies the D-inputs of the flipflops 224. The Q output of the flipflop 224 is connected to the D-input of the flipflop 225 and its inverted Q output is connected to a first input of the AND gate 226 and to a first input of the non-exclusive OR gate 227. The Q output of the flipflop 225 is connected to the second inputs respectively of the AND gate 226 and of the non-exclusive OR gate 227, whereby the output of the latter, at which the EDG signal appears, constitutes a first output of the synchronizer 114 and of the clock synchronizer 110. The output of the AND gate 226 constitutes a second output of the synchronizer 114 and of the clock synchronizer 110 at which the T1 signal appears, and is at the same time connected to the D-input of the flipflop 228 whose Q output is connected to the D-input of the flipflop 229 and which at the same time constitutes an output of the clock synchronizer 110 at which the T2 signal appears. The Q output of the flipflop 229 constitutes the output of the clock synchronizer 110 at which the T3 signal appears.

The CLK clock signal comes from the control module 110 and goes via the bus connection 12; 14 and the conductor 34 to reach the control device 83 (see FIG. 9) and within the latter a clock input of the clock synchronizer 110 and thereby of the synchronizer 114 (see FIG. 11) of the control unit 103. The CLK clock signal is loaded in the two flipflops 224 and 225 by means of the 4-MHz clock signal the period of which is 250 ns. The CLK clock signal is loaded into the flipflop 224 with the leading edge of the 4-MHz clock signal and is thereby synchronized, i.e. a synchronized CLK clock signal appears at the Q output of the flipflop 224. The synchronized and the non-synchronized CLK clock signals are differentiated only near their edges for a period of maximum 250 ns, so that a logic value "1" appears only then at the output of the non-exclusive OR gate 227 as an EDG signal. Thus an impulse appears as an EDG signal at one of the outputs of the clock synchronizer 110 with each edge of the CLK clock signal and lasts a maximum of 250 ns. When on the other hand a logic value "0" is present in the flipflop 224 and a logic value "1" in the flipflop 225, i.e. in the presence of a trailing edge of the CLK clock signal, a logic value "1" appears as a T1 signal at the output of the AND gate 226 and thereby at an additional output of the clock synchronizer 110. Thus an impulse of a maximum duration of 250 ns appears as a T1 signal at one of the outputs of the clock synchronizer 110 with each trailing edge of the CLK clock signal. The T1 signal is delayed in the flipflop 228 by 250 ns so that an impulse appears as a T2 signal at its Q output and thereby at one of the outputs of the clock synchronizer 110 with each trailing edge of the CLK clock signal, said impulse being always delayed by 250 ns to the duration of the corresponding impulse of the T1 signal. The T2 signal is also delayed by 250 ns in the flipflop 229 so that an impulse appears as a T3 signal at its Q output and thereby at one of the outputs of the clock synchronizer 110 with each trailing edge of the CLK clock signal, said impulse being always delayed by 250 ns to the duration of the corresponding impulse of the T2 signal.

The clock signal status memory 116 shown in FIG. 22 comprises an invertor 230, two AND gates 231 and 232, one NOR gate 233 and one flipflop 234. The EDG signal is carried to a first input of the AND gate 231 and via invertor 230 to a first input of the AND gate 232. Each of the outputs of the AND gates 231 and 232 is connected to an input of the NOR gate 233, the output of which is connected to the D input of the flipflop 234. The CLK clock signal supplies a second input of the AND gate 231 and the 4-MHz clock signal supplies the clock input of the flipflop 234, the inverted Q output of which is connected to a second input of the AND gate 232 and constitutes at the same time the output of the clock signal-status memory 116.

The non-synchronized CLK clock signal supplies an input of the clock 111 according to FIG. 11, and thereby of the clock signal-status memory 116. The status of the CLK clock signal in the flipflop 234 is stored synchronously in the latter by the 4-MHz clock signal. This flipflop 234 (see FIG. 22) has a locking circuit which is realized by means of the AND gate 232 and of the NOR gate 233. With each edge of the CLK clock signal this locking circuit is set back by the EDG signal via invertor 230. The CLK clock signal appears synchronously with the 4-MHz clock signal and inverted at the Q output of the flipflop 234 and non-inverted at the output of the clock signal-status memory 116.

The first variant of the output circuit 44 shown in FIG. 23 comprises several, e.g. four tri-state transmitters 235 and of as many tri-state receivers 236. The output bus 86 of the interface circuit 25 is connected to the inputs of the tri-state receivers 236 the outputs of which are connected to the inputs of the tristate transmitters 235 and are at the same time connected to the cable connection 13 which is shown in form of bus in FIG. 23. The outputs of the tri-state transmitters 235 are carried to the input bus 85 of the interface circuit 25. The control inputs of the tri-state receivers 236 are connected two by two for example, and each is connected to one of the two control circuits 87 or 88.

The data put at the disposal of the technical operating installation 9 or the data it makes available are either digital or analog data. In the first instance, the output circuit 44 of the function module 11 has the structure shown in FIG. 23. The digital data coming from the interface circuit 25 and going over the latter's output bus 86 reach the tri-state receivers 236 which are released in the presence of a write cycle by the signals appearing on the control circuits 87 and 88 and which amplify the data signals, so that the latter reach the cable connection 13 and beyond same the technical operating installation 9 in an amplified state. When a read cycle applies, the digital data coming from the technical operating installation 9 go over the cable connection 13, the always released tri-state transmitters 235 and the input bus 85 to reach the interface circuit 25 where they undergo further processing.

The second variant of the output circuit 44 of the function module 11 shown in FIG. 24 comprises a demultiplexer 237 and of two channels 238 and 239 for example, whereby each channel 238 and 239 contains a digital/analog converter 240 and for each of these an amplifier 241 downstream of same which are connected in the indicated sequence in series within each channel 238 and 239. The output bus 86 of the interface circuit 25 is connected to the input of the demultiplexer 237 the first bus output of which is connected via a bus to the input of channel 238 and the second bus output of which is connected via an additional bus to the input of channel 239. Each of the outputs of the amplifiers 241 constitutes an output of the output circuit 44 and is connected to the cable connections 13.

If analog data are to be transmitted, these go in digital form via the output bus 86 of the interface circuit 25 to the demultiplexer 237 which is necessary because as a rule there are several parameters in the technical operating installation 9 the values of which must be set precisely. For this reason a channel 238 or 239 is assigned to each of these analog parameters and the decoded function byte indicates in the addressed function module 11 of its demultiplexer 237 which channel 238 or 239 is to be selected by same. The demultiplexer 237 then transmits the data value appearing in digital form to the corresponding channel in whose digital/analog converter it is then converted into a true analog value to be then amplified in the amplifier 241. This amplified analog data value is then transmitted via cable connection 13 to the technical operating installation 9.

The third variant of the output circuit 44 of the function module 11 shown in FIG. 25 comprises bridges or shunts 242, for example two in number, which are used only optionally, of a multiplexer 243, an optionally used filter 244, an also optionally used amplifier 245, an analog/digital converter 246, a demultiplexer 247 and two writing registers 248 and 249. Two cable connections 13, each of which constituting an analog-value channel, are both connected via the bridges or shunts 242 to an input of the multiplexer 243 whose output is connected in the sequence indicated via filter 244 and amplifier 245 to the analog input of the analog/digital converter 246 whose digital output is again connected via a bus to the input of the demultiplexer 247. A first bus output of the demultiplexer 247 is connected to the parallel input of the shift register 248 and a second bus input of the demultiplexer 247 is connected to the parallel input of the shift register 249. The parallel outputs of the two shift registers are connected in parallel and are connected to the input bus 85 of the interface circuit 25.

If analog data are to be transmitted from the technical operating installation 9 to the control module 10 they are transmitted in their respective channel either directly if they are active in form of electric voltages, or via a shunt if they are in form of electric currents, or via a bridge if they are passive, e.g. in form of resistance value to an input of the multiplexer 243 which transmits them to its output which is common to all channels. If necessary, the output signal of the multiplexer 243 is also filtered in the filter 244 and/or amplified in the amplifier 245. The analog data value thus obtained is then converted in the analog/digital converter 246 into digital form and is then transmitted to the channel to which it belongs, is demultiplexed in the demultiplexer 247 and is transmitted to a write register 248 or 249 assigned to the corresponding channel in which it is buffered. This buffer storage is necessary because the analog/digital conversion in the analog/digital converter 246 is entirely independent of the data transmission and is therefore asynchronous. The bits of the buffered data value are then read out from the shift register 248 or 249 at the right moment in parallel and are transmitted via input bus 85 to the interface circuit 25.

The data signals DA are binary data telegrams and comprise in a minimum illustrative embodiment of at least one address byte I and one data byte III each. They can furthermore contain a function byte II and/or a CRC byte V as well as additional data bytes IV. There are preferably two data bytes III and IV in the DA data signals. In a maximum illustrative embodiment the DA data signals thus comprise preferably in the indicated sequence of an address byte I, a function byte II, two data bytes III and IV as well as of a CRC byte V. In all illustrative embodiments the first three byte types I to IV in a write cycle and only the first two byte types I to II in a read cycle are transmitted from a control module 10 to the function modules 11. The CRC byte V on the other hand is transmitted always, and the third byte type III to IV is transmitted only in the read cycle in opposite direction from a function module 11 to at least one control module 10.

The write cycle of a data telegram as shown in FIG. 26 preferably comprises five bytes I to V, of which the first four bytes I to IV are transmitted from the control module 10 operating as "master" M to the function module 11 which operates as a "slave" S. Only after the reception of these first four bytes I to IV does the function module 11 transmit the fifth byte in form of CRC byte to the control module 10.

The read cycle of a data telegram shown in FIG. 27 preferably comprises also of five bytes I to V of which this time only the first two bytes I and II are transmitted from the control module 10, operating again as a "master" M, to the function module 11 which again operates as a "slave" S. Only following the reception of these first two bytes I and II does the function module 11 transmit the last three bytes of the telegram to the control module 10.

In the write as well as in the read cycle the five bytes have an identical significance, i.e. the first byte I is always an address byte, the second byte II a function byte, the third byte III a first data byte, the fourth byte IV a second data byte and the fifth byte V a CRC byte. The first two bytes I and II are here illustratively transmitted from the control module 10 to the function module 11 and the fifth byte V is transmitted in opposite direction from the function module 11 to the control module 10. The direction of transmission of the two data bytes III and IV is on the other hand dependent on whether a write or a read cycle applies.

The embodiment of the drive of a technical operating installation 9 shown in FIG. 28 contains an output circuit 44 of the function module 11 and a partial circuit of the technical operating installation 9. In practice the technical operating installation 9 contains of course a plurality of partial circuits which are similar to or also different from the partial circuit shown in FIG. 28. In FIG. 28 only one single partial circuit was shown in order to explain the functioning of the output circuit 44 in a simple manner and in detail. It is therefore provided. with minimum equipment in FIG. 28, i.e. with a 1-bit output and a 1-bit input so that only one single tri-state transmitter 235 and one single tri-state receiver 236 are used. The tri-state receiver 236 can be a commercially obtainable CMOS reception driver 250, for example, comprising a transistor 251 which can be a bi-polar NPN transistor and of a relay 252 which is provided with a relay coil 253 and with a relay contact 254. The relay contact 254 can be a closing contact, for example. The output bus 86 of the interface circuit 25 comprises in FIG. 28 of only one single bus connector 86 which is connected to the input of the CMOS reception driver 250 whose control input is for example connected to the control circuit 87 and whose output is connected to the base of transistor 251. If the CMOS reception driver 250 has an open collector output, the transistor 251 is of course not necessary since it is already contained in the CMOS reception driver 250. In that case the output of the CMOS reception driver 250 can be connected directly to the coil 253. The emitter of the transistor 251 is connected to the conductor 41, i.e. it is connected to the system ground GO. The collector of the transistor 251 is connected to the conductor 40, i.e. to the potential BEZ via relay coil 253. In practice an AC voltage V5 and/or V6 is also required to supply drives and other power consumers. The AC voltages V5 and V6 are preferably connected via function module 11. The AC voltage V5 has preferably a value of 24 volt and the AC voltage V6 a value of 220 volt in Europe or 110 volt in the USA. A pole of the AC voltage V5 is connected to the conductor 41 and thereby to the system ground GO. The AC voltage V5 supplies via relay contact 254 a coil 255 of a relay 256 of the technical operating installation 9 for example, whose power current contact 257 can switch a single-phase motor 258 on or off for instance, said motor in turn being used to drive a pump or a mixing valve for example. To achieve this, the AC voltage V6 supplies the single phase motor 258 via the power current contact 257. The relay 256 also has an auxiliary contact 259 whose position is reported via the tri-state transmitter 235 of the function module 11 and via the input bus 85 of the interface circuit 25 to the control module 10. In the drawing of FIG. 28 the output circuit 44 of the function module 11 has only one single tri-state transmitter 235 and the input bus 85 of the interface circuit 25 has only one single bus conductor 85. The tri-state transmitter 235 can comprise commercially obtainable CMOS transmission driver 260 and of a resistor 261. The system ground GO is connected via auxiliary contact 259 of the relay 256 to an input of the CMOS transmission driver 260 and to a first pole of the resistance 261, the second pole of which is connected to the positive pole of the 5-volt supply distribution voltage of the function module 11. The output of the CMOS transmission driver 260 is connected to the single bus conductor 85 of the input bus 85 of the interface circuit 25.

In the circuit shown in FIG. 28 the technical operating installation 9 receives a digital 1-bit data value from the control module 10 via the CMOS reception driver 250, the transistor 251 and the relay 252, whereby the relay contact 254 of the latter switches the coil 255 of the relay 256 on or off by means of the AC voltage V5, depending on whether a logic value "1" or "0" has been emitted from the control module. The high voltage contact 257 of the contactor 256 then switches the single-phase motor 258 on or off by means of the AC voltage V6. The ON or OFF position of the relay 256 is then reported back by means of its auxiliary contact 259 via the CMOS transmission driver 260 of the function module 11 to the control module 10. It should be noted that the switching currents of the coil 255 of the contactor 256 flow over the system ground GO and can cause non-negligible ohmic and/or inductive voltage drops in these which would interfere with the transmission of the telegram if the voltages of their transmission signals DA and CLK were referred to the system ground GO. A mentioned earlier, this is avoided in that this voltage is referred to the potential BEZ of the conductor 40 and not to the potential GO of the conductor 41 (see FIG. 5).

When AC distribution voltages V5 and/or V6 must also be transmitted, at least the bus rail 12 is provided with one or several additional conductors which are electrically connected via the supply module 15 to additional conductors of one or several cable connections.

FIG. 29 shows a symbolic representation of an enlarged bus rail 12 with seven electrical conductors in parallel, together with their voltage and signal connections. The cable-bus connection 14 comprises, as mentioned earlier, the four conductors 30, 32, 40 and 41 on which the signals or potentials CLK, DA, BEZ and GO appear, whereby the conductor 41 which represents the system ground can be connected separately. The three conductors 40, 30 and 32 constitute a flat cable for example and are connected in the drawing of FIG. 29 to the three uppermost conductors of the bus rail 12 while the conductor 41 is connected to the fourth conductor from the top of the bus rail 12. Since one pole of the AC distribution voltage V5 is connected to the conductor 41, the other pole of the AC distribution voltage V5 is preferably connected via a conductor 262 of a cable connection and the supply module 15 (see FIG. 2) is connected via a conductor to the bus rail 12 for the transmission of the AC distribution voltage V5, whereby the conductor 262 is laid spatially in the identical manner as conductor 41 which is connected to the potential GO. The conductor 262 is connected to the fifth conductor from the top of the bus rail 12 in the drawing of FIG. 29, while two conductors 263 and 264 of a cable connection which are supplied by the AC voltage V6 can if necessary be connected via supply module 15 to two additional conductors, i.e. the two lowest conductors of the bus rail 12 for the transmission of the a.c. voltage V6.

A control module 10 is electrically connected at any location to at least one of the available bus rails 12, whereby the connection of at least one of the cable-bus linkages 14 contained in the bus connection 12; 14 as well as of the conductors 262, 263 and 264 to the bus rail 12 is preferably effected by means of the feed module 15 (see FIG. 2). The latter is preferably of similar structure to that which is shown in FIG. 30. The feed module 15 then has a configuration and dimensions similar to those of the function modules 11. It is provided with connector elements on its underside in the drawing of FIG. 30 so that it can be plugged in electrically on the bus rail 12 and establishes an electrical connection between seven connection terminals 265 to 271 which can be located on the top of the feed module 15 for example, and one of the seven parallel conductors of the bus rail 12. The three connection terminals 265, 266 and 267 of the conductors 40, 30 and 32 are installed next to each other and together in the three-dimensional drawing of FIG. 30, at the back at the top of the feed module 15 in form of screw connection. The two connection terminals 268 and 269 of the conductors 41 and 262 are installed next to each other and together in the drawing of FIG. 30, in the middle and at the top of the feed module 15 in form of screw connection. The two connection terminals 270 and 271 of the conductors 263 and 264 are installed next to each other and together in the drawing of FIG. 30, in front at the top of the feed module 15 in form of screw connection.

FIG. 31 shows the three-dimensional structure of two function modules 11 and of the bus rail 12, with one of the two function modules 11 being shown half pulled out of the bus rail 12. The bus rail 12 comprises among other elements of a rail 272 as well as parallel, multi-pole, e.g. seven-pole connector elements 273 which are all mechanically connected to each other. The function module 11 comprises a terminal block 274 and an electronics block 275. The terminal block 274 is pushed on the rail 272 and is provided with connections 276 which are preferably screw connections for the cable connections 13 on the one hand, and on the other hand for example female connector elements 277 for the plugging in of the corresponding electronics block 275. The latter in turn has first male connector elements 278 for the plugging in of the terminal block 274 and for example second female connector elements 279 for the plugging in of the electronics block 275 into the connector elements 273 of the bus rail 12. In the drawing of FIG. 31 the connections 276 are placed at the front and the connector elements 277 at one top of the terminal blocks 274. In the same drawing the connector elements 278 are located at the front and the connector elements 279 at the back at one bottom surface of the electronics blocks 275. The connector elements 273, 277, 278 and 279 are all positioned in space so that each electronics block 275 can be pulled out nearly simultaneously from the corresponding terminal block 274 and from the bus rail 12 without the terminal block 274 having to be disassembled or the cable connection 13 having to be disconnected. A replacement of an electronics blocks 275 is thus possible at any time through simple removal of the old electronics block 275 and by plugging in a new electronics block 275. In order to facilitate the switching over of the function module 11 under operating voltage, the spacial and mechanical design of same must be such that when the function module 11 is plugged in, the conductors of the bus connection 12; 14 are contacted in the following sequences: 262 (V5)1, 41 (GO), 40 (BEZ), 32 (DA) and 30 (CLK).

In a conventional installation shown in FIG. 32 the control modules 10 and function modules 11 which are laid out in an control cabinet 280 for example, are electrically connected to each other and together constitute the instrument block 10; 11 whose output and input terminals bear the reference 281 in FIG. 32. These output and input terminals 281 of the instrument block 10; 11 are electrically connected terminal by terminal, each via a wire connection 282 and each to a corresponding terminal 283 of a first terminal strip 284. To each terminal 283 of the first terminal strip 284 corresponds a terminal 285 of a second terminal strip 286 with which it is electrically linked. In FIG. 32 the electric links between the terminals 283 and 285 are not shown for reasons of simplification of the drawing. The two terminal strips 284 and 286 are installed close to each other and parallel to each other at an outer periphery of the instrument installation, e.g. at the bottom, in the control cabinet 280. All voltage sources and instruments of the technical operating installation 9 which are located outside the control cabinet 280 are electrically connected via cable connection 13 directly to the terminals 285 of the second terminal strip, so that these instruments and sources of voltage are connected only via the terminals 285 and 283 of the two terminal strips 284 and 286 to the instrument block 10; 11. In practice the two terminal strips 284 and 286 together constitute one single terminal strip provided with two rows of terminals 283 or 285.

In the installation according to invention shown in FIG. 33 a control module 10 is connected in the control cabinet 280 via a cable-bus connection 14 to the function modules 11 which can be installed next to each other on a bus rail 12 for example. Each function module 11 has connections 276 which are connected via cable connections 13 directly to the voltage sources and instruments of the technical operating installation 9. Since all the function modules 11 are mechanically nearly identical, the connections 276 constitute a nearly straight-line row of connections taking over the role of the second terminal strip 286 of the installation shown in FIG. 32, with the advantage that only one connection 276 is now used per cable connection 13 instead of three terminals 281, 283 and 285. Furthermore the numerous wire connections 282 and all the electrical connections of the installation shown in FIG. 32, between the control modules 10 and the function modules 1a 11 are replaced by one single bus connection 12; 14 which has a maximum of seven conductors 40, 30, 32, 41, 262, 263 and 264 (see FIG. 29). The installation according to invention as shown in FIG. 33 thus leads to greater savings in terminal, wiring and assembly costs.

FIG. 34 shows an open control cabinet 280 of an installation according to the invention, where the open panel door 287 of the control cabinet, seen from behind, is on the right side in the drawing. A control module 10 is installed on the panel door 287 and is connected via a goose-neck cable wiring harness 288; 289 to the instrumentation inside the control cabinet 280. The cable wiring harness 288; 289 consists preferably of a two-strand cable 288 and a three-strand cable 289.

On the inside of the control cabinet 280 rails 272, e.g. four in number, are installed horizontally and parallel. A plurality of terminals 290, function modules 11, e.g. eleven in number and a supply module 15 are mounted on the uppermost rail 272, fuses 15, e.g. four in number and three function modules are installed on the second rail 272 from the top and protective motor switches 292, e.g. five in number, are mounted on the second rail 272 from the bottom. The lowest rail 272 has relay 293, e.g. five in number, while a transformer 294 is installed in the lower right hand corner of the control cabinet 280. The first five terminals 290 from the left can be connected to the four conductors of a three-phase supply network or to a protective ground, while the equipment of the technical operating installation 9, i.e. the ventilator and/or pump motors for example, are supplied with power current from the control cabinet 280 via the remaining terminals 290. These last mentioned terminals 290 are supplied for that purpose with electric current from the three-phase voltage of the three-phase supply network via the fuses 291, the protective motor switches 292 and the relays 293. The transformer 294 is supplied via two wires 295 with an AC distribution voltage V6 of 220 volts, for example. The transformer 294 transforms this AC distribution voltage V6 into an AC distribution voltage V5 of 24 volts for example which leaves the transformer 294 via two wires 296. Each of the two uppermost rails 272 is provided with a bus rail 12 (not shown) which is supplied via the corresponding supply module 15. Each of the four wires 295 and 296 as well as each of the three strands of the cable 289 is connected in the control cabinet 280 via the two supply modules 15 to one of the conductors 263, 264, 262, 41, 40, 30 or 32 of the two bus rails 12 (not shown) (see FIG. 29). The two wires 296 are furthermore connected directly to the two strands of the cable 288. In FIG. 34 the cable channels are given the reference 297. The connections 276 of the function modules 11 are provided with the cable connections 13 which are all or in part laid in the cable channels 297 and serve to establish the direct connection of the technical operating installation 9 which is not shown here.

In contrast to the supply module 15 shown in FIG. 30, each of the two supply modules 15 shown in FIG. 34 is equipped with the connection terminals 265 to 267 (see FIG. 30) in double, once on top and once at the bottom of the supply module 15, whereby these connection terminals are connected to each other in pairs, two by two. This double design of the connection terminals 265 to 267 has the advantage that the supply of the conductors 40, 30 and 32 of the different bus rails 12 in the control cabinet are easier to realize.

As a rule at least one of the function modules 11 is always present on one of the bus rails 12. This bus rail 12 is installed at the electrical periphery of the installation in such manner, and at least this one or one of these function modules 11 as well as electrical connections 276 of same are installed in such manner and are of such dimensions and configurations that at least this function module 11 is simultaneously an input and/or output terminal of the installation, so that these electrical connections 276 of the function module 11 can be connected directly to the connection terminals of the technical operating installation 9. In order to achieve as universal a solution as possible, the function module 11 is here designed preferably for the treatment of a maximum of two process magnitudes. The function module 11 is preferably connected via connector elements 273 and 279 to its bus rail 12, whereby the function module 11 can be plugged in as desired, mechanically as well as electrically individually in one of the many available positions on any one of the available bus rails 12 without any need for alterations in hardware or software in order to ensure correct operation for this.

In a very universal ZLT building automation system according to the instant invention the wiring, terminal, connections and assembly costs within the control cabinet have been reduced to a minimum and costly shunt wiring is not necessary since the connections of the technical operating installation are not connected to terminals 283; 285 but directly to the connections 276 of the function modules 11. This makes it possible to save much time and money. Because the function modules can be plugged in at any location on a bus rail without consideration for their own function module type and without consideration for the function module type which may have been plugged in earlier at the same location optimal flexibility of the installation is ensured with respect to modification and expansion of the system thanks to the unlimited possibility to replace the function modules 11. By using the BEZ potential instead of the GO potential as a common reference potential for the transmission signals DA and CLK a reduction of the tendency for errors is achieved in the installation because a transmission connection with a lower tendency for errors exists between the control module 10 and the function modules 11. By reducing the number of conductors in the bus rail 12 to four to seven conductors and by using an optimally thin cable-bus connection 14 between the bus rail 12 and the control modules 10, it is possible to install the latter on the door of the control cabinet or control panel instead of on the bus rail 12. In this way the control and display elements of the control module 10 are accessible directly from the outside without need to open the door first. Due to the fact that the start-up and the testing of the installation for the presence of wiring mistakes is very much simplified, mainly thanks to the presence of the bus connection 12; 14, a reduction of the number of sources of errors can be expected. For the same reason the planning in setting up wiring diagrams, wire laying lists etc. is simplified considerably. Other advantages are great installation and maintenance friendliness, small space requirements for a high degree of useability of the installation as well as the reduction of the number of cable wiring harness produced in the field. Since the conversion of the analog values into digital values occurs already in the function modules 11 it takes place in a matter of seconds and at the same time relieves the mainframe computer of time-consuming conversion tasks.

All non-direct auxiliary components of the microcomputer 50 which have been mentioned are preferably produced according to the CMOS technology and can either be realized as client-specific circuits or in form of commercially obtainable components of the CMOS series 14000 and 14500, such as offered by Motorola Semiconductor Products Inc., 500E Mc Dowell Road M370, Phoenix, Ariz. 85008 for example, as described in their data book "The European CMOS Selection", 1979.

Finally, the above-described embodiments of the invention are intended to be illustrative only. Numerous alternative embodiments may be devised by those skilled in the art without departing from the spirit and scope of the present invention.

We claim:

1. A building automation system comprising in combination
   an arrangement located in an housing (280) for supervision, control and regulation of said building automation system and
   a technical operating plant (9) of said building automation system located outside of said housing (280) of said arrangement,
   said arrangement comprising in combination
   a control module (10) serving as master transmitter-receiver,
   a bus rail (12) comprising a plurality of conductors (30, 32, 40, 41) and located remotely from said control module (10) at the electrical periphery of said arrangement, said bus rail (12) including a plurality of bus rail connector elements (273) which define positions along said bus rail (12),
   one or more function modules (11) serving as slave transmitter-receivers installed in a row along said bus rail (12), each of said one or more function modules (11) having an adjustable address independent of their position along said bus rail (12), and
   a bus connection (12;14) connecting electrically said control module (10) and said one or more function modules (11) for transmission of address signals, data signals and supply voltages, said bus connection (12; 14) including said bus rail (12), and wherein
   each of said one or more function modules (11) includes a terminal block (274) and a separate electronics block (275),
   said electronics block (275) being provided with a set of connector elements (279) for connecting said electronics block (275) interchangeably with any one of said bus rail connector elements (273) located at any one of said positions along said bus rail (12), so that the corresponding function module (11) is connected electrically to said plurality of conductors (30, 32, 40, 41) of said bus rail (12) via one of said connector elements (273), and
   said terminal block (274) being provided with connection elements (276) for connecting electrically the corresponding function module (11) directly via separate cable connections (13) to a device of said technical operating plant (9) for transmission of process parameters of said technical operation plant (9),
   wherein said bus connection (12; 14) includes a cable connection (14) located between said control mode (10) and said bus rail (12), and
   wherein said arrangement further comprises at least one feed module (15) which is electrically plugged in on said bus rail (12) via one of said bus rail connector elements (273) to establish an electrical connection between said cable connection (14) and said bus rail (12).

2. The building automation system in accordance with claim 1, wherein said address signals and said data signals are arranged sequentially in telegram signals transmitted between said control module (10) and each of said one or more function modules (11).

3. The building automation system in accordance with claim 2, wherein one of said telegram signals comprises at least one address byte and at least one data byte, whereby during a write cycle said address and at least one data bytes are transmitted from said control module (10) to said one or more function modules (11), and whereby during a read cycle said address byte is transmitted from said control module (10) to said one or more function modules (11) and said at least one data byte is transmitted from one of said one or more function modules (11) to said control module (10).

4. The building automation system in accordance with claim 2, wherein one of said telegram signals comprises at least one address byte, one function byte and at least one data byte, whereby during a write cycle all of said byte are transmitted from said control module (10) to said one or more function modules (11), and whereby during a read cycle said address and function bytes are transmitted from said control module (10) to said one or more function modules (11) and said at least one data byte is transmitted from one of said one or more function modules (11) to said control module (10).

5. The building automation system in accordance with claim 2, wherein one of said telegram signals comprises at least one address byte, at least one data byte and one CRC byte, whereby during a write cycle said address and at least one data bytes are transmitted from said control module (10) to said one or more function modules (11) and said CRC byte is transmitted from one of said one or more function modules (6) to said control module (10), and whereby during a read cycle said address byte is transmitted from said control module (10) to said one or more function modules (11) and said CRC and at least one data bytes are transmitted from one of said one or more function modules (11) to said control module (10).

6. The building automation system in accordance with claim 2 wherein one of said telegram signals comprises at least one address byte, one function byte, at least one data byte and one CRC byte, whereby during a write cycle said address, function and at least one data bytes are transmitted from said control module (10) to said one or more function modules (11) and said CRC byte is transmitted from one of said one or more function modules (11) to said control module (10), and whereby during a read cycle said address and function bytes are transmitted from said control module (10) to said one or more function modules (11) and said CRC and at least one data bytes are transmitted from one of said one or more function modules (11) to said control module (10).

7. The building automation system in accordance with one of claims 3-6 wherein said telegram signals comprise two data bytes.

8. The building automation system in accordance with claim 1, wherein said bus connection (12;14) includes a conductor for the transmission of a clock signal.

9. The building automation system in accordance with claim 8 wherein said arrangement includes a common potential (GO) to which voltages inside of said control module (10) and of said technical operating plant (9) are referred, wherein said bus connection (12;14) includes a pair of conductors (40, 41) for transmitting a DC voltage, a first of the conductors (41) of said pair of conductors (40, 41) being connected to said common potential (GO), and wherein the voltages of said address, data and clock signals transmitted via said bus connection (12;14) are referred to the potential of the second conductor (40) of said pair of conductors (40, 41) rather than to the potential of the first conductor (41).

10. The building automation system in accordance with claim 9, wherein said control module (10) comprises at least one level adaptation circuit (20), including a transmission circuit (23), said transmission circuit (23) being supplied by a DC voltage source (39), the first pole of which is connected to said second conductor (40) of said pair of conductors (40, 41) and the second pole of which is connected to a supply pole of said transmission circuit (23).

11. The building automation system in accordance with claim 9, wherein said bus rail (12) is provided with two conductors for the distribution of an AC voltage (V6), said two conductors being connected via a feed module (15) each to a conductor (263, 264) of a cable connection.

12. The building automation system in accordance with claim 9, wherein said bus rail (12) is provided with an additional conductor for the distribution of a first AC voltage (V5) whereby one pole of the first AC voltage is connected to the first conductor (41) of said pair of conductors (40, 41) and whereby said additional conductor of said bus rail (12) is connected via a feed module (15) to a conductor (262) of a cable connection.

13. The building automation system in accordance with claim 1, wherein said one or more function modules (11) and said control module (10).

14. The building automation system in accordance with claim 13, wherein said control module (10) includes an interface circuit (21) associated with said digital circuit and at least one adaptation circuit (20) downstream of said interface circuit (21), said at least one level adaptation circuit (20) comprising a first transmission circuit (23) for a clock signal, a second transmission circuit (23) for a data signal and a receiving circuit (24) for a signal, and wherein each of said function modules (11) includes an adaptation circuit (26) at the input thereof and comprising a transmitting circuit (27) for a data signal, a first receiving circuit (28) for a clock signal, and a second receiving circuit (28) for a data signal.

15. A building automation system comprising in combination
an arrangement located in an housing (280) for supervision, control and regulation of said building automation system and
a technical operating plant (9) of said building automation system located outside of said housing (280) of said arrangement,
said arrangement comprising in combination
a control module (10) serving as a master transmitter-receiver,
one or more function modules (11) serving each as a slave transmitter-receiver, and
a bus connection (12;14) including a bus rail (12) for connecting electrically said control module (10) and said one or more function modules (11) for the transmission of address signals and data signals and the transmission of supply voltages, and
wherein said bus rail (12) is installed remotely from said control module (10) at the electrical periphery of said arrangement, and
wherein said bus rail (12) is comprising a plurality of conductors (30, 32, 40, 41) and a plurality of bus rail connector elements (273) which define positions along said bus rail (12), and
wherein each of said one or more function modules (11) includes a terminal block (274) and an electronics block (275),
said electronics block (275) being provided with a set of connector elements (279) for connecting said electronics block (275) interchangeably with any one of said bus rail connector elements (273) located at any one of said positions along said bus rail (12), sot hat the corresponding function module (11) is connected electrically to said plurality of conductors (30, 32, 40, 41) of said bus rail (12) via one of said connector elements (273), each of said one or more function modules (11) having an adjustable address independent of their position along said bus rail (12), and
said terminal block (274) being provided with connection elements (276) for connecting electrically the corresponding function module (11) directly via separate cable connections (13) to a device of said technical operating plant (9) for transmission of process parameters of said technical operating plant (9), and
wherein said control module (10) includes a digital circuit controlled by a microcomputer (50) for controlling transmission between said one or more function modules (11) and said control module (10), and
wherein said microcomputer (50) is connected to an address memory (52) and to a bi-directional data driver (53), and wherein said arrangement further comprises a direction control device (54) for determining the direction of transmission of the bi-directional data driver (53), and
wherein said digital circuit contains an address register (58) for storing an address byte, a function register (59) to store a function byte if one is to be transmitted, at least one data register (60 or 61) to store a data byte, a status register (62) to store a status of said arrangement, a shift register (63) serving as a parallel/serial or serial/parallel converter, a transmitting unit (66) and a receiving unit (67), whereby all the registers (58, 59, 60, 61, 62) are connected to the address memory (52) and to the bit-directional data driver (53) and whereby all the registers (58, 59, 60, 61) with the exception of the status register (62) are connected to a parallel input/output of the shift register (63) whose serial output is connected via the transmitting unit (66) to the input of a transmission circuit (23) of a level adaptation circuit (20), while an output of a receiving circuit (24) of said level adaptation circuit (20) is connected via the receiving unit (67) to a serial input of the shift register (63).

16. The building automation system in accordance with claim 15, wherein said digital circuit contains a CRC generator (65b), wherein the output of the receiving unit (67) is connected to an input of a multiplexer (65a) and an output of the transmitting unit (66) is connected to another input of said multiplexer (65a), the output of said multiplexer (65a) being connected to a signal input of said CRC generator (65b), said CRC generator (65b) having parallel outputs connected to the inputs of a decoder (65c), the output of said decoder (65c) being connected to an input of the status register (62).

17. The building automation system in accordance with claim 15 or claim 16 wherein said digital circuit further comprises a monitor-error detector (64) to evaluate the bytes emitted from the control module (10) which go from an output of the transmitting unit (66) over two different paths, each to an input of the monitor-error detector (64), whereby an output of the transmitting unit (66) is connected to one input of the monitor-error detector (64) and the output of the transmitting unit (66) is connected to an input of the level adaptation circuit (20) and the output of a receiving circuit (24) of said level adaptation circuit (20) is connected to another input of the monitor-error detector (64) whose output is carried to an input of the status register (62).

18. The building automation system in accordance with claim 15, wherein an interface circuit (25) is installed in each of the one or more function modules (11) and is provided with an input bus (85) which is connected to a parallel input of a shift register (69) whose parallel output in turn is connected to a bus input of an address comparator (71) which serves to compare a received address with a modular address stored in an address coder (72), to a bus input of a function decoder (73) if a received function byte is evaluated and to a bus input of an output stage (74), whereby the address coder (72) is connected to an additional bus input of the address comparator (71) and a data bus output of the output stage (74) is connected to an output bus (86) of the interface circuit (25), and in that said interface circuit (25) further comprises a control device (83) as well as an output release gate (84), whereby a serial output of the shift register (69) is connected via the release gate (84) to the input of a transmission circuit (27) of an adaptation circuit (26) and the output of a receiving circuit (28) of the adaptation circuit (26) is connected to a serial input of the shift register (69).

19. The building automation system in accordance with claim 18, wherein the interface circuit (25) of each of the one or more function modules (11) contains a random code generator (77) for the control of a multiple occupation of modular addresses and a module information coder (78) for the adjustment of module information and in that the random code generator (77), the module information coder (78) and the input bus (85) are each connected to a bus input of a bus multiplexer (70) whose output is connected to the parallel input of the shift register (69).

20. The building automation system in accordance with claim 19, wherein when a CRC byte transmission occurs the interface circuit (25) of each of the one or more function module (11) contains a multiplexer (81) whose output is connected to a serial input of a CRC generator (80) serving to produce a CRC byte, whereby a serial input and a serial output of the shift register (69) are each connected to an input of the multiplexer (81) and in that an output of the CRC generator (80) is connected via a bus (80a) to an additional bus input of the bus multiplexer (70).

21. The building automation system in accordance with claim 19 or claim 20, wherein the input bus (85) of the interface circuit (25) of the function module (11) is connected via an input filter (79) to the bus multiplexer (70).

22. The building automation system in accordance with claim 18 or claim 19 or claim 20, wherein the interface circuit (25) of the function module (11) contains a monitor-error detector (82), whereby the serial input an the serial output of the shift register (69) are each connected to an input of the monitor-error detector (82).

23. The building automation system in accordance with claim 18 or claim 19 or claim 20, wherein the output stage (74) of the interface circuit (25) of the function module (11) comprises a buffer memory (75) and an output register (76) connected to said buffer memory (75) by means of a bus (75a).

24. The building automation system in accordance with claim 1 or claim 15 wherein said terminal block (274) is provided with connector elements (277) for plugging in the electronics block (275), while the electronics block (275) in turn is provided with an additional set of connector elements (278) for plugging into the terminal block (274), whereby all connector and connection elements (273, 277, 278 and 279) of each of said one or more function modules (11) are installed in such manner that the electronics block (275) can be pulled out of the corresponding terminal block (274) and from the bus rail (12) nearly simultaneously without requiring dissassembly of the terminal block (274) or disconnection of the cable connection (13).

* * * * *